United States Patent
Sasaki

(10) Patent No.: US 8,304,171 B2
(45) Date of Patent: Nov. 6, 2012

(54) PLATE MAKING METHOD OF LITHOGRAPHIC PRINTING PLATE PRECURSOR

(75) Inventor: Tomoya Sasaki, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 593 days.

(21) Appl. No.: 12/563,812

(22) Filed: Sep. 21, 2009

(65) Prior Publication Data

US 2010/0075260 A1    Mar. 25, 2010

(30) Foreign Application Priority Data

Sep. 22, 2008    (JP) ................ P2008-243375

(51) Int. Cl.
*G03F 7/00*    (2006.01)
*G03F 7/26*    (2006.01)
*B41N 1/00*    (2006.01)
*B41F 7/00*    (2006.01)

(52) U.S. Cl. ............... 430/302; 101/453; 101/463.1
(58) Field of Classification Search ............... 430/302; 101/450.1, 453, 463.1
See application file for complete search history.

(56) References Cited

U.S. PATENT DOCUMENTS

| 6,030,750 A | 2/2000 | Vermeersch et al. |
| 6,071,670 A * | 6/2000 | Ushirogouchi et al. ... 430/270.1 |
| 2001/0018159 A1 | 8/2001 | Maemoto |
| 2002/0177074 A1 | 11/2002 | Hoshi et al. |
| 2003/0129522 A1 | 7/2003 | Oohashi et al. |
| 2004/0191679 A1 * | 9/2004 | Shibuya .................. 430/270.1 |
| 2008/0131812 A1 * | 6/2008 | Ezure ...................... 430/270.1 |

FOREIGN PATENT DOCUMENTS

| JP | 2938397 B2 | 8/1999 |
| JP | 11-277927 A | 10/1999 |
| JP | 2000-335129 A | 12/2000 |
| JP | 2001-277740 A | 10/2001 |
| JP | 2001/277742 A | 10/2001 |
| JP | 2002-287334 A | 10/2002 |
| JP | 2003-191657 A | 7/2003 |
| JP | 2005-96219 A | 4/2005 |

* cited by examiner

*Primary Examiner* — Cynthia Kelly
*Assistant Examiner* — Chanceity Robinson
(74) *Attorney, Agent, or Firm* — Birch, Stewart, Kolasch and Birch, LLP

(57) ABSTRACT

A plate making method of a lithographic printing plate precursor includes: exposing imagewise a lithographic printing plate precursor including a support and an image-forming layer and containing (A) a compound generating an acid with light or heat, (B) an aromatic hydrocarbon compound or heterocyclic compound substituted with a functional group containing a nitrogen atom and (C) an aromatic aldehyde protected with an acid-decomposable group; and removing an unexposed area of the image-forming layer of the lithographic printing plate precursor by supplying at least one of dampening water and ink on a cylinder of a printing machine.

7 Claims, No Drawings

PLATE MAKING METHOD OF LITHOGRAPHIC PRINTING PLATE PRECURSOR

CROSS-REFERENCE TO RELATED APPLICATIONS

This application claims the benefit of Japanese Patent Application JP 2008-243375, filed Sep. 22, 2008, the entire content of which is hereby incorporated by reference, the same as if set forth at length.

FIELD OF THE INVENTION

The present invention relates to a plate making method of a lithographic printing plate precursor. More particularly, it relates to a plate making method of a lithographic printing plate precursor including image recording with laser, plate inspection and on-press development.

BACKGROUND OF THE INVENTION

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-forming layer) has heretofore been broadly used. Ordinarily, the lithographic printing plate is obtained by conducting plate making according to a method of exposing the lithographic printing plate precursor through an original, for example, a lith film, and then while leaving the image-forming layer corresponding to the image area, removing the unnecessary image-forming layer corresponding to the non-image area by dissolving with an alkaline developer or a developer containing an organic solvent thereby revealing the hydrophilic surface of support.

In the hitherto known plate making process of lithographic printing plate precursor, after exposure, the step of removing the unnecessary image-forming layer by dissolving, for example, with a developer is required. However, it is one of the subjects to save or simplify such an additional wet treatment described above. Particularly, since disposal of liquid wastes discharged accompanying the wet treatment has become a great concern throughout the field of industry in view of the consideration for global environment in recent years, the demand for the solution of the above-described subject has been increased more and more.

As one of simple plate making methods in response to the above-described requirement, a method referred to as on-press development has been proposed wherein a lithographic printing plate precursor having an image-forming layer capable of being removed in its unnecessary areas during a conventional printing process is used and after exposure, the unnecessary area of the image-forming layer is removed on a printing machine to prepare a lithographic printing plate.

Specific methods of the on-press development include, for example, a method of using a lithographic printing plate precursor having an image-forming layer that can be dissolved or dispersed in dampening water, an ink solvent or an emulsion of dampening water and ink, a method of mechanically removing an image-forming layer by contact with rollers or a blanket cylinder of a printing machine, and a method of lowering cohesion of an image-forming layer or adhesion between an image-forming layer and a support upon penetration of dampening water, ink solvent or the like and then mechanically removing the image-forming layer by contact with rollers or a blanket cylinder of a printing machine.

In the specification, unless otherwise indicated particularly, the term "development processing step" means a step of using an apparatus (ordinarily, an automatic developing machine) other than a printing machine and removing an unexposed area in an image-forming layer of a lithographic printing plate precursor upon contact with liquid (ordinarily, an alkaline developer) thereby revealing a hydrophilic surface of support. The term "on-press development" means a method or a step of removing an unexposed area in an image-forming layer of a lithographic printing plate precursor upon contact with liquid (ordinarily, printing ink and/or dampening water) by using a printing machine thereby revealing a hydrophilic surface of support.

On the other hand, digitalized technique of electronically processing, accumulating and outputting image information using a computer has been popularized in recent years, and various new image-outputting systems responding to the digitalized technique have been put into practical use. Correspondingly, attention has been drawn to a computer-to-plate technique of carrying digitalized image information on highly converging radiation, for example, a laser beam and conducting scanning exposure of a lithographic printing plate precursor with the radiation thereby directly preparing a lithographic printing plate without using a lith film. Thus, it is one of the important technical subjects to obtain a lithographic printing plate precursor adaptable to the technique described above.

In the simplification of plate making operation as described above, a system using an image-forming layer capable of being handled in a bright room or under a yellow lump and a light source is preferable from the standpoint of workability.

As such a laser light source, a semiconductor laser emitting an infrared ray having a wavelength of 760 to 1,200 and a solid laser, for example, YAG laser, are extremely useful because these lasers having a large output and a small size are inexpensively available. An UV laser can also be used.

As the lithographic printing plate precursor of on-press development type capable of conducting image-forming with an infrared laser, for example, a lithographic printing plate precursor having provided on a hydrophilic support, an image-forming layer in which hydrophobic thermoplastic polymer particles are dispersed in a hydrophilic binder is described in Japanese Patent 2938397. It is described in Japanese Patent 2938397 that the lithographic printing plate precursor is exposed to an infrared laser to agglomerate the hydrophobic thermoplastic polymer particles by heat thereby forming an image and mounted on a plate cylinder of a printing machine to be able to carry out on-press development by supplying dampening water and/or ink.

Further, a lithographic printing plate precursor having provided on a hydrophilic support, microcapsules containing a polymerizable compound (polymerizable monomer) encapsulated therein is described in JP-A-2001-277740 (the term "JP-A" as used herein means an "unexamined published Japanese patent application") and JP-A-2001-277742.

Moreover, a lithographic printing plate precursor having provided on a support, a photosensitive layer (an image-forming layer) containing an infrared absorbing agent, a radical polymerization initiator and a polymerizable compound is described in JP-A-2002-287334.

In general, an operation for inspection and discrimination of image formed on a printing plate is carried out in order to examine whether the image is recorded on the printing plate as intended, in advance of mounting the printing plate on a printing machine. In a conventional lithographic printing plate precursor subjected to the development processing step, it is ordinarily easily performed to confirm the image formed (inspect the plate) after the plate making (after the development processing) and before the printing (before mounting the printing plate on a printing machine) by means of coloration of the image-forming layer.

However, with respect to the lithographic printing plate precursor of the on-press development type without conducting the development processing prior to printing, the image is not recognized on the printing plate in the step of mounting it on a printing machine, and thus the discrimination of the printing plate can not be performed. In particular, it is important in the printing operation to determine whether a registry guide (register mark) which acts as a landmark for the registering in multicolor printing is recorded. Therefore, in the lithographic printing plate precursor of the on-press development type, a means for confirming the image, that is, color formation or decoloration in the exposed or heated area, is required.

The image obtained by discoloration of the exposed or heated area is referred to as a print-out image and various methods are proposed as means for obtaining the print-out image. However, means satisfying all of the plate inspection property, on-press development property and printing aptitude has not been found. For instance, a printing plate has been proposed wherein a compound capable of generating an acid, base or radical by means of light or heat and a compound capable of undergoing color change upon interaction with the acid, base or radical generated are used as a print-out agent (for example, see JP-A-11-277927). Also, it has been proposed to utilize color change of thermally decomposable compound as the print-out agent of a direct-thawing type lithographic printing plate precursor having a heat-sensitive layer (for example, see JP-A-2000-335129). Further, it has been proposed to use a thermally decomposable dye having a thermally decomposable temperature of 250° C. or below as the print-out agent (for example, see JP-A-2003-191657).

According to these proposals, the color formation occurs in the exposed area and the image confirmation property increases to some extent. However, it is still insufficient for conducting the operation for plate inspection.

It is also proposed that a specific dye precursor is incorporated into a lithographic printing plate precursor capable of image drawing by heat-mode exposure and directly mounting on a printing machine without conducting development processing to perform printing (see JP-A-2005-96219). However, even in the technique although the coloration in the exposed area is increased to some extent, it is still insufficient for conducting the operation for plate inspection and has a problem in that the plate inspection property (color-forming property) degrades with the lapse of time during preservation of the lithographic printing plate precursor. Moreover, the on-press development property and printing aptitude, for example, ink-receptive property or printing durability are insufficient.

SUMMARY OF THE INVENTION

An object of the present invention is to provide a plate making method of a lithographic printing plate precursor which is excellent in the plate inspection property after imagewise exposure with laser, which prevents degradation of the plate inspection property with the lapse of time and which is excellent in the on-press development property, ink-receptive property and printing durability.

(1) A plate making method of a lithographic printing plate precursor comprising a step of exposing imagewise a lithographic printing plate precursor comprising a support and an image-forming layer and containing (A) a compound generating an acid with light or heat, (B) an aromatic hydrocarbon compound or heterocyclic compound substituted with a functional group containing a nitrogen atom in its molecule and (C) an aromatic aldehyde protected with an acid-decomposable group and a step of removing an unexposed area of the image-forming layer of the lithographic printing plate precursor by supplying at least one of dampening water (fountain solution) and ink on a cylinder of a printing machine.

(2) The plate making method of a lithographic printing plate precursor as described in (1) above, wherein the aromatic aldehyde protected with an acid-decomposable group (C) is a compound represented by formula (I) shown below and the aromatic hydrocarbon compound or heterocyclic compound substituted with a functional group containing a nitrogen atom in its molecule is a compound represented by formula (II) shown below:

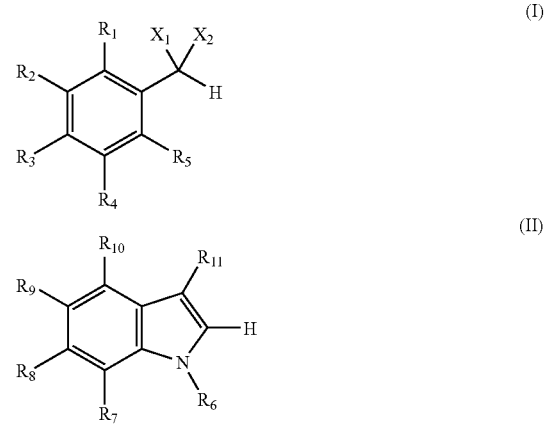

In formulae (I) and (II), $R_1$ to $R_{11}$ each independently represents a hydrogen atom, a halogen atom, an alkyl group, an alkenyl group, an aryl group, a heteroaryl group, a hydroxy group, an alkoxy group, an aryloxy group, —OCORa, —OCONRaRb, —NRaRb, —N(Ra)CORb, —N(Ra)CO-ORb, —COORa, —CONRaRb, —SRa or a cyano group, each of these groups may contain an atom or atomic group selected from O, S, N(Ra), CO and combinations thereof between an appropriate carbon chain thereof, or at least two of $R_1$ to $R_5$ may be combined with each other to form a condensed ring, at least two of $R_6$ to $R_{11}$ may be combined with each other to form a condensed ring, $X_1$ and $X_2$ each independently represents —ORx, —NRxRy or —SRx, plural Rx and Ry may be combined with each other to form a cyclic structure, Ra and Rb each independently represents a hydrogen atom, an alkyl group, an aryl group or a heteroaryl group, and Rx and Ry each independently represents an alkyl group, an aryl group or a heteroaryl group.

(3) The plate making method of a lithographic printing plate precursor as described in (1) or (2) above, wherein the compound generating an acid with light or heat (A) is an onium compound, an oxime ester compound, a triazine compound or an imido ester compound.

(4) The plate making method of a lithographic printing plate precursor as described in any one of (1) to (3) above, wherein the image-forming layer contains an infrared absorbing agent.

(5) The plate making method of a lithographic printing plate precursor as described in any one of (1) to (4) above, wherein the image-forming layer contains a polymerizable monomer and a binder polymer.

(6) The plate making method of a lithographic printing plate precursor as described in any one of (1) to (5) above, wherein the image-forming layer contains a microgel containing one of the aromatic hydrocarbon compound or heterocyclic compound substituted with a functional group containing a nitrogen atom in its molecule (B) and the aromatic aldehyde protected with an acid-decomposable group (C).

(7) The plate making method of a lithographic printing plate precursor as described in any one of (1) to (6) above, wherein the image-forming layer contains a base component.

According to the invention, by the action of an acid generated from the compound generating an acid with light or heat (A) upon exposure, the aromatic aldehyde protected with an acid-decomposable group (C) is decomposed to form an aromatic aldehyde, and the aromatic aldehyde causes a condensation reaction with the aromatic hydrocarbon compound or heterocyclic compound substituted with a functional group containing a nitrogen atom in its molecule (B) in the presence of the acid to from a dye skeleton, whereby the exposed area forms color to enable the plate inspection. The mechanism of the color formation is shown below. Since the reaction wherein plural molecules are condensed is utilized as described above, preservation stability of the color formation is improved in comparison with a system where a single molecule, for example, a dye precursor is decomposed to form color.

[Mechanism of Color Formation]

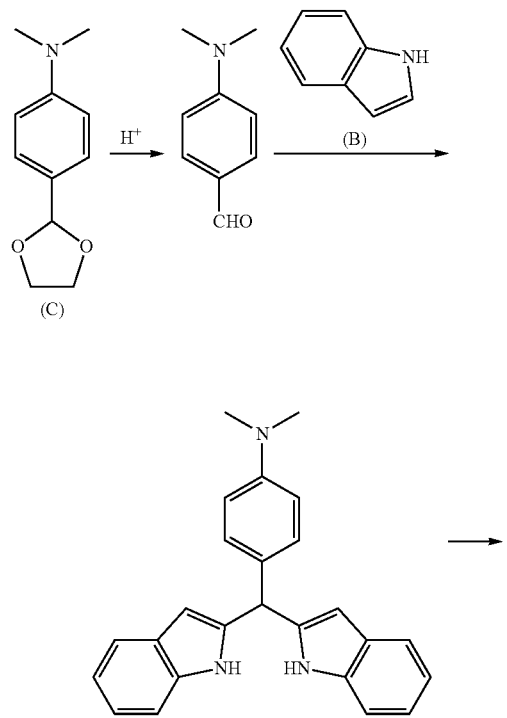

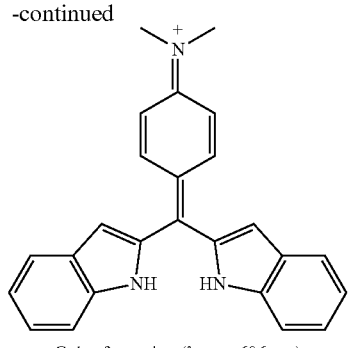

Color formation (λmax: 606 nm)

It has been found that the on-press development property, ink-receptive property and printing durability are surprisingly improved when the color-forming reaction between the component (B) and the component (C) in the presence of an acid described above is applied not to a lithographic printing plate precursor of conventional alkali development system but to a lithographic printing plate precursor of on-press development system to complete the invention. The on-press development property is accelerated by the low molecular weight polar compound. The reason for the improvement in ink-receptive property by the application of the color-forming reaction to the lithographic printing plate precursor of on-press development type is believed to be as follows. Specifically, since in the on-press development system, the unexposed area is necessary to be removed by accelerating penetration of dampening water, a lithographic printing plate precursor having hydrophilicity higher than a lithographic printing plate precursor for a conventional alkali development type is used and thus, the ink-receptive property and printing durability are deteriorated. On the contrary, according to the invention, due to the condensation of the component (B) and the component (C) in the exposed area, the molecular weight and hydrophobicity of material in the layer increase, thereby increasing in the ink-receptive property and printing durability.

In Japanese Patent 3839541, a color image-forming material which contains (A) a compound generating an acid with light or heat, (B) an aromatic hydrocarbon compound or heterocyclic compound substituted with a functional group containing a hetero atom in its molecule and (C) a compound selected from a carbonyl compound and its equivalent and in which the component (B) and Component (C) cause a reaction of forming a dye skeleton by an acid generated with light or heat is described. However, the invention of Japanese Patent 3839541 is intended to a lithographic printing plate precursor requiring development processing with water or alkali and neither disclose nor suggest the means for solving the problem in the lithographic printing plate precursor of on-press development type as used in the invention. In fact, in the patent, a preferable embodiment of the component (B) is a polymer containing a residue of an aromatic hydrocarbon compound or heterocyclic compound substituted with a functional group containing a hetero atom in its molecule and this is completely different from the inventive concept of the present invention in which the low molecular weight polar compound is used in order to accelerate the on-press development.

According to the present invention, a plate making method of a lithographic printing plate precursor which is excellent in the plate inspection property after imagewise exposure with laser, which prevents degradation of the plate inspection property with the lapse of time and which is excellent in the on-press development property, ink-receptive property and printing durability can be provided.

DETAILED DESCRIPTION OF THE INVENTION

The plate making method of a lithographic printing plate precursor according to the invention comprises a step of exposing imagewise a lithographic printing plate precursor comprising a support and an image-forming layer and containing (A) a compound generating an acid with light or heat, (B) an aromatic hydrocarbon compound or heterocyclic compound substituted with a functional group containing a nitrogen atom in its molecule and (C) an aromatic aldehyde protected with an acid-decomposable group and a step of removing an unexposed area of the image-forming layer of the lithographic printing plate precursor by supplying at least one of dampening water and ink on a cylinder of a printing machine.

The components (A) to (C), the lithographic printing plate precursor using the components and the plate making method of the lithographic printing plate precursor will be described in order below.

[Compound Generating Acid with Light or Heat]

The compound (hereinafter, also referred to as an acid generator) generating an acid with light or heat is a compound which decomposes upon irradiation with light or heating at 100° C. or higher to generate an acid. The acid which is generated is preferably a strong acid having pKa of 2 or less, for example, sulfonic acid or hydrochloric acid in view of the effect obtained. The acid generator which is preferably used in the invention includes an onium salt, for example, an iodonium salt, a sulfonium salt, a phosphonium salt or a diazonium salt. Specific examples thereof include compounds described, for example, in U.S. Pat. No. 4,708,925 and JP-A-7-20629. In particular, an iodonium salt having a sulfonate ion as a counter ion, a sulfonium salt and a diazonium salt are preferable. As the diazonium salt, diazonium compounds described in U.S. Pat. No. 3,867,147, diazonium compounds described in U.S. Pat. No. 2,632,703, and diazonium resins described in JP-A-1-102456 and JP-A-1-102457 are also preferable. Further, benzylsulfonates described in U.S. Pat. Nos. 5,135,838 and 5,200,544 are also preferable. Moreover, active sulfonic acid ester, imidoester and disulfone compounds described in JP-A-2-100054, JP-A-2-100055 and JP-A-9-197671 are also preferable. Furthermore, oxime ester compounds described in *J.C.S. Perkin II*, 1653-1660 (1979), *J.C.S. Perkin II*, 156-162 (1979), *Journal of Photopolymer Science and Technology*, 202-232 (1995), JP-A-2000-66385 and JP-A-2000-80068 are also preferable. In addition, haloalkyl-substituted s-triazine compounds described in JP-A-7-271029 are also preferable.

Of the compounds described above, the onium compounds, oxime ester compounds, haloalkyl-substituted s-triazine compounds and imidoester compounds are more preferable as the acid generator for use in the invention. Since these compounds are not only acid generators but also good radical polymerization initiators, they accelerate the reaction of forming a dye skeleton between the component (B) and component (C) and at the same time accelerate a photopolymerization reaction in the photopolymerizable composition.

Though the acid generator may be incorporated into any of the image-forming layer, protective layer and other layers on a support of the lithographic printing plate precursor, it is preferably incorporated into the image-forming layer. The content of the acid generator in the image-forming layer is ordinarily from 0.1 to 50% by weight, preferably from 0.5 to 25% by weight, more preferably from 1 to 15% by weight, based on the solid content of the image-forming layer. In the range described above, good plate inspection property is obtained.

[(C) Aromatic Aldehyde Protected with Acid-Decomposable Group]

The term "acid-decomposable group" as used herein means a group capable of being decomposed in the presence of an acid and any group which satisfies this condition may be used. Specifically, for example, acetal, imine and amidine structures are exemplified. The term "aromatic aldehyde protected with an acid-decomposable group" indicates an aromatic aldehyde in which the aldehyde group (—CHO) is protected with an acid-decomposable group.

The aromatic aldehyde protected with an acid-decomposable group for use in the invention preferably includes compounds represented by the following formula (I):

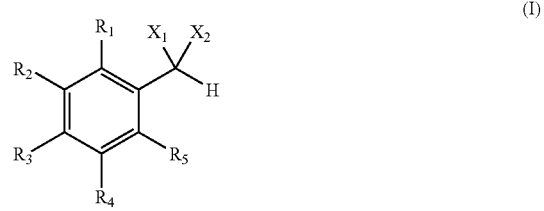

In formula (I), $R_1$ to $R_5$ each independently represents a hydrogen atom, a halogen atom, an alkyl group (including a straight-chain, branched or cyclic alkyl group), an alkenyl group, an aryl group, a heteroaryl group, a hydroxy group, an alkoxy group, an aryloxy group, —OCORa, —OCONRaRb, —NRaRb, —N(Ra)CORb, —N(Ra)COORb, —COORa, —CONRaRb, —SRa or a cyano group. Each of these groups may contain an atom or atomic group selected from O, S, N(Ra), CO and combinations thereof between an appropriate carbon chain thereof. At least two of $R_1$ to $R_5$ may be combined with each other to form a condensed ring. It is preferable that at leas one of $R_1$ to $R_5$ is an alkyl group, an aryl group, a heteroaryl group, a hydroxy group, an alkoxy group or —NRaRb, and it is more preferable that at leas one of $R_1$ to $R_5$ is an alkoxy group or —NRaRb. Ra and Rb each independently represents a hydrogen atom, an alkyl group, an aryl group or a heteroaryl group. $X_1$ and $X_2$ each independently represents —ORx, —NRxRy or —SRx, plural Rx and Ry may be combined with each other to form a cyclic structure. Rx and Ry each independently represents an alkyl group, an aryl group or a heteroaryl group.

The group represented by any one of $R_1$ to $R_5$, Ra, Rb, Rx and Ry may further have a substituent. Examples of the substituent include an alkyl group, an alkenyl group, an aryl group, a heteroaryl group, a hydroxy group, an alkoxy group and an aryloxy group. Among them, a hydroxy group is preferable.

In formula (I), it is more preferable that at leas one of $R_1$ to $R_5$ is an alkyl group, an alkoxy group or —NRaRb. Rx and Ry each more preferably represents an alkyl group. The alkyl group, alkoxy group, Ra and Rb each preferably has from 1 to 10 carbon atoms, more preferably from 1 to 5 carbon atoms, and most preferably from 1 to 3 carbon atoms. It is also preferred that any two of $R_1$ to $R_5$ are combined with each other to form a benzene ring.

$X_1$ and $X_2$ each more preferably represents —ORx or —SRx.

Specific examples of the compound represented by formula (I) are set forth below, but the invention should not be construed as being limited thereto.
(I-1)
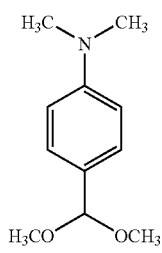
(I-2)
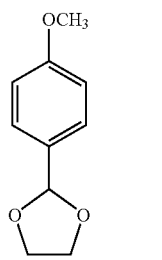
(I-3)
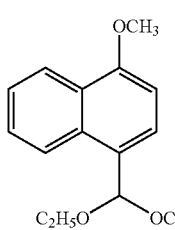
(I-4)
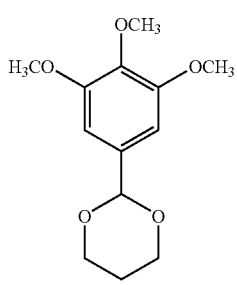
(I-5)
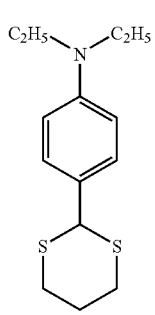
(I-6)
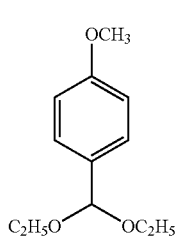
(I-7)
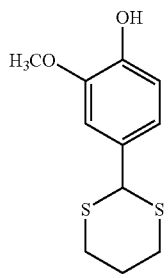
(I-8)
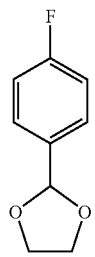
(I-9)
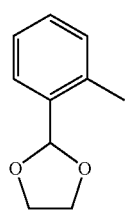
(I-10)
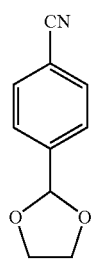
(I-11)
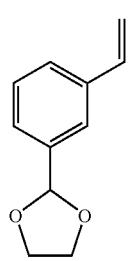
(I-12)
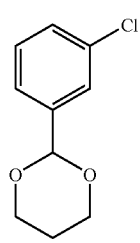

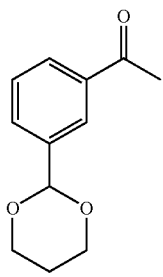
(I-13)

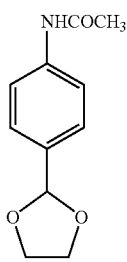
(I-14)

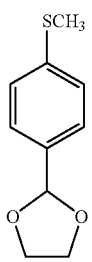
(I-15)

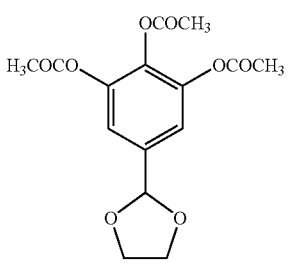
(I-16)

Though the component (C) may be incorporated into any of the image-forming layer, protective layer and other layers on a support of the lithographic printing plate precursor, it is preferably incorporated into the image-forming layer.

The content of the component (C) in the image-forming layer is preferably from 0.5 to 50% by weight, more preferably from 1 to 35% by weight, based on the solid content of the image-forming layer. In the range described above, good plate inspection property is obtained.

[(B) Aromatic Hydrocarbon Compound or Heterocyclic Compound Substituted with Functional Group Containing Nitrogen Atom in its Molecule]

The component (B) is an aromatic hydrocarbon compound or heterocyclic compound substituted with a functional group containing a nitrogen atom. As the heterocyclic compound, a heterocyclic compound containing at least one of a nitrogen atom, an oxygen atom and a sulfur atom is preferably used.

As the aromatic hydrocarbon compound substituted with a functional group containing a nitrogen atom, an aromatic hydrocarbon compound substituted with an amino group is preferable. Specifically, aniline, naphthylamine, anthracenylamine, an aromatic hydrocarbon compound substituted with an alkylamino group, for example, monomethylaniline, dimethylaniline, diethylaniline, N-methyl-N-hydroxyethylaniline, N,N-dihydroxyethylaniline or N-phenylmorpholine, an aromatic hydrocarbon compound substituted with an arylamino group, for example, diphenylamine or triphenylamine, and an aromatic hydrocarbon compound substituted with an alkylarylamino group, for example, N-methyldiphenylamine are exemplified. Further, an aromatic hydrocarbon compound having two or more amino groups, for example, N,N,N',N'-tetramethylphenylenediamine, and an aromatic hydrocarbon compound also having other substituent, for example, N,N-dimethylaminophenol, N,N-dimethylaminothioanisol or N,N-dimethylaminohalogenobenzene are also preferable.

As the heterocyclic compound containing at least one of a nitrogen atom, an oxygen atom and a sulfur atom, a heterocyclic compound having at least one double bond conjugated with the hetero atom is preferable. Specifically, a monocyclic heterocyclic compound, for example, pyrrole, furan, thiophene, oxazole, isooxazole, thiazole, isothiazole, imidazole, pyrazole, furazane, oxadiazole, pyridine, pyridazine, pyrimidine, pyrazine or triazine, and a condensed heterocyclic compound, for example, indole, isoindole, benzofuran, benzothiophene, indolizine, quinoline, isoquinoline, purine, indazole, benzimidazole, benzothiazole, benzoxazole, quinazoline, cinnnoline, quinoxaline, phthalazine, puterizine, carbazole, acridine, phenanthrydine, xanthene, phenazine or phenothiazine are exemplified. The heterocyclic compound may have a substituent. Preferable examples of the substituent include a hydrocarbon group having 20 or less carbon atoms, an alkoxy group having 20 or less carbon atoms, an aryloxy group having 20 or less carbon atoms and a halogen atom. Of the heterocyclic compounds, those containing a nitrogen atom are particularly preferable because of high color-forming density.

The heterocyclic compound preferably used in the invention includes a heterocyclic compound having a 5-membered ring containing two conjugated double bonds, a heterocyclic compound having a 6-membered ring containing three conjugated double bonds and a heterocyclic compound having a condensed ring of these hetero rings. Further, a heterocyclic compound having a heterocyclic ring condensed with an aromatic hydrocarbon ring, for example, a benzene ring or a naphthalene ring is also preferable. Since the heterocyclic ring has the aromaticity, it is referred to as an aromatic heterocyclic ring.

Specific examples of the component (B) for use in the invention include Compounds (B-1) to (B-3) set forth below and compounds represented by formula (II) shown below. Among them, the compounds represented by formula (II) are preferable.

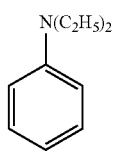
(B-1)

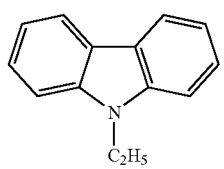
(B-2)

-continued

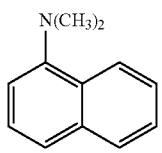
(B-3)

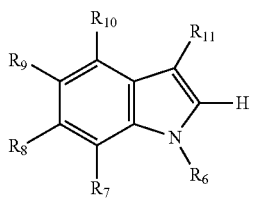
(II)

In formula (II), $R_6$ to $R_{11}$ each independently represents a hydrogen atom, a halogen atom, an alkyl group (including a straight-chain, branched or cyclic alkyl group), an alkenyl group, an aryl group, a heteroaryl group, a hydroxy group, an alkoxy group, an aryloxy group, —OCORa, —OCONRaRb, —NRaRb, —N(Ra)CORb, —N(Ra)COORb, —COORa, —CONRaRb, —SRa or a cyano group. Each of these groups may contain an atom or atomic group selected from O, S, N(Ra), CO and combinations thereof between an appropriate carbon chain thereof. At least two of $R_6$ to $R_{11}$ may be combined with each other to form a condensed ring. Ra and Rb each independently represents a hydrogen atom, an alkyl group, an aryl group or a heteroaryl group.

The group represented by any one of $R_6$ to $R_{11}$, Ra and Rb may further have a substituent. Examples of the substituent include an alkyl group, an alkenyl group, an aryl group, a heteroaryl group, a hydroxy group, an alkoxy group and an aryloxy group. Among them, a hydroxy group is preferable.

In formula (II), $R_6$ to $R_{11}$ each represents more preferably a hydrogen atom, an alkyl group or an alkoxy group. It is also preferred that any two of $R_6$ to $R_{11}$ are combined with each other to form a benzene ring. The alkyl group or alkoxy group each preferably has from 1 to 10 carbon atoms, more preferably from 1 to 5 carbon atoms, and most preferably from 1 to 3 carbon atoms.

Specific examples of the compound represented by formula (II) are set forth below, but the invention should not be construed as being limited thereto.

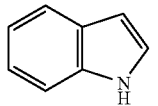
(II-1)

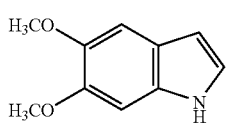
(II-2)

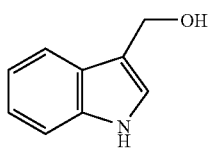
(II-3)

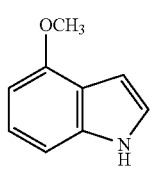
(II-4)

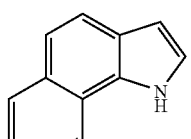
(II-5)

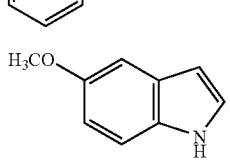
(II-6)

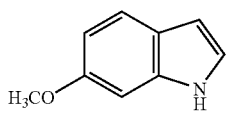
(II-7)

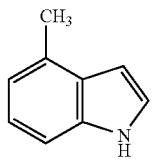
(II-8)

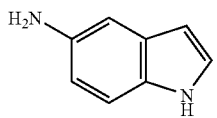
(II-9)

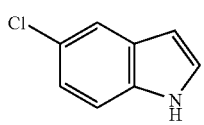
(II-10)

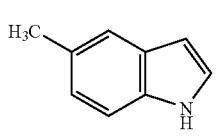
(II-11)

(II-12)

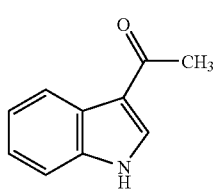
(II-13)

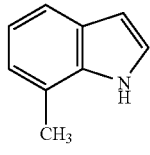
(II-14)

(II-15) 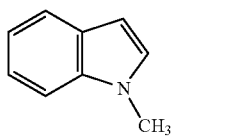

(II-16) 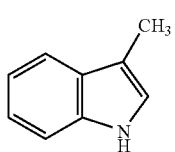

(II-17) 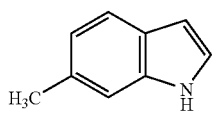

(II-18) 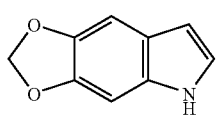

(II-19) 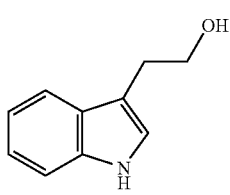

(II-20) 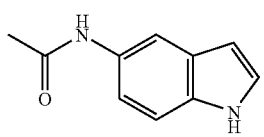

(II-21) 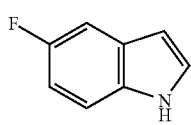

(II-22) 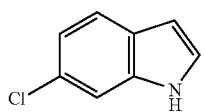

(II-23) 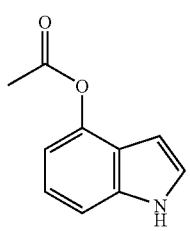

(II-24) 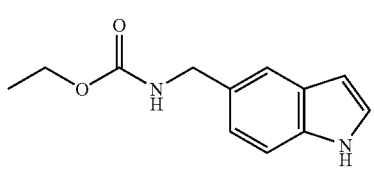

(II-25) 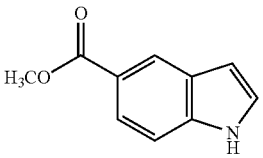

Though the component (B) may be incorporated into any layer on a support of the lithographic printing plate precursor, it is preferably incorporated into the image-forming layer.

The content of the component (B) in the image-forming layer is preferably from 1 to 65% by weight, more preferably from 2 to 45% by weight, based on the solid content of the image-forming layer. In the range described above, good plate inspection property is obtained.

Though the component (B) and the component (C) may be used by directly adding to a coating solution for image-forming layer or a photosensitive solution to dissolve, it is a preferable embodiment according to the invention that one of the component (B) and the component (C) is incorporated into a microcapsule or microgel described hereinafter to introduce into the image-forming layer. By the incorporation of one of the component (B) and the component (C) into a microcapsule or microgel, the condensation reaction (color-forming reaction) of these two components is restrained in the unexposed area and on the other hand, in the exposed area, due to the action of the acid generated and/or heat the microcapsule or microgel is ruptured and the content incorporated therein runs out to cause the condensation reaction (color-forming reaction) of these two components, whereby the plate inspection property (color-forming property) and preservation stability can be further improved.

Further, according to the invention, a base component is incorporated into the image-forming layer together with the component (B) and the component (C). By the incorporation of the base component, the preservation stability can be further improved.

As the base component, known base component may be used. Specific examples thereof include an inorganic base, for example, sodium hydroxide or potassium hydroxide, a quaternary ammonium hydroxide, for example, tetramethylammonium hydroxide, and an organic amine, for example, trimethylamine, triethylamine, diethylamine, tri-n-butylamine, tri-n-octylamine, tri-n-decylamine, 1,5-diazabicyclo(4.3.0)-5-nonene (DBN) or 1,8-diazabicyclo(5.4.0)-7-undecene (DBU). The amount of the base added is ordinarily from 0.05 to 50% by mole, preferably from 0.1 to 40% by mole, more preferably from 0.5 to 30% by mole, based on the amount of the component (A) (acid generator) present in the image-forming layer.

[Lithographic Printing Plate Precursor]

The lithographic printing plate precursor according to the invention preferably has an image-forming layer capable of being subjected to on-press development on a support. Further, a protective layer is preferably provided on the image-forming layer. If desired, other layer, for example, an undercoat layer may further be provided.

(Image-Forming Layer)

The image-forming layer for use in the invention is an image-forming layer capable of forming an image by supplying at least one of printing ink and dampening water on a printing machine after image exposure to remove the unexposed area. The representative image-forming mechanism enabling the on-press development included in the image-forming layer includes (1) an embodiment wherein a sensitizing dye, a radical polymerization initiator (preferably the acid generator which also functions as a radical polymerization initiator described above) and a polymerizable monomer are included and an image area is cured utilizing a polymerization reaction and (2) an embodiment wherein a sensitizing dye (infrared absorbing agent) and a hydrophobilizing precursor are included and a hydrophobic region (image area) is formed utilizing heat fusion or heat reaction of the hydrophobilizing precursor. A mixture of these two embodiments may also used. For instance, the hydrophobilizing precursor may be incorporated into the image-forming layer of polymerization type (1) or the polymerizable monomer or the like may be incorporated into the image-forming layer of hydrophobilizing precursor type (2).

The components for use in the image-forming layer according to the invention will be described in order below.

<Sensitizing Dye>

As the sensitizing dye for use in the invention, (S1) an infrared absorbing agent is preferably used in case where the image formation is conducted using a laser light source emitting an infrared ray of 760 to 1,200 nm or (S2) a sensitizing dye having an absorption peak in a wavelength range of 300 to 850 nm is preferably used in case where the image formation is conducted using a visible or ultraviolet laser light source.

(S1) Infrared Absorbing Agent

In the case wherein the lithographic printing plate precursor according to the invention is subjected to the image formation using as a light source, a laser emitting an infrared ray of 760 to 1,200 nm, it is preferred to incorporate an infrared absorbing agent into the image-forming layer.

The infrared absorbing agent has a function of converting the infrared ray absorbed to heat and a function of being excited by the infrared ray to perform electron transfer/energy transfer to the acid generator described above. The infrared absorbing agent for use in the invention includes a dye and pigment each having an absorption maximum in a wavelength range of 760 to 1,200 nm.

As the dye, commercially available dyes and known dyes described in literatures, for example, *Senryo Binran* (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 (the term "JP-B" as used herein means an "examined Japanese patent publication") and JP-B-5-19702 are also preferably used. Other preferable examples of the dye include near infrared absorbing dyes represented by formulae (I) and (II) in U.S. Pat. No. 4,756,993.

Other preferable examples of the infrared absorbing dye according to the invention include specific indolenine cyanine dyes described in JP-A-2002-278057 as illustrated below.

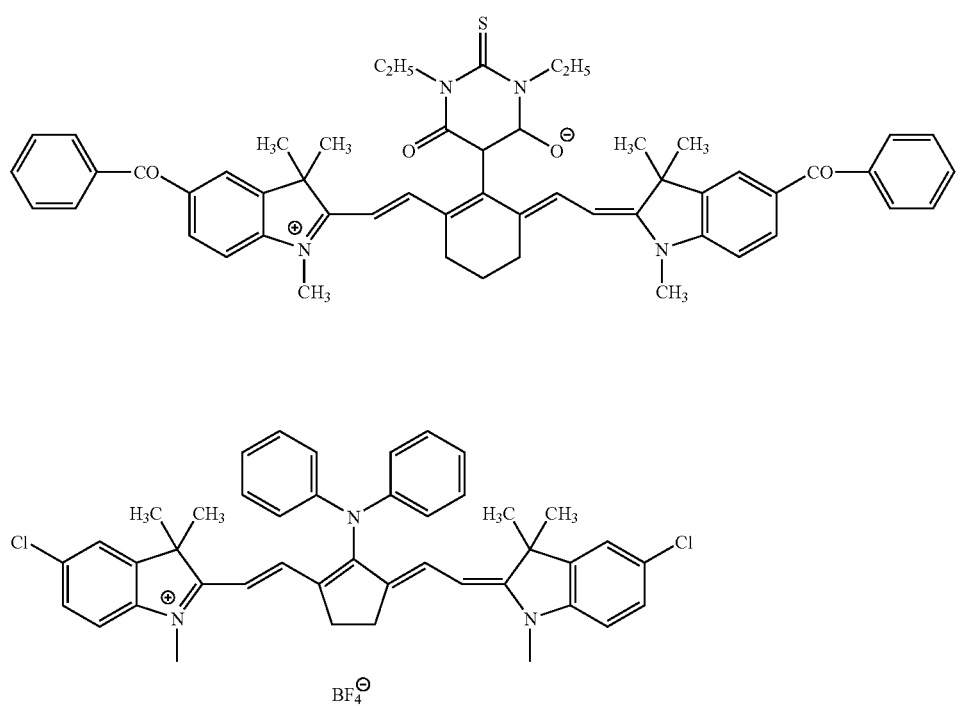

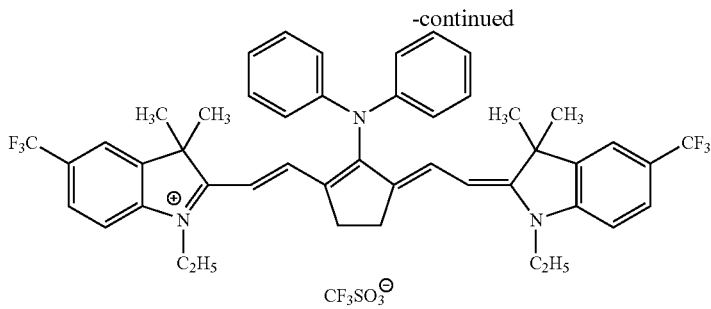

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As a particularly preferable example of the dye, a cyanine dye represented by formula (a) shown below is exemplified.

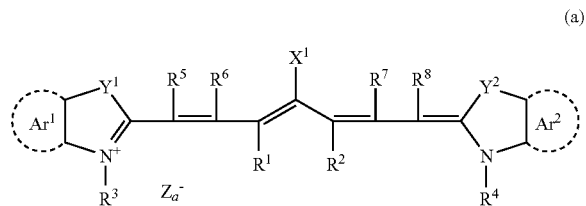

(a)

In formula (a), $X^1$ represents a hydrogen atom, a halogen atom, —$NPh_2$, $X^2$-$L^1$ or a group shown below. $X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom used herein indicates a nitrogen atom, a sulfur atom, an oxygen atom, a halogen atom or a selenium atom. $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

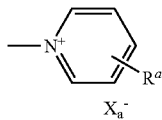

$R^1$ and $R^2$ each independently represents a hydrocarbon group having from 1 to 12 carbon atoms. In view of the preservation stability of a coating solution for image-forming layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring group and a naphthalene ring group. Also, preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. Preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for image-forming layer.

Specific examples of the cyanine dye represented by formula (a), which can be preferably used in the invention, include those described in Paragraph Nos. [0017] to [0019] of JP-A-2001-133969, Paragraph Nos. [0012] to [0038] of JP-A-2002-23360 and Paragraph Nos. [0012] to [0023] of JP-A-2002-40638.

Examples of the pigment for use in the invention include commercially available pigments and pigments described in Colour Index (C.I.), Saishin Ganryo Binran (Handbook of the Newest Pigments) compiled by Pigment Technology Society of Japan (1977), Saishin Ganryo Oyou Gijutsu (Newest Application on Technologies for Pigments), CMC Publishing Co., Ltd. (1986) and Insatsu Ink Gijutsu (Printing Ink Technology), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in *Kinzoku Sekken no Seishitsu to Oyo* (Properties and Applications of Metal Soap), Saiwai Shobo, *Insatsu Ink Gijutsu* (Printing Ink Technology), CMC Publishing Co., Ltd. (1984), and *Saishin Ganryo Oyo Gijutsu* (Newest Application on Technologies for Pigments), CMC Publishing Co., Ltd. (1986).

The pigment has a particle size of preferably from 0.01 to 10 μm, more preferably from 0.05 to 1 μm, particularly preferably from 0.1 to 1 μm. When the particle size of pigment is 0.01 μm or more, stability of the pigment dispersion in the coating solution for image-forming layer increases and when the particle size of pigment is 10 μm or less, uniformity of the image-forming layer is improved.

For dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in *Saishin Ganryo Oyo Gijutsu* (Newest Application on Technologies for Pigments), CMC Publishing Co., Ltd. (1986).

The infrared absorbing agent may be added to the image-forming layer or other layer separately provided, for example, an overcoat layer or an undercoat layer. In particular, the amount thereof is preferably so controlled that optical density of the image-forming layer at the absorption maximum in a wavelength region of 760 to 1,200 nm is in a range of 0.1 to 3.0 in view of sensitivity. Since the optical density is determined by the amount of infrared absorbing gent added and the thickness of image-forming layer, the prescribed optical density can be obtained by controlling the both conditions.

The measurement of the optical density of the image-forming layer can be carried out in a conventional manner. The method for measurement includes, for example, a method of forming an image-forming layer having a thickness determined appropriately in the range necessary for the lithographic printing plate precursor on a transparent or white support, and measuring optical density of the image-forming layer by a transmission optical densitometer or a method of forming an image-forming layer having a thickness determined appropriately in the range necessary for the lithographic printing plate precursor on a reflective support, for example, an aluminum plate, and measuring reflection density of the image-forming layer.

(S2) Sensitizing Dye Having Absorption Peak in Wavelength Range of 300 to 850 nm A sensitizing dye having an absorption peak in a wavelength range of 300 to 850 nm is preferable and a sensitizing dye having an absorption peak in a wavelength range of 300 to 600 nm is more preferable. As such a sensitizing dye, a spectral sensitizing dye and a dye or pigment which absorbs light of a light source to cause an interaction with the photopolymerization initiator shown below are exemplified.

The spectral sensitizing dye or dye preferably used includes, for example, a multi-nuclear aromatic compound (for example, pyrene, peryrene or triphenylene), a xanthene (for example, Fluorescein, Eosin, Erythrosine, Rhodamine B or Rose Bengal), a cyanine (for example, thiacarbocyanine or oxacarbocyanine), a merocyanine (for example, merocyanine or carbomerocyanine), a thiazine (for example, Thionine, Methylene Blue or Toluidine Blue), an acridine (for example, Acridine Orange, chloroflavine or acriflavine), a phthalocyanine (for example, phthalocyanine or metallo-phthalocyanine), a porphyrin (for example, tetraphenyl porphyrin or center metal-substituted porphyrin), a chlorophyll (for example, chlorophyll, chlorophyllin or center metal-substituted chlorophyll), a metal complex, an anthraquinone (for example, anthraquinone) and a squalium (for example, squalium).

More preferable examples of the spectral sensitizing dye or dye include styryl dyes described in JP-B-37-13034, cationic dyes described in JP-A-62-143044, quinoxalinium salts described in JP-B-59-24147, new Methylene Blue compounds described in JP-A-64-33104, anthraquinones described in JP-A-64-56767, benzoxanthene dyes described in JP-A-2-1714, acridines described in JP-A-2-226148 and JP-A-2-226149, pyrylium salts described in JP-B-40-28499, cyanines described in JP-B-46-42363, benzofuran dyes described in JP-A-2-63053, conjugated ketone dyes described in JP-A-2-85858 and JP-A-2-216154, dyes described in JP-A-57-10605, azocinnamylidene derivatives described in JP-B-2-30321, cyanine dyes described in JP-A-1-287105, xanthene dyes described in JP-A-62-31844, JP-A-62-31848 and JP-A-62-143043, aminostyryl ketones described in JP-B-59-28325, merocyanine dyes described in JP-B-61-9621, dyes described in JP-A-2-179643, merocyanine dyes described in JP-A-2-244050, merocyanine dyes described in JP-B-59-28326, merocyanine dyes described in JP-A-59-89803, merocyanine dyes described in JP-A-8-129257, and benzopyran dyes described in JP-A-8-334897.

The sensitizing dye for use in the invention preferably includes sensitizing dyes described in JP-A-2000-147763 and JP-A-2001-100412. Among them, a compound represented by formula (1) shown below is more preferable.

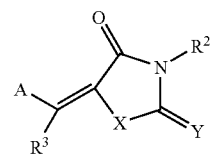

(1)

In formula (1), A represents an aromatic cyclic group which may have a substituent or a sulfo group, X represents an oxygen atom, a sulfur atom or —$N(R^1)$—, Y represents an oxygen atom or =$N(R^1)$, $R^1$, $R^2$ and $R^3$ each independently represents a hydrogen atom or a monovalent non-metallic atomic group, or A and $R^1$, A and $R^2$ or A and $R^3$ may be combined with each other to form an aliphatic or aromatic ring. The monovalent non-metallic atomic group represented by any one of $R^1$, $R^2$ and $R^3$ is preferably a substituted or unsubstituted alkyl group or a substituted or unsubstituted aryl group.

Specific preferable examples of the sensitizing dye represented by formula (1) include those described in Paragraph Nos. [0039] to [0042] of JP-A-2001-100412.

The amount of the sensitizing dye having an absorption peak in a wavelength range of 300 to 850 nm added is ordinarily from 0.05 to 30 parts by weight, preferably from 0.1 to 20 parts by weight, more preferably from 0.2 to 10 parts by weight, per 100 parts by weight of the total solid content constituting the image-forming layer.

<Polymerizable Monomer>

The polymerizable monomer for use in the invention is an addition-polymerizable compound having at least one ethylenically unsaturated double bond, and it is selected from compounds having at least one, preferably two or more, terminal ethylenically unsaturated double bonds. Such compounds are widely known in the field of art and they can be used in the invention without any particular limitation. The compound has a chemical form, for example, a monomer, a prepolymer, specifically, a dimer, a trimer or an oligomer, or a (co)polymer thereof, or a mixture thereof.

Examples of the monomer and copolymer thereof include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Furthermore, an addition reaction product of an unsaturated carboxylic acid ester or amide having an electrophilic substituent, for example, an isocyanato group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

With respect to specific examples of the monomer, which is an ester of an aliphatic polyhydric alcohol compound with an unsaturated carboxylic acid, as an acrylic acid ester, for example, ethylene glycol diacrylate, Methylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate or polyester acrylate oligomer is exemplified.

As a methacrylic acid ester, for example, tetramethylene glycol dimethacrylate, Methylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane is exemplified.

As an itaconic acid ester, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate is exemplified.

As a crotonic acid ester, for example, ethylene glycol dicrotonate, tetramethylene glycol dicrotonate, pentaerythritol dicrotonate and sorbitol tetracrotonate is exemplified.

As an isocrotonic acid ester, for example, ethylene glycol diisocrotonate, pentaerythritol diisocrotonate and sorbitol tetraisocrotonate is exemplified.

As a maleic acid ester, for example, ethylene glycol dimaleate, triethylene glycol dimaleate, pentaerythritol dimaleate or sorbitol tetramaleate is exemplified.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine hisacrylamide, xylylene bisacrylamide and xylylene bismethacrylamide. Other preferable examples of the amide monomer include amides having a cyclohexylene structure described in JP-B-54-21726.

Urethane type addition polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (i) shown below to a polyisocyanate compound having two or more isocyanate groups per molecule, described in JP-B-48-41708.

$$CH_2=C(R^{19})COOCH_2CH(R^{20})OH \quad \text{(i)}$$

wherein $R^{19}$ and $R^{20}$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Furthermore, a photopolymerizable composition having remarkably excellent photosensitive speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with acrylic acid or methacrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use, or an amount added, can be appropriately arranged depending on the characteristic design of the final lithographic printing plate precursor. For instance, the compound is selected from the following standpoints.

In view of the sensitivity, a structure having a large content of unsaturated groups per molecule is preferred and in many cases, a bifunctional or more functional compound is preferred. In order to increase the strength of image area, that is, cured layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a radical polymerization initiator or a coloring agent) in the image-forming layer. For instance, the compatibility may be improved in some cases by using the compound of low purity or using two or more kinds of the compounds in combination. A specific structure may be selected for the purpose of improving an adhesion property, for example, to a support or a protective layer described hereinafter.

In the invention, the polymerizable monomer is preferably used in an amount from 5 to 80% by weight, more preferably from 25 to 75% by weight, based on the nonvolatile component of the image-forming layer.

In the method of using the polymerizable compound, the structure, blend and amount added can be appropriately selected by taking account of the extent of polymerization inhibition due to oxygen, resolution, fogging property, change in refractive index, surface tackiness and the like. Further, depending on the case, a layer construction, for example, an undercoat layer or an overcoat layer, and a coating method, may also be considered.

<Binder Polymer>

In the image-forming layer according to the invention, a binder polymer can be used for the purpose of improving film strength of the image-forming layer. The binder polymer for use in the invention can be selected from those heretofore known without restriction, and a polymer having a film-forming property is preferable. Examples of the binder polymer include acrylic resins, polyvinyl acetal resins, polyurethane resins, polyurea resins, polyimide resins, polyamide resins, epoxy resins, polystyrene resins, novolac type phenolic resins, polyester resins, synthesis rubbers and natural rubbers. Particularly, acrylic resins, polyvinyl acetal resins and polyurethane resins are preferable.

The binder polymer may have a crosslinkable property in order to improve the film strength of the image area. In order to impart the crosslinkable property to the binder polymer, a crosslinkable functional group, for example, an ethylenically unsaturated bond is introduced into a main chain or side chain of the polymer. The crosslinkable functional group may be introduced by copolymerization.

Examples of the polymer having an ethylenically unsaturated bond in the main chain thereof include poly-1,4-butadiene and poly-1,4-isoprene.

Examples of the polymer having an ethylenically unsaturated bond in the side chain thereof include a polymer of an ester or amide of acrylic acid or methacrylic acid, which is a polymer wherein the ester or amide residue (R in —COOR or —CONHR) has an ethylenically unsaturated bond.

Examples of the residue (R described above) having an ethylenically unsaturated bond include —$(CH_2)_n CR^1$=$CR^2 R^3$, —$(CH_2O)_n CH_2 CR^1$=$CR^2 R^3$, —$(CH_2CH_2O)_n CH_2 CR^1$=$CR^2 R^3$, —$(CH_2)_n NH$—CO—O—$CH_2 CR^1$=$CR^2 R^3$, —$(CH_2)_n$—O—CO—$CR^1$=$CR^2 R^3$ and —$(CH_2CH_2O)_2$—X (wherein $R^1$ to $R^3$ each represents a hydrogen atom, a halogen atom or an alkyl group having from 1 to 20 carbon atoms, an aryl group, alkoxy group or aryloxy group, or $R^1$ and $R^2$ or $R^1$ and $R^3$ may be combined with each other to form a ring. n represents an integer of 1 to 10. X represents a dicyclopentadienyl residue).

Specific examples of the ester residue include —$CH_2CH$=$CH_2$ (described in JP-B-7-21633), —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NHCOO—$CH_2CH$=$CH_2$ and —$CH_2CH_2O$—X (wherein X represents a dicyclopentadienyl residue).

Specific examples of the amide residue include —$CH_2CH$=$CH_2$, —$CH_2CH_2$—Y (wherein Y represents a cyclohexene residue) and —$CH_2CH_2$—OCO—$CH$=$CH_2$.

The binder polymer having crosslinkable property is cured, for example, by addition of a free radical (a polymerization initiating radical or a growing radical of a polymerizable monomer during polymerization) to the crosslinkable functional group of the polymer and undergoing addition polymerization between the polymers directly or through a polymerization chain of the polymerizable monomer to form crosslinkage between the polymer molecules. Alternately, it is cured by generation of a polymer radical upon extraction of an atom (for example, a hydrogen atom on a carbon atom adjacent to the functional crosslinkable group) in the polymer by a free radial and connecting the polymer radicals with each other to form cross-linkage between the polymer molecules.

The content of the crosslinkable group in the binder polymer (content of the radical polymerizable unsaturated double bond determined by iodine titration) is preferably from 0.1 to 10.0 mmol, more preferably from 1.0 to 7.0 mmol, most preferably from 2.0 to 5.5 mmol, based on 1 g of the binder polymer. In the range described above, good sensitivity and good preservation stability can be obtained.

The binder polymer for use in the invention preferably has a hydrophilic group. The hydrophilic group contributes to impart the on-press development property to the image-forming layer. In particular, when the crosslinkable group and the hydrophilic group are present in the binder polymer, both printing durability and developing property are well achieved.

Examples of the hydrophilic group include a hydroxy group, a carboxyl group, a carboxylate group, a hydroxyethyl group, an alkylene oxide structure, a hydroxypropyl group, a polyoxyethyl group, a polyoxypropyl group, an amino group, an aminoethyl group, an aminopropyl group, an ammonium group, an amido group, a carboxymethyl group, a sulfo group and a phosphoric acid group. Preferably, for example, an amido group, a hydroxy group, a polyoxyethyl group and an alkylene oxide group are exemplified. The alkylene oxide structure represented by formula (2) shown below is most preferable. The alkylene oxide structure is preferably incorporated into a side chain of the binder polymer.

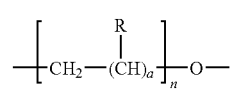

(2)

In formula (2), R represents a hydrogen atom or a methyl group, a represents an integer of 1, 3 or 5, and n represents an integer of 1 to 9. n preferably represents an integer of 1 to 8, more preferably an integer of 1 to 7, still more preferably an integer of 1 to 6, and most preferably an integer of 2 to 4.

In order to introduce the hydrophilic group into an acrylic resin, a monomer having a hydrophilic group may be copolymerized. Specific examples of the copolymerizable monomer having a hydrophilic group include acrylamide, methacrylamide, N,N-dimethylacrylamide, N-isopropylacrylamide, N-vinylpyrrolidone, N-vinylacetamide, N-acryloylmorpholine, 2-hydroxyethyl acrylate, 2-hydroxyethyl methacrylate, polyoxyethylene monomethacrylate, polyoxyethylene monoacrylate, polyoxypropylene monomethacrylate, polyoxypropylene monoacrylate, meth(acrylate) of polyoxyethylene monoalkyl ether and meth(acrylate) of polyoxypropylene monoalkyl ether.

The copolymerizable monomers having a hydrophilic group may be used individually or in combination of two or more thereof. The content of the structural unit having a hydrophilic group in the binder polymer is preferably from 1 to 85% by mole, and particularly preferably from 5 to 70% by mole.

According to the invention, an oleophilic group containing carbon atoms, for example, an alkyl group, an aryl group, an aralkyl group or an alkenyl group may further be introduced into the binder polymer to the extent that the effects of the invention are not damaged. By the introduction of an oleophilic group, an ink acceptivity can be controlled.

In order to impart the oleophilicity to an acrylic resin, a hydrophobic monomer may be copolymerized. Examples of the copolymerizable monomer includes monomers selected from an acrylate, a methacrylate, an N,N-disubstituted acrylamide, an N,N-disubstituted methacrylamide, a styrene, acrylonitrile and methacrylonitrile.

Specific examples thereof include an acrylate, for example, an alkyl acrylate (preferably having from 1 to 20 carbon atoms in the alkyl group thereof) (e.g., methyl acrylate, ethyl acrylate, propyl acrylate, butyl acrylate, amyl acrylate, ethylhexyl acrylate, octyl acrylate, tert-octyl acrylate, chloroethyl acrylate, 2,2-dimethylhydroxypropyl acrylate, 5-hydroxypentyl acrylate, trimetylolpropane monoacrylate, pentaerythritol monoacrylate, glycidyl acrylate, benzyl acrylate, methoxybenzyl acrylate, furfuryl acrylate or tetrahydrofurfuryl acrylate) or an aryl acrylate (e.g., phenyl acrylate), a methacrylate, for example, an alkyl methacrylate (preferably having from 1 to 20 carbon atoms in the alkyl group thereof) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimetylolpropane monomethacrylate, pentaerythritol monomethacrylate, glycidyl methacrylate, furfuryl methacrylate or tetrahydrofurfuryl methacrylate) or an aryl methacrylate (e.g., phenyl methacrylate, cresyl methacrylate or naphthyl methacrylate), styrene, a styrene derivative, for example, an alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxystyrene (e.g., methoxystyrene, 4-methoxy-3-methylstyrene or dimethoxystyrene), or a halogenostyrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene), acrylonitrile and methacrylonitrile.

The weight average molecular weight (Mw) of the binder polymer is preferably 5,000 or more, and more preferably from 10,000 to 300,000. The number average molecular weight (Mn) of the binder polymer is preferably 1,000 or more, and more preferably from 2,000 to 250,000. The polydispersity (Mw/Mn) thereof is preferably from 1.1 to 10.

The binder polymer is available by purchasing a commercial product or synthesizing according to a known method.

The content of the binder polymer is ordinarily from 5 to 90% by weight, preferably from 5 to 80% by weight, more preferably from 10 to 70% by weight, based on the total solid content of the image-forming layer. In the range described above, good strength of the image area and good image-forming property are obtained.

The radical polymerizable monomer and the binder polymer are used preferably in a weight ratio of 0.5/1 to 4/1.

Specific examples of the binder polymer for use in the invention are set forth below, but the invention should not be construed as being limited thereto.

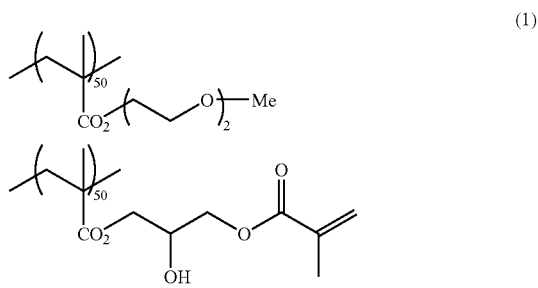

(1)

(2)

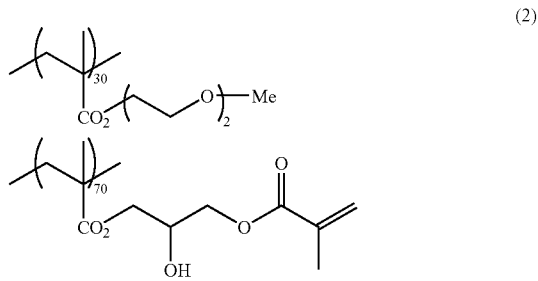

(3)

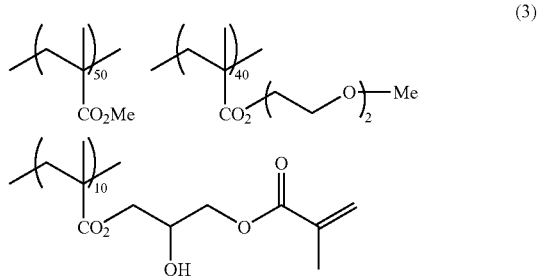

(4)

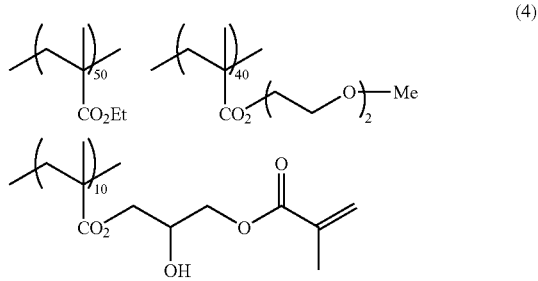

(5)

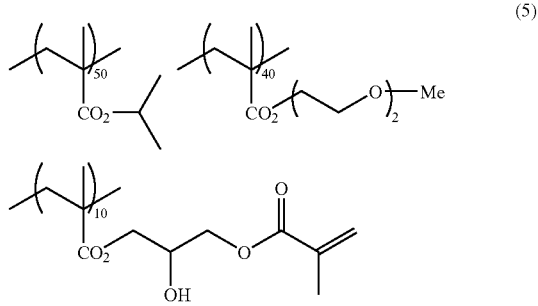

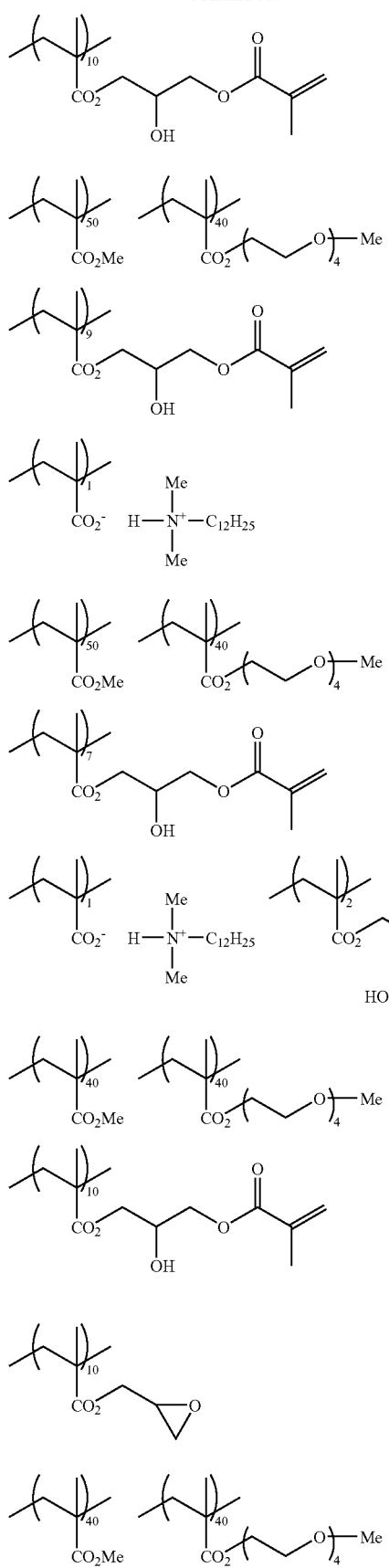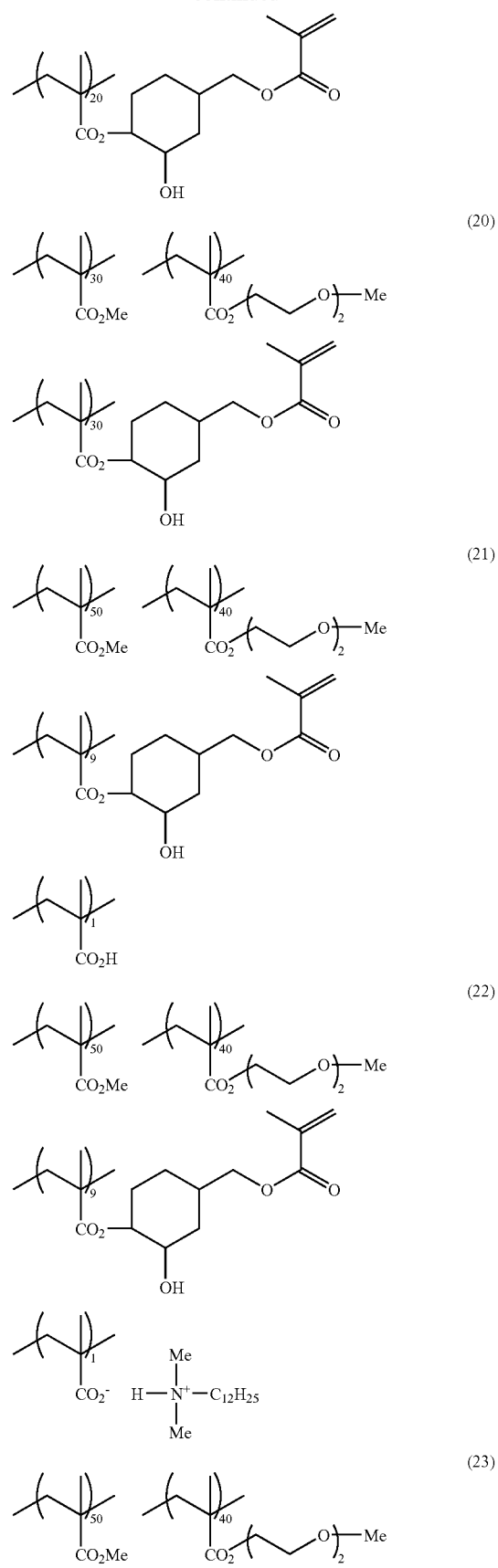

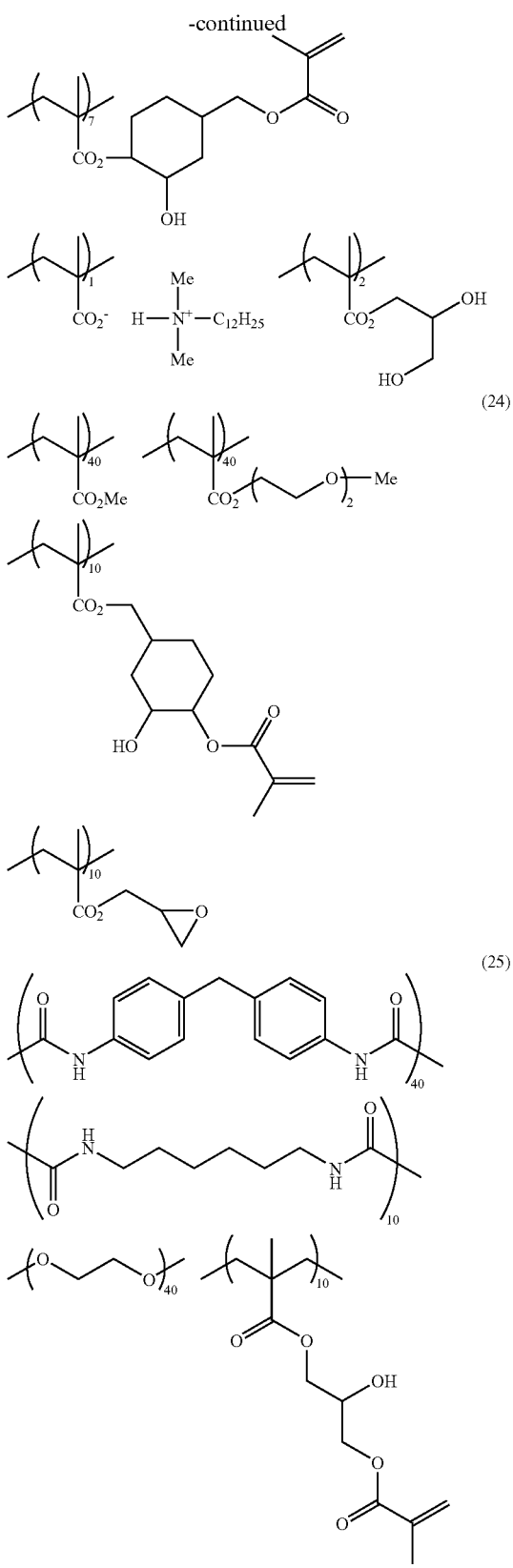

(24)

(25)

<Hydrophobilizing Precursor>

A hydrophobilizing precursor can be used in the image-forming layer according to the invention as described above. The hydrophobilizing precursor is effective for improving the on-press development property. The term "hydrophobilizing precursor" as used herein means a fine particle capable of converting the image-forming layer to be hydrophobic when heat is applied. The fine particle is preferably at least one fine particle selected from hydrophobic thermoplastic polymer fine particle, thermo-reactive polymer fine particle and microcapsule or microgel having a hydrophobic compound incorporated therein.

As the hydrophobic thermoplastic polymer fine particle, hydrophobic thermoplastic polymer fine particles described, for example, in *Research Disclosure*, No. 33303, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile or vinyl carbazole, and a mixture thereof. Of the polymers, polystyrene and polymethyl methacrylate are more preferable.

The average particle size of the hydrophobic thermoplastic polymer fine particle for use in the invention is preferably from 0.01 to 2.0 μm.

Synthesis methods of the hydrophobic thermoplastic polymer fine particle having the particle size described above which can be used as the hydrophobilizing precursor include an emulsion polymerization method and a suspension polymerization method and in addition, a method (dissolution dispersion method) of dissolving the above compound in a water-insoluble organic solvent, mixing and emulsifying the solution with an aqueous solution containing a dispersant, and applying heat to the emulsion thereby solidifying the emulsion to a fine particle state while volatizing the organic solvent.

The thermo-reactive polymer fine particle which can be used as the hydrophobilizing precursor in the invention includes a polymer fine particle having a thermo-reactive group and it forms a hydrophobilized region by crosslinkage due to thermal reaction and change in the functional group involved therein.

As the thermo-reactive group of the polymer fine particle having a thermo-reactive group for use in the invention, a functional group performing any reaction can be used as long as a chemical bond is formed. For instance, an ethylenically unsaturated group (for example, an acryloyl group, a methacryloyl group, a vinyl group or an allyl group), a cationic polymerizable group (for example, a vinyl group or a vinyloxy group) performing a radical polymerization reaction, an isocyanate group performing an addition reaction or a blocked form thereof, an epoxy group, a vinyloxy group and a functional group having an active hydrogen atom (for example, an amino group, a hydroxy group or a carboxyl group) of the reaction partner, a carboxyl group performing a condensation reaction and a hydroxyl group or an amino group of the reaction partner, and an acid anhydride performing a ring opening addition reaction and an amino group or a hydroxyl group of the reaction partner are preferably exemplified.

The introduction of the functional group into polymer fine particle may be conducted at the polymerization or by utilizing a polymer reaction after the polymerization.

When the functional group is introduced at the polymerization, it is preferred that the monomer having the functional group is subjected to emulsion polymerization or suspension polymerization. Specific examples of the monomer having the functional group include allyl methacrylate, allyl acrylate, vinyl methacrylate, vinyl acrylate, 2-(vinyloxy)ethyl methacrylate, p-vinyloxystyrene, p-[2-(vinyloxy)ethyl]styrene, glycidyl methacrylate, glycidyl acrylate, 2-isocyanatoethyl methacrylate or a blocked isocyanato thereof, for example, with an alcohol, 2-isocyanatoethyl acrylate or a blocked isocyanato thereof, for example, with an alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, a difunctional acrylate and a difunctional methacrylate, but the invention should not be construed as being limited to thereto.

In the invention, a copolymer of the monomer having the functional group and a monomer having no thermo-reactive group copolymerizable with the monomer can also be used. Examples of the copolymerizable monomer having no thermo-reactive group include styrene, an alkyl acrylate, an alkyl methacrylate, acrylonitrile and vinyl acetate, but the copolymerizable monomer having no thermo-reactive group should not be construed as being limited thereto.

As the polymer reaction used in the case where the thermo-reactive group is introduced after the polymerization, polymer reactions described, for example, in WO 96/34316 can be exemplified.

Of the polymer fine particles having a thermo-reactive group, polymer fine particles which are coalesced with each other by heat are preferable, and those having a hydrophilic surface and dispersible in water are particularly preferable. It is preferred that the contact angle (water droplet in air) of a film prepared by coating only the polymer fine particle and drying the particle at temperature lower than the solidification temperature is lower than the contact angle (water droplet in air) of a film prepared by coating only the polymer fine particle and drying at temperature higher than the solidification temperature. For making the surface of polymer fine particle hydrophilic, it is effective to let a hydrophilic polymer or oligomer, for example, polyvinyl alcohol or polyethylene glycol, or a hydrophilic low molecular weight compound adsorb on the surface of the polymer fine particle. However, the method for hydrophilizing the surface of polymer fine particle should not be construed as being limited thereto.

The solidification temperature of the polymer fine particle having a thermo-reactive group is preferably 70° C. or higher, more preferably 100° C. or higher in consideration of the time-lapse stability. The average particle size of the polymer fine particle is preferably from 0.01 to 2.0 µm, more preferably from 0.05 to 2.0 µm, most preferably from 0.1 to 1.0 µm. In the range described above, good resolution and good time-lapse stability can be achieved.

The microcapsule for use in the invention includes microcapsule prepared by incorporating all or part of the constituting components of the image-forming layer into microcapsules as described, for example, in JP-A-2001-277740 and JP-A-2001-277742. The constituting components of the image-forming layer may be present outside the microcapsules. It is a preferable embodiment of the image-forming layer containing microcapsules that hydrophobic constituting components are incorporated into the microcapsules and hydrophilic components are present outside the microcapsules.

According to the invention, an embodiment containing a crosslinked resin particle, that is, a microgel is also employed. The microgel can contain a part of the constituting components inside and/or on the surface thereof. An embodiment of a reactive microgel containing the polymerizable monomer on the surface thereof is preferable in view of the image-forming sensitivity and printing durability.

According to one preferable embodiment in the invention, the image-forming layer contains a microcapsule or microgel having one of the compound represented by formula (I) and the compound represented by formula (II) incorporated therein as described above.

As a method of microencapsulation or microgelation of the constituting component of the image-forming layer, known methods can be used.

Methods of producing the microcapsule include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and polyurea and polyurethane are particularly preferred. Further, a compound having a crosslinkable functional group, for example, an ethylenically unsaturated bond, capable of being introduced into the binder polymer described hereinafter may be introduced into the microcapsule wall.

On the other hand, methods of preparing the microgel include, for example, a method of utilizing granulation by interfacial polymerization described in JP-B-38-19574 and JP-B-42-446 and a method of utilizing granulation by dispersion polymerization in a non-aqueous system described in JP-A-5-61214, but the invention should not be construed as being limited thereto.

To the method utilizing interfacial polymerization, known production methods of microcapsule can be applied.

The microgel preferably used in the invention is granulated by interfacial polymerization and has three-dimensional crosslinking. From this point of view, a preferable material to be used includes polyurea, polyurethane, polyester, polycarbonate, polyamide and a mixture thereof, and polyurea and polyurethane are particularly preferred.

The average particle size of the microcapsule or microgel is preferably from 0.01 to 3.0 µm, more preferably from 0.05 to 2.0 µm, particularly preferably from 0.10 to 1.0 µm. In the range described above, good resolution and good time-lapse stability can be achieved.

The content of the hydrophobilizing precursor is preferably in a range of 5 to 90% by weight in terms of solid content concentration. By the addition of hydrophobilizing precursor, the strength of image area is increased.

<Other Components of Image-Forming Layer>

The image-forming layer according to the invention may further contain other components, if desired. Other components used in the image-forming layer according to the invention will be described blow.

(1) Surfactant

In the image-forming layer according to the invention, a surfactant can be used in order to improve the state of coated surface.

The surfactant used includes, for example, a nonionic surfactant, an anionic surfactant, a cationic surfactant, an amphoteric surfactant and a fluorine-based surfactant. Among them, a fluorine-based surfactant is preferable.

As the fluorine-based surfactant, a fluorine-based surfactant containing a perfluoroalkyl group in its molecule is exemplified. Examples of the fluorine-based surfactant include an anionic type, for example, perfluoroalkyl carboxylates, perfluoroalkyl sulfonates or perfluoroalkyl phosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants can be used individually or in combination of two or more thereof.

The content of the surfactant is preferably from 0.001 to 10% by weight, more preferably from 0.01 to 5% by weight, based on the total solid content of the image-forming layer.

(2) Coloring Agent

In the image-forming layer according to the invention, a dye having a large absorption in the visible region can be used as a coloring agent of the image formed. Specifically, the dye includes Oil yellow #101, Oil yellow #103, Oil pink #312, Oil green BG, Oil blue BOS, Oil blue #603, Oil black BY, Oil black BS, Oil black T-505 (produced by Orient Chemical Industries, Ltd.), Victoria pure blue, Crystal violet (CI42555), Methyl violet (CI42535), Ethyl violet, Rhodamine B (CI45170B), Malachite green (CI42000), Methylene blue (CI52015) and dyes described in JP-A-62-293247. Further, a pigment, for example, a phthalocyanine pigment, an azo pigment, carbon black or titanium oxide can also preferably be used.

It is preferred to add the coloring agent since distinction between the image area and the non-image area is easily conducted after the formation of image.

The amount of the coloring agent added is preferably from 0.01 to 10% by weight based on the total solid content of the image-forming layer.

(3) Print-Out Agent

To the image-forming layer according to the invention, a compound undergoing discoloration with an acid or radical can be added in order to form a print-out image.

As the compound used for such a purpose, various dyes, for example, of diphenylmethane type, triphenylmethane type, thiazine type, oxazine type, xanthene type, anthraquinone type, iminoquinone type, azo type and azomethine type are effectively used.

Specific examples thereof include dyes, for example, Brilliant green, Ethyl violet, Methyl green, Crystal violet, basic Fuchsine, Methyl violet 2B, Quinaldine red, Rose Bengal, Methanyl yellow, Thimol sulfophthalein, Xylenol blue, Methyl orange, Paramethyl red, Congo red, Benzo purpurin 4B, α-Naphthyl red, Nile blue 2B, Nile blue A, Methyl violet, Malachite green, Parafuchsine, Victoria pure blue BOH (produced by Hodogaya Chemical Co., Ltd.), Oil blue #603 (produced by Orient Chemical Industries, Ltd.), Oil pink #312 (produced by Orient Chemical Industries, Ltd.), Oil red 5B (produced by Orient Chemical Industries, Ltd.), Oil scarlet #308 (produced by Orient Chemical Industries, Ltd.), Oil red OG (produced by Orient Chemical Industries, Ltd.), Oil red RR (produced by Orient Chemical Industries, Ltd.), Oil green #502 (produced by Orient Chemical Industries, Ltd.), Spiron Red BEH special (produced by Hodogaya Chemical Co., Ltd.), m-Cresol purple, Cresol red, Rhodamine B, Rhodamine 6G, Sulfo Rhodamine B, Auramine, 4-p-diethylaminophenyliminonaphthoquione, 2-carboxyanilino-4-p-diethylaminophenyliminonaphthoquinone, 2-carboxystearylamino-4-p-N,N-bis(hydroxyethyl) aminophenyliminonaphthoquinone, 1-phenyl-3-methyl-4-p-diethylaminophenylimino-5-pyrazolon or 1-β-naphtyl-4-p-diethylaminophenylimino-5-pyrazolon, and a leuco dye, for example, p, p', p"-hexamethyltriaminotriphenylmethane (leuco crystal violet) or Pergascript Blue SRB (produced by Ciba Geigy Ltd.).

In addition to those described above, a leuco dye known as a material for heat-sensitive paper or pressure-sensitive paper is also preferably used. Specific examples thereof include crystal violet lactone, malachite green lactone, benzoyl leuco methylene blue, 2-(N-phenyl-N-methylamino)-6-(N-p-tolyl-N-ethyl)aminofluoran, 2-anilino-3-methyl-6-(n-ethyl-p-tolidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N—N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-pipelidino-6-methyl-7-anilinofluoran, 3-pyrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The amount of the dye undergoing discoloration with an acid or radical is preferably from 0.01 to 10% by weight based on the solid content of the image-forming layer.

(4) Polymerization Inhibitor

It is preferred to add a small amount of a thermal polymerization inhibitor to the image-forming layer according to the invention in order to inhibit undesirable thermal polymerization of the polymerizable monomer during the production or preservation of the image-forming layer.

The thermal polymerization inhibitor preferably includes, for example, hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the image-forming layer.

(5) Higher Fatty Acid Derivative

To the image-forming layer according to the invention, a higher fatty acid derivative, for example, behenic acid or behenic acid amide may be added to localize on the surface of the image-forming layer during a drying step after coating in order to avoid polymerization inhibition due to oxygen.

The amount of the higher fatty acid derivative added is preferably from about 0.1 to about 10% by weight based on the total solid content of the image-forming layer.

(6) Plasticizer

The image-forming layer according to the invention may contain a plasticizer in order to improve the on-press development property.

The plasticizer preferably includes, for example, a phthalic acid ester, e.g., dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate; a glycol ester, e.g., dimethylglycol phthalate, ethylphthalylethyl glycolate, methylphthalylethyl glycolate, butylphthalylbutyl glycolate or triethylene glycol dicaprylate ester; a phosphoric acid ester, e.g., tricresyl phosphate or biphenyl phosphate; an aliphatic dibasic acid ester, e.g., diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate.

The amount of the plasticizer is preferably about 30% by weight or less based on the total solid content of the image-forming layer.

(7) Fine Inorganic Particle

The image-forming layer according to the invention may contain fine inorganic particle in order to increase the strength of cured film and to improve the on-press development property.

The fine inorganic particle preferably includes, for example, silica, alumina, magnesium oxide, titanium oxide, magnesium carbonate, calcium alginate and a mixture thereof. The fine inorganic particle can be used, for example, for strengthening the film or enhancing interface adhesion property due to surface roughening.

The fine inorganic particle preferably has an average particle size from 5 nm to 10 μm, more preferably from 0.5 to 3 μm. In the range described above, it is stably dispersed in the image-forming layer, sufficiently maintains the film strength of the image-forming layer and can form the non-imaging area excellent in hydrophilicity and prevented from the occurrence of stain at the time of printing.

The fine inorganic particle described above is easily available as a commercial product, for example, colloidal silica dispersion.

The content of the fine inorganic particle is preferably 40% by weight or less, more preferably 30% by weight or less, based on the total solid content of the image-forming layer.

(8) Hydrophilic Low Molecular Weight Compound

The image-forming layer according to the invention may contain a hydrophilic low molecular weight compound in order to improve the on-press development property without accompanying degradation of the printing durability.

The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine, pentaerythritol or tris(2-hydroxyethyl)isocyanurate, an organic amine compound, e.g., triethanol amine, diethanol amine or monoethanol amine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine compound.

Of the compounds, an organic sulfonic acid, an organic sulfamic acid, an organic sulfate, for example, sodium salt or lithium salt of an organic sulfuric acid, or a betaine compound is preferably used.

Specific examples of the salt of organic sulfonic acid include sodium n-butylsulfonate, sodium isobutylsulfonate, sodium sec-butylsulfonate, sodium tert-butylsulfonate, sodium n-pentylsulfonate, sodium 1-ethylpropylsulfonate, sodium n-hexylsulfonate, sodium 1,2-dimethylpropylsulfonate, sodium 2-ethylbutylsulfonate, sodium 2-ethylhexylsulfonate, sodium cyclohexylsulfonate, sodium n-heptylsulfonate, sodium n-octylsulfonate, sodium tert-octylsulfonate, sodium n-nonylsulfonate, sodium allylsulfonate, sodium 2-methylallylsulfonate, sodium 4-[2-(2-butyloxyethoxy)ethoxy]butane-1-sulfonate, sodium 4-[2-(2-hexyloxyethoxy)ethoxy]butane-1-sulfonate, sodium 4-{2-[2-(2-ethyl)hexyloxyethoxy]ethoxy}butane-1-sulfonate, sodium 4-[2-(2-decyloxyethoxy)ethoxy]butane-1-sulfonate, sodium 4-{2-[2-(2-butyloxyethoxy)ethoxy]ethoxy}butane-1-sulfonate, sodium 4-[2-{2-[2-(2-ethyl)hexyloxyethoxy]ethoxy}ethoxy]butane-1-sulfonate, sodium benzenesulfonate, sodium p-toluenesulfonate, sodium p-hydroxybenzenesulfonate, sodium p-styrenesulfonate, sodium isophthalic acid dimethyl-5-sulfonate, disodium 1,3-benzenedisulfonate, trisodium 1,3,5-benzenetrisulfonate, sodium p-chlorobenzenesulfonate, sodium 3,4-dichlorobenzenesulfonate, sodium 1-naphtylsulfonate, sodium 2-naphtylsulfonate, sodium 4-hydroxynaphtylsulfonate, disodium 1,5-naphtyldisulfonate, disodium 2,6-naphtyldisulfonate, trisodium 1,3,6-naphtyltrisulfonate and lithium salts of these compounds wherein the sodium is exchanged with lithium.

Specific examples of the salt of organic sulfamic acid include sodium n-butylsulfamate, sodium isobutylsulfamate, sodium tert-butylsulfamate, sodium n-pentylsulfamate, sodium 1-ethylpropylsulfamate, sodium n-hexylsulfamate, sodium 1,2-dimethylpropylsulfamate, sodium 2-ethylbutylsulfamate, sodium cyclohexylsulfamate and lithium salts of these compounds wherein the sodium is exchanged with lithium.

The hydrophilic low molecular weight compound has the hydrophobic portion of a small structure and almost no surface active function and thus, it can be clearly distinguished from the surfactant described hereinbefore in which a long-chain alkylsulfonate or a long-chain alkylbenzenesulfonate is preferably used.

As the organic sulfate, a compound represented by formula (3) shown below is particularly preferably used.

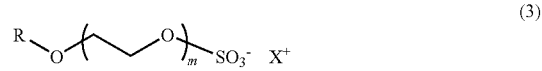

(3)

In formula (3), R represents an alkyl group, an alkenyl group, an alkynyl group, an aryl group or a heterocyclic group, m represents an integer of 1 to 4, and X represents sodium, potassium or lithium.

R in formula (3) preferably represents a straight-chain, branched or cyclic alkyl group having from 1 to 12 carbon atoms, an alkenyl group having from 1 to 12 carbon atoms, an alkynyl group having from 1 to 12 carbon atoms or an aryl group having 20 or less carbon atoms. These groups may have a substituent. Examples of the substituent capable of being introduced include a straight-chain, branched or cyclic alkyl group having from 1 to 12 carbon atoms, an alkenyl group having from 1 to 12 carbon atoms, an alkynyl group having from 1 to 12 carbon atoms, a halogen atom and an aryl group having 20 or less carbon atoms.

Preferable examples of the compound represented by formula (3) include sodium oxyethylene 2-ethylhexyl ether sulfate, sodium dioxyethylene 2-ethylhexyl ether sulfate, potassium dioxyethylene 2-ethylhexyl ether sulfate, lithium dioxyethylene 2-ethylhexyl ether sulfate, sodium trioxyethylene 2-ethylhexyl ether sulfate, sodium tetraoxyethylene 2-ethylhexyl ether sulfate, sodium dioxyethylene hexyl ether sulfate, sodium dioxyethylene octyl ether sulfate and sodium dioxyethylene lauryl ether sulfate. Most preferable examples thereof include sodium dioxyethylene 2-ethylhexyl ether sulfate, potassium dioxyethylene 2-ethylhexyl ether sulfate and lithium dioxyethylene 2-ethylhexyl ether sulfate.

The amount of the hydrophilic low molecular weight compound added to the image-forming layer is preferably from 0.5 to 20% by weight, more preferably from 1 to 10% by weight, still more preferably from 2 to 8% by weight, based on the total solid content of the image-forming layer. In the range described above, good on-press development property and good printing durability are achieved.

As the betaine compound, compounds represented by formulae (4) and (5) are preferably used.

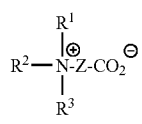

(4)

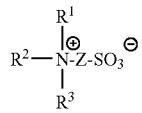

(5)

In formulae (4) and (5), $R^1$ to $R^3$ each independently represents an alkyl group having from 1 to 5 carbon atoms, an alkenyl group having from 2 to 5 carbon atoms, an alkynyl group having from 2 to 5 carbon atoms, a cycloalkyl group having from 3 to 10 carbon atoms or an aryl group having from 6 to 15 carbon atoms, each of which groups may be substituted with a hydroxy group or an amino group, Z represents an alkylene group having from 1 to 4 carbon atoms, which may be substituted with a hydroxy group, or at least two of $R^1$ to $R^3$ and Z may be combined with each other to form a heterocyclic ring having from 5 to 10 carbon atoms.

By incorporating the compound represented by formula (4) or (5) into the image-forming layer, the on-press development property can be improved without accompanying deterioration of the printing durability. Of the compounds represented by formulae (4) and (5), it is preferred that $R^1$ to $R^3$ each independently represents an alkyl group having from 1 to 3 carbon atoms or two of $R^1$ to $R^3$ and Z are combined with each other to form a 5-membered or 6-membered heterocyclic ring. In particular, a compound having a quaternary ammonium skeleton in which $R^1$ to $R^3$ in formula (4) or (5) each independently represents a methyl group or an ethyl group, or a compound having a pyrrolidine skeleton, a piperidine skeleton, a pyridine skeleton or an imidazoline skeleton each of which is formed by combining two of $R^1$ to $R^3$ and Z in formula (4) or (5) is preferable.

Specific examples of the compound represented by formula (4) are set forth below, but the invention should not be construed as being limited thereto.

(C-1)

(C-2)

(C-3)

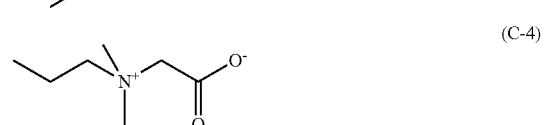

(C-4)

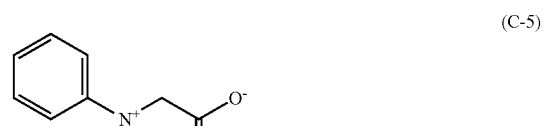

(C-5)

(C-6)

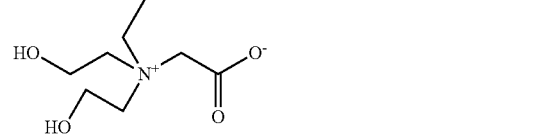

(C-7)

(C-8)

(C-9)

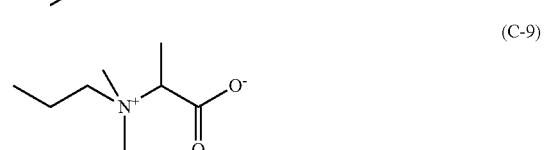

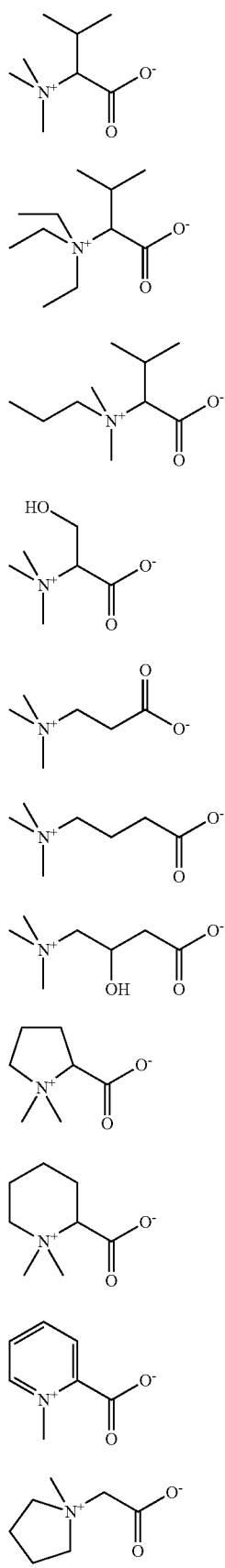
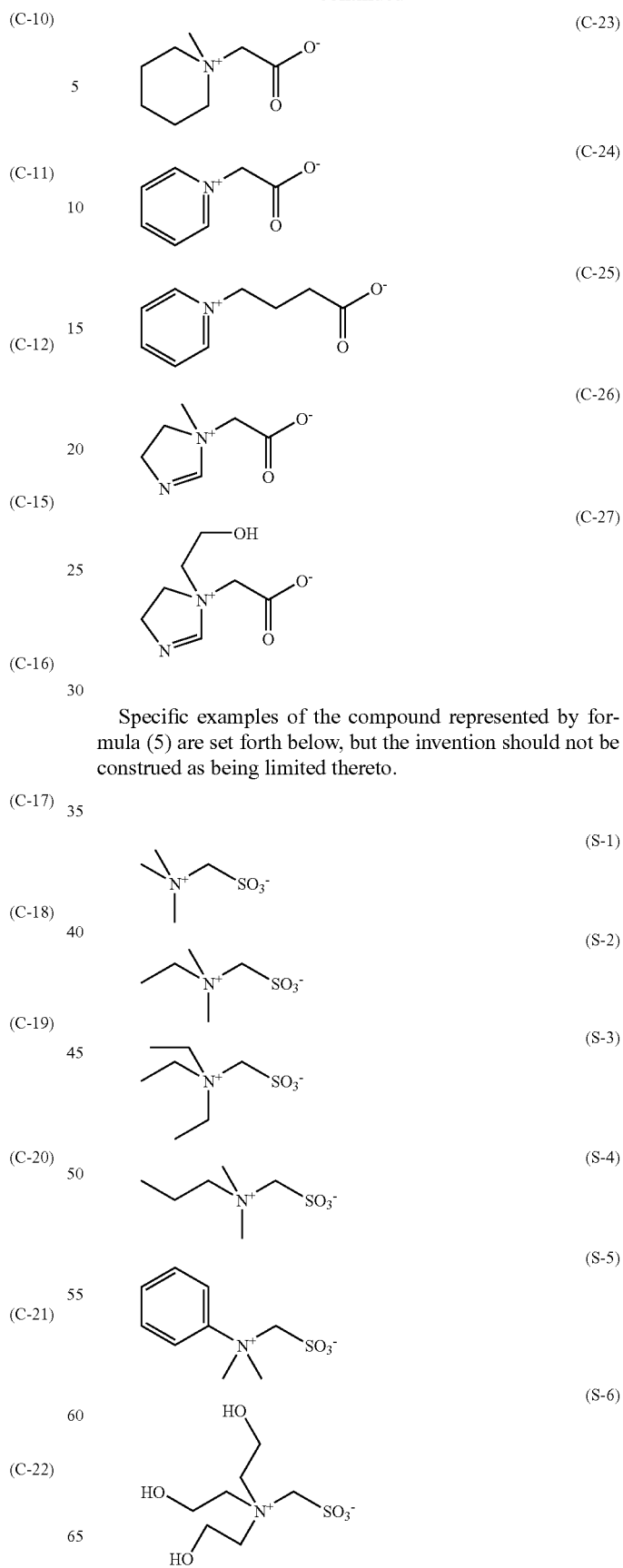
Specific examples of the compound represented by formula (5) are set forth below, but the invention should not be construed as being limited thereto.

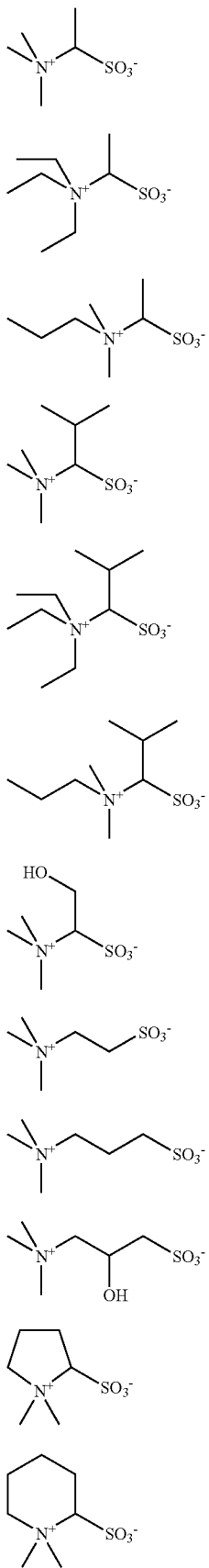
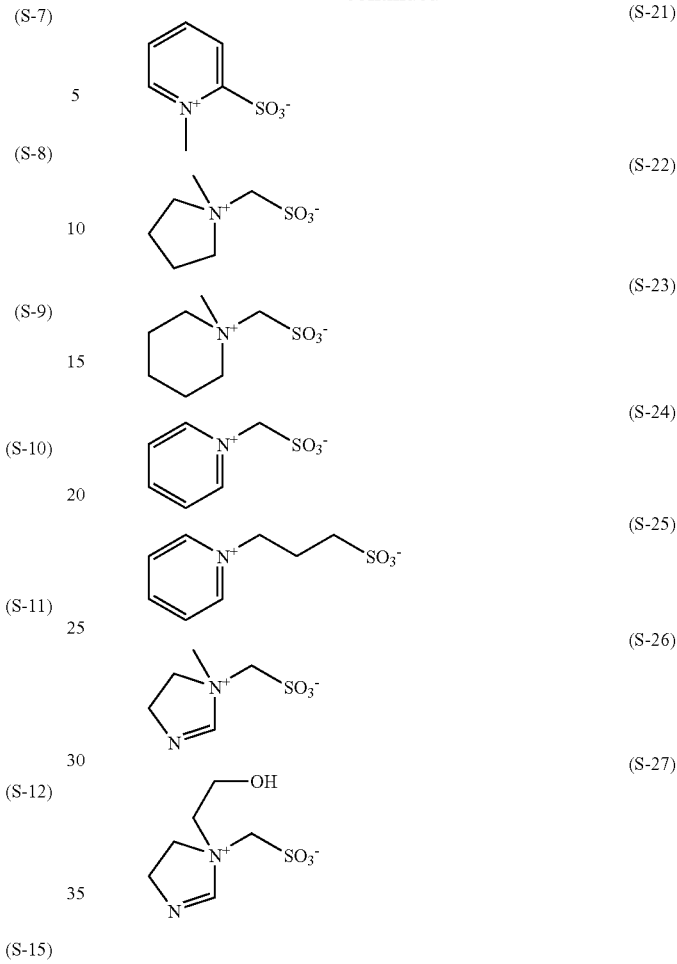

Since the organic sulfonic acid, organic sulfamic acid, organic sulfate or betain compound has a small structure of hydrophobic portion and almost no surface active function, when dampening water penetrates into the exposed area (image area) of the image-forming layer, degradations of the hydrophobicity and film strength of the image area are prevented and thus, the ink-receptive property and printing durability of the image-forming layer can be preferably maintained.

The amount of the compound represented by formula (4) or (5) added to the image-forming layer is preferably from 0.1 to 10% by weight, more preferably from 0.2 to 5% by weight, still more preferably from 0.4 to 2% by weight, based on the total solid content of the image-forming layer. In the range described above, good on-press development property and good printing durability are achieved.

Since the hydrophilic low molecular weight compound, for example, organic sulfonic acid, organic sulfamic acid, organic sulfate or betain compound has a small structure of hydrophobic portion and almost no surface active function, when dampening water penetrates into the exposed area (image area) of the image-forming layer, degradations of the hydrophobicity and film strength of the image area are prevented and thus, the ink-receptive property and printing durability of the image-forming layer can be preferably maintained.

The hydrophilic low molecular weight compounds may be used individually or as a mixture of two or more thereof.

(9) Oil-Sensitizing Agent

In the case where an inorganic stratiform compound is incorporated into a protective layer described hereinafter, in order to improve the ink-receptive property, an oil-sensitizing agent, for example, a phosphonium compound, a nitrogen-containing low molecular weight compound or an ammonium group-containing polymer can be used into the image-forming layer.

These compounds function as a surface covering agent (oil-sensitizing agent) of the inorganic stratiform compound and prevents deterioration of the ink-receptive property during printing due to the inorganic stratiform compound.

As preferable examples of the phosphonium compound, compounds represented by formula (K1) shown below described in JP-A-2006-297907 and compounds represented by formula (K2) shown below described in JP-A-2007-50660 are exemplified.

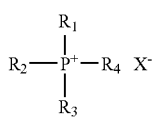

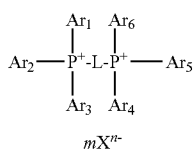

In formula (K1), $R_1$ to $R_4$ each independently represents an alkyl group, an alkenyl group, an alkynyl group, a cycloalkyl group, an alkoxy group, an aryl group, an aryloxy group, an alkylthio group or a heterocyclic group, each of which may have a substituent, or a hydrogen atom, alternatively, at least two of $R_1$ to $R_4$ may be combined with each other to form a ring, and $X^-$ represents a counter anion.

In formula (K2), $Ar_1$ to $Ar_6$ each independently represents an aryl group or a heterocyclic group, L represents a divalent connecting group, $X^{n-}$ represents a n-valent counter anion, n represents an integer of 1 to 3, and m represents a number satisfying n×m=2.

The aryl group preferably includes, for example, a phenyl group, a naphthyl group, a tolyl group, a xylyl group, a fluorophenyl group, a chlorophenyl group, a bromophenyl group, a methoxyphenyl group, an ethoxyphenyl group, a dimethoxyphenyl group, a methoxycarbonylphenyl group and a dimethylaminophenyl group. The heterocyclic group preferably includes, for example, a pyridyl group, a quinolyl group, a pyrimidinyl group, a thienyl group and a furyl group. L preferably represents a divalent connecting group having from 6 to 15 carbon atoms, more preferably a divalent connecting group having from 6 to 12 carbon atoms. $X^{n-}$ preferably represents a halide anion, for example, $Cl^-$, $Br^-$ or $I^-$, a sulfonate anion, for example, toluenesulfonate, naphthalene-1,7-disulfonate, naphthalene-1,3,6-trisulfonate or 5-benzoyl-4-hydroxy-2-methoxybenzene-4-sulfonate, a carboxylate anion, a sulfate ester anion, a sulfate anion, $PF_6^-$, $BF_4^-$ and a perchlorate anion. Among them, a sulfonate anion is particularly preferable.

Specific examples of the phosphonium compound represented by formula (K1) or (K2) are set forth below.

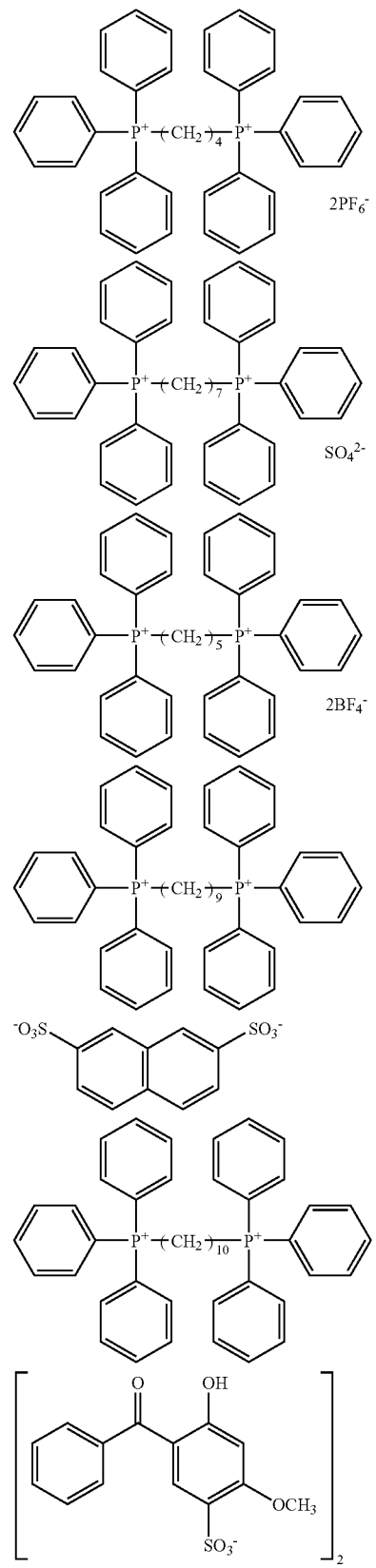

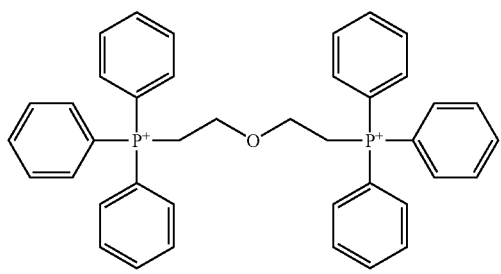

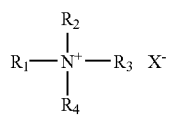

A nitrogen-containing low molecular weight compound described below is also exemplified as the oil-sensitizing agent, which is preferably used in the invention, as well as the phosphonium compound described above. Preferable examples of the nitrogen-containing low molecular weight compound include compounds having a structure represented by formula (K3) shown below.

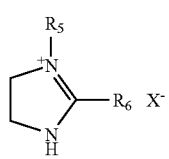
(K3)

In formula (K3), $R^1$ to $R^4$ each independently represents an alkyl group, an alkenyl group, an alkynyl group, a cycloalkyl group, an alkoxy group, an aryl group, an aralkyl group or a heterocyclic group, each of which may have a substituent, or a hydrogen atom, alternatively, at least two of $R^1$ to $R^4$ may be combined with each other to form a ring, and $X^-$ represents an anion including $PF_6^-$, $BF_4^-$ or an organic sulfonate anion having a substituent selected from an alkyl group, an alkenyl group, an alkynyl group, a cycloalkyl group, an alkoxy group, an aryl group, an aralkyl group and a heterocyclic group.

Specifically, the nitrogen-containing low molecular weight compound for use in the invention includes an amine salt in which at least one of $R^1$ to $R^4$ in formula (K3) is a hydrogen atom, a quaternary ammonium salt in which any of $R^1$ to $R^4$ in formula (K3) is not a hydrogen atom. Also, it may have a structure of an imidazolinium salt represented by formula (K4) shown below, of a benzimidazolinium salt represented by formula (K5) shown below, of a pyridinium salt represented by formula (K6) shown below, or of a quinolinium salt represented by formula (K7) shown below.

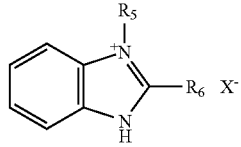
(K4)

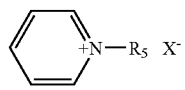
(K5)

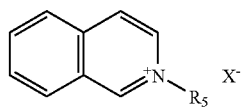
(K6)

(K7)

In the above formulae, $R_5$ and $R_6$ each independently represents an alkyl group, an alkenyl group, an alkynyl group, a cycloalkyl group, an alkoxy group, an aryl group, an aralkyl group or a heterocyclic group, each of which may have a substituent, or a hydrogen atom, and $X^-$ represents an anion having the same meaning as $X^-$ in formula (K3).

Of these, the quaternary ammonium salt and pyridinium salt are preferably used. Specific examples thereof are set forth below.

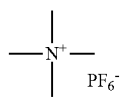
(A-1)

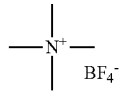
(A-2)

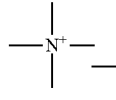
(A-3)

(A-4)

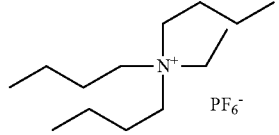
(A-5)

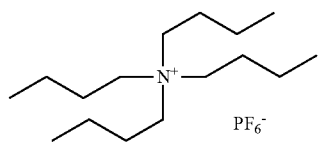
(A-6)

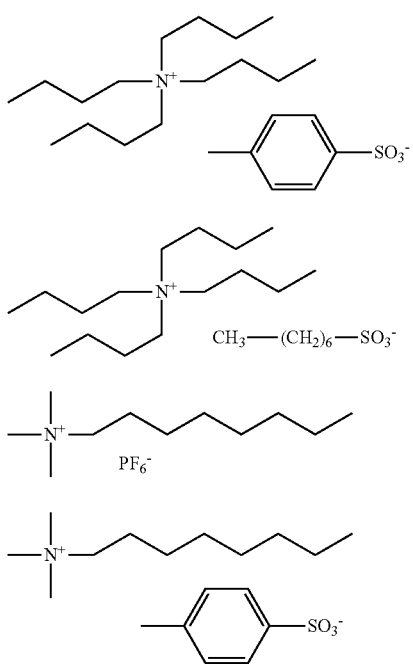
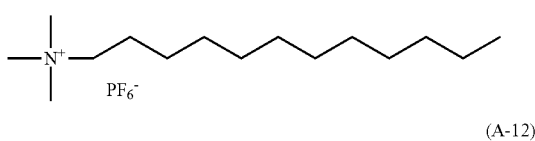
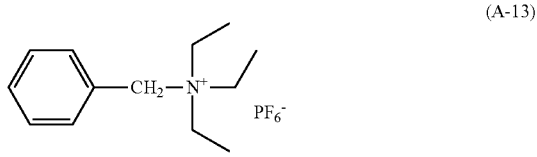
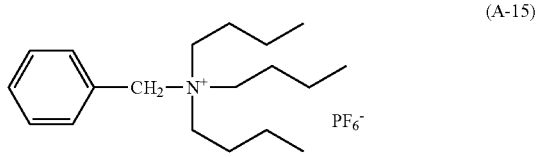
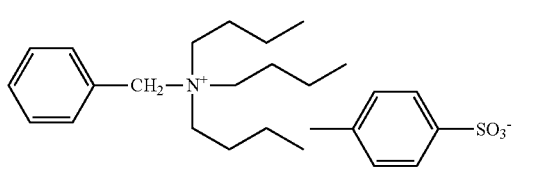

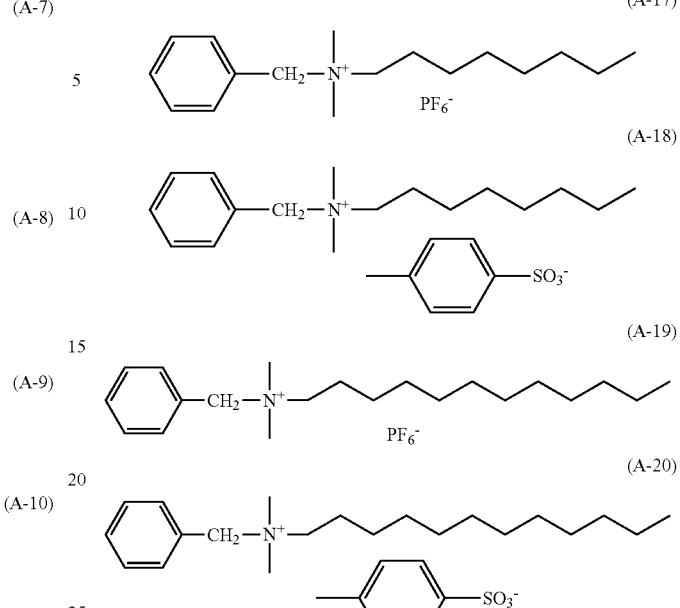

The amount of the phosphonium compound or nitrogen-containing low molecular weight compound added to the image-forming layer is preferably from 0.01 to 20% by weight, more preferably from 0.05 to 10% by weight, most preferably from 0.1 to 5% by weight, based on the solid content of the image-forming layer. In the range described above, good ink-receptive property during printing is obtained.

As the oil-sensitizing agent for use in the invention, an ammonium group-containing polymer described below is also preferably exemplified. The ammonium group-containing polymer may be any polymer containing an ammonium group in its structure and is preferably a polymer containing as repeating units, a structure represented by formula (K8) shown below and a structure represented by formula (K9) shown below.

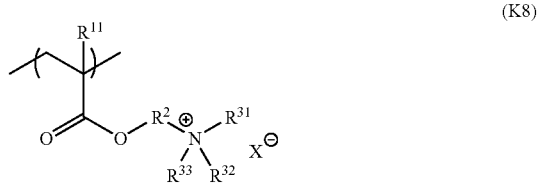

In formulae (K8) and (K9), $R^{11}$ and $R^{12}$ each independently represents a hydrogen atom or a methyl group, $R^2$ represents a divalent connecting group, for example, an alkylene group which may have a substituent or an alkyleneoxy group which may have a substituent, $R^{31}$, $R^{32}$ and $R^{33}$ each independently represents an alkyl group having from 1 to 10 carbon atoms or an aralkyl group, $X^-$ represents an organic or inorganic anion, for example, F⁻, Cl⁻, Br⁻, I⁻, a benzenesulfonate anion which may have a substituent, a methylsulfate anion, an ehtylsulfate anion, a propylsulfate anion, a butylsulfate anion which may be branched, an amylsulfate anion which may be branched, $PF_6^-$, $BF_4^-$ or $B(C_6F_5)_4^-$, $R^4$ represents an alkyl group having from 1 to 21 carbon atoms, an aralkyl group, an aryl group, $—(C_2H_4O)_n—R^5$ or $—(C_3H_6O)_n—R^5$, $R^5$ represents a hydrogen atom, a methyl group or an ethyl group, and n represents 1 or 2.

The ammonium group-containing polymer includes at least one of the structural units represented by formula (K8) and at least one of the structural units represented by formula (K9), and it may include two or more of the structural units represented by formula (K8) or (K9) or both. A ratio of the both structural units is not particularly restricted and is particularly preferably from 5:95 to 80:20 in a molar ratio. The polymer may include other copolymerization component within a range of ensuring the effects of the invention.

As to the ammonium group-containing polymer, a reduced specific viscosity value (unit: cSt/g/ml) obtained according to the measuring method described below is preferably from 5 to 120, more preferably from 10 to 110, particularly preferably from 15 to 100.

<Measuring Method of Reduced Specific Viscosity>

In a 20 ml measuring flask was weighed 3.33 g of a 30% by weight polymer solution (1 g as a solid content) and the measuring flask was filled up to the gauge line with N-methyl pyrrolidone. The resulting solution was put into an Ubbelohde viscometer (viscometer constant: 0.010 cSt/s) and a period for running down of the solution at 30° C. was measured. The viscosity was determined in a conventional manner according to the following calculating formula:

Kinetic viscosity=Viscometer constant×Period for liquid to pass through a capillary (sec)

The content of the ammonium group-containing polymer is preferably from 0.0005 to 30.0% by weight, more preferably from 0.001 to 20.0% by weight, most preferably from 0.002 to 15.0% by weight, based on the total solid content of the image-forming layer. In the range described above, good ink-receptive property is obtained. The ammonium group-containing polymer may further be incorporated into a protective layer.

Specific examples of the ammonium group-containing polymer are set forth below.

(1)

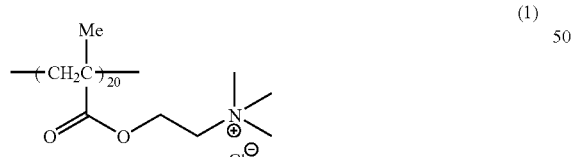

(2)

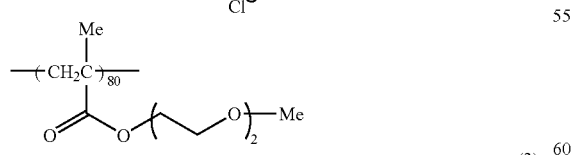

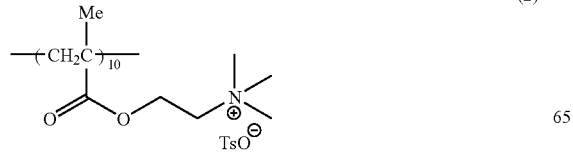

-continued

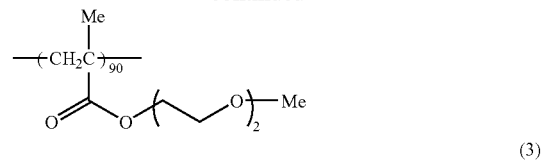

(3)

(4)

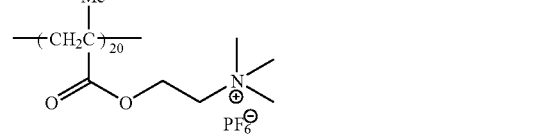

(5)

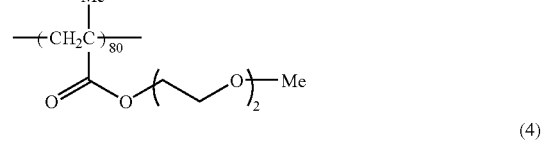

(6)

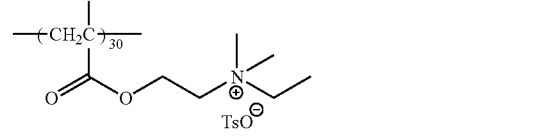

(7)

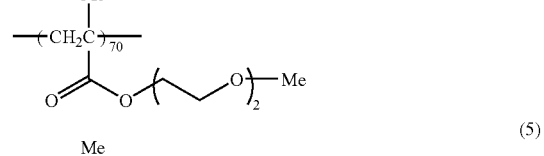

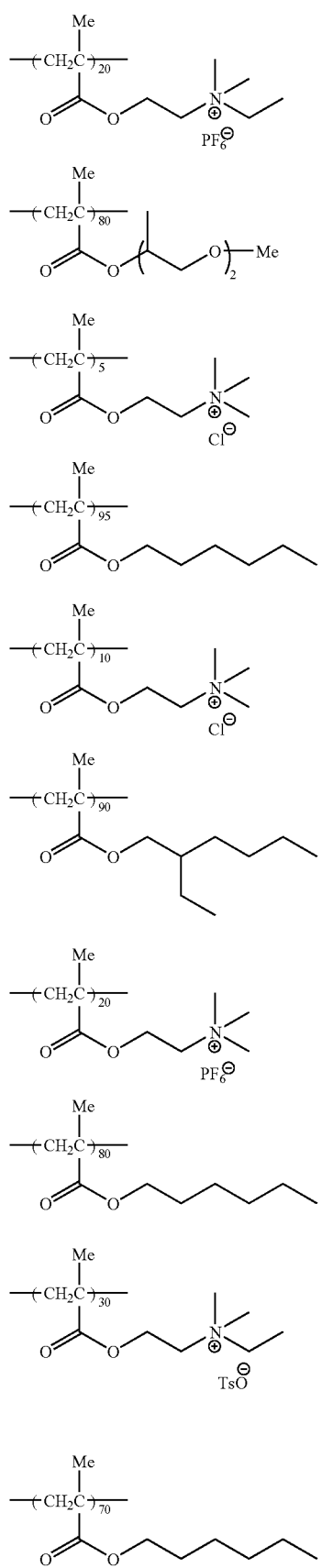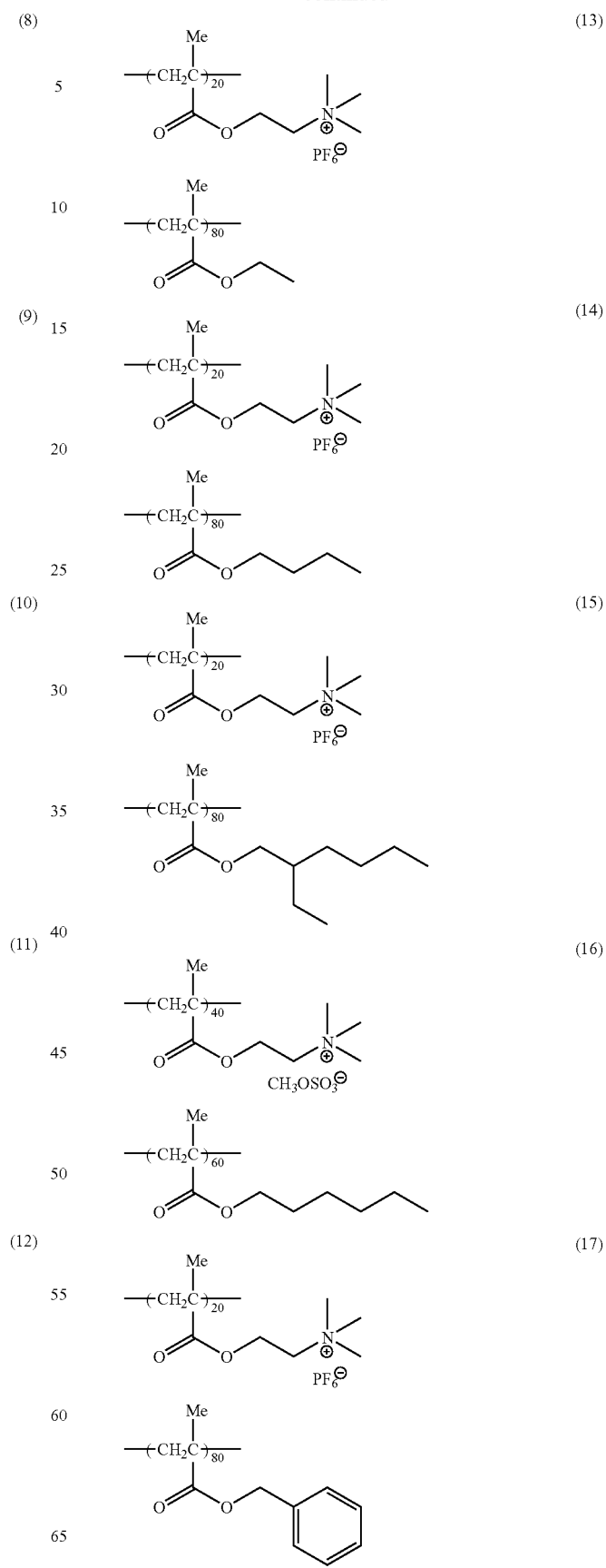

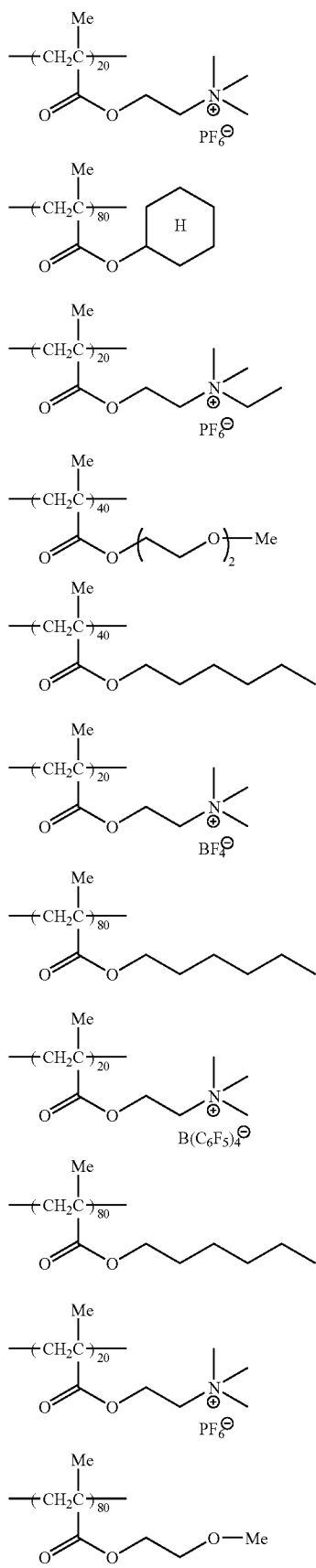
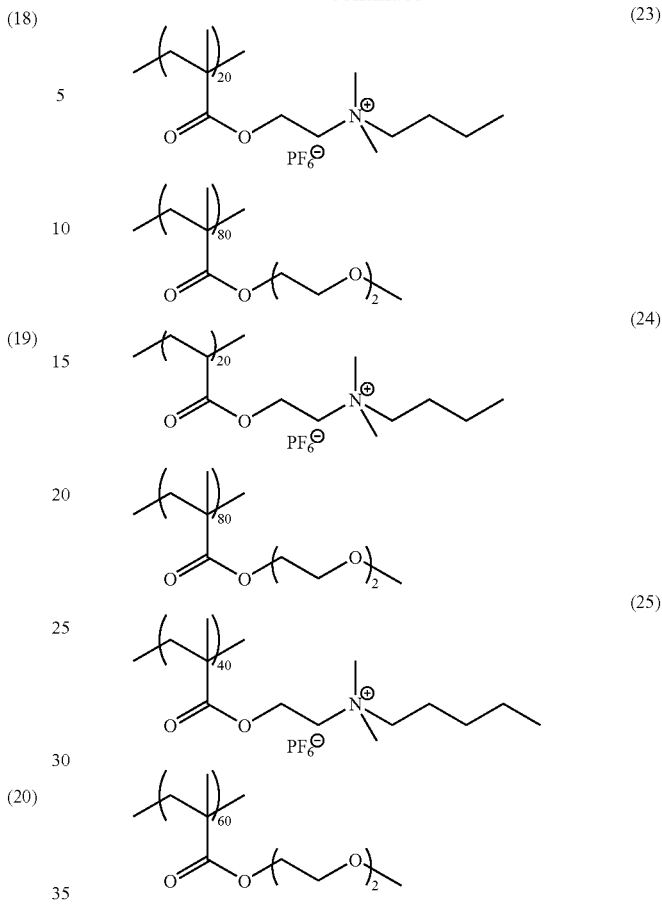

(10) Chain Transfer Agent

The image-forming layer according to the invention may contain a chain transfer agent. In particular, in case of using ultraviolet ray or visible light as an exposure light source and a sensitizing dye having an absorption peak in a wavelength range of 300 to 850 nm, it is preferred to use the chain transfer agent.

The chain transfer agent contributes to improvements in the sensitivity and preservation stability. Compounds which function as the chain transfer agents include, for example, compounds containing SH, PH, SiH or GeH in their molecules. Such a compound donates hydrogen to a radical species of low activity to generate a radical, or is oxidized and then deprotonated to generate a radical.

In the image-forming layer according to the invention, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used as the chain transfer agent.

Also, a polyfunctional thiol compound having two or more mercapto groups in its molecule may be used. Specific examples of the polyfunctional thiol compound include hexanedithiol, decanedithiol, 1,4-butanediol bis(3-mercaptopropionate), 1,4-butanediol bis(mercaptoacetate), ethylene glycol bis(mercaptoacetate), ethylene glycol bis(3-mercaptopropionate), trimethylolpropane tris(mercaptoacetate), trimethylolpropane tris(3-mercaptopropionate), trimethylolpropane tris(2-mercaptoisobutyrate), pentaerythritol tetrakis(mercaptoacetate) and pentaerythritol tetrakis(3-mercaptopropionate).

Among them, a thiol compound represented by formula (6) shown below described in JP-A-2006-91479 is particularly preferably used. By using the thiol compound as the chain transfer agent, a problem of the odor and decrease in sensitivity due to evaporation of the compound from the image-forming layer or diffusion thereof into other layers are avoided and a lithographic printing plate precursor which is excellent in preservation stability and exhibits high sensitivity and good printing durability is obtained.

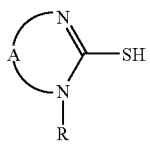

(6)

In formula (6), R represents an alkyl group which may have a substituent or an aryl group which may have a substituent, A represents an atomic group necessary for forming a 5-membered or 6-membered hetero ring containing a carbon atom together with the N=C—N linkage, and A may have a substituent.

Compounds represented by formulae (6A) and (6B) shown below are more preferably used.

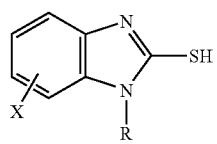

(6A)

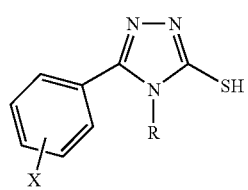

(6B)

In formulae (6A) and (6B), R represents an alkyl group which may have a substituent or an aryl group which may have a substituent, and X represents a hydrogen atom, a halogen atom, an alkoxy group which may have a substituent, an alkyl group which may have a substituent or an aryl group which may have a substituent.

Specific examples thereof include 1-methyl-2-mercaptobenzimidazole, 1-propyl-2-mercaptobenzimidazole, 1-hexyl-2-mercaptobenzimidazole, 1-hexyl-2-mercapto-5-chlorobenzimidazole, 1-pentyl-2-mercaptobenzimidazole, 1-octyl-2-mercaptobenzimidazole, 1-octyl-2-mercapto-5-methoxybenzimidazole, 1-cyclohexyl-2-mercaptobenzimidazole, 1-phenyl-2-mercaptobenzimidazole, 1-phenyl-2-mercapto-5-methylsulfonylbenzimidazole, 1-(p-tolyl)-2-mercaptobenzimidazole, 1-methoxyethyl-2-mercaptobenzimidazole, 1-butyl-2-mercaptonaphthoimidazole, 1-methyl-2-mercapto-5-phenyl-1,3,5-triazole, 1-butyl-2-mercapto-5-phenyl-1,3,5-triazole, 1-heptyl-2-mercapto-5-phenyl-1,3,5-triazole, 1-phenyl-2-mercapto-5-phenyl-1,3,5-triazole, 1-benzyl-2-mercapto-5-phenyl-1,3,5-triazole, 1-phenetyl-2-mercapto-5-phenyl-1,3,5-triazole, 1-cyclohexyl-2-mercapto-5-phenyl-1,3,5-triazole, 1-phenetyl-2-mercapto-5-(3-fluorophenyl)-1,3,5-triazole, 1-phenetyl-2-mercapto-5-(3-trifluoromethylphenyl)-1,3,5-triazole, 1-benzyl-2-mercapto-5-(p-tolyl)-1,3,5-triazole, 1-benzyl-2-mercapto-5-(4-methoxyphenyl)-1,3,5-triazole, 1-benzyl-2-mercapto-5-(p-trifluoromethylphenyl)-1,3,5-triazole, 1-benzyl-2-mercapto-5-(3,5-dichlorophenyl)-1,3,5-triazole, 1-phenyl-2-mercapto-5-(p-tolyl)-1,3,5-triazole, 1-phenyl-2-mercapto-5-(4-methoxyphenyl)-1,3,5-triazole, 1-(1-naphthyl)-2-mercapto-5-phenyl-1,3,5-triazole, 1-(4-bromophenyl)-2-mercapto-5-phenyl-1,3,5-triazole and 1-(4-trifluoromethylphenyl)-2-mercapto-5-phenyl-1,3,5-triazole.

The amount of the chain transfer agent used is preferably from 0.01 to 20% by weight, more preferably from 0.1 to 15% by weight, still more preferably from 1.0 to 10% by weight, based on the total solid content of the image-forming layer.

<Formation of Image-Forming Layer>

The image-forming layer according to the invention is formed by dispersing or dissolving each of the necessary constituting components described above in a solvent to prepare a coating solution and coating the solution on a support and drying.

The solvent used include, for example, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid content concentration of the coating solution is preferably from 1 to 50% by weight.

As to the image-forming layer according to the invention, it is also possible to form the image-forming layer of multi-layer structure by preparing plural coating solutions by dispersing or dissolving the same or different constituting components described above into the same or different solvents and conducting repeatedly the coating and drying plural times.

The coating amount (solid content) of the image-forming layer formed on a support after coating and drying may be varied according to the intended purpose but is ordinarily preferably from 0.3 to 3.0 g/m$^2$. In the range described above, good sensitivity and good film property of the image-forming layer can be achieved.

Various methods can be used for the coating. Examples of the coating method include bar coater coating, spin coating, spray coating, curtain coating, dip coating, air knife coating, blade coating and roll coating.

(Protective Layer)

In the lithographic printing plate precursor according to the invention, it is preferred to provide a protective layer (overcoat layer) on the image-forming layer.

The protective layer has a function for preventing, for example, occurrence of scratch in the image-forming layer or ablation caused by exposure with a high illuminance laser beam, in addition to the function for restraining an inhibition reaction against the image formation by means of oxygen blocking.

The components constituting the protective layer will be described below.

Ordinarily, the exposure process of a lithographic printing plate precursor is performed in the air. The image-forming reaction occurred upon the exposure process in the image-forming layer may be inhibited by a low molecular weight compound, for example, oxygen or a basic substance present in the air. The protective layer prevents the low molecular weight compound, for example, oxygen or the basic substance from penetrating into the image-forming layer and as a result, the inhibition of image-forming reaction at the exposure process in the air can be avoided. Accordingly, the property required of the protective layer is to reduce permeability of the low molecular compound, for example, oxygen. Further, the protective layer preferably has good transparency to light used for the exposure, is excellent in an adhesion property to the image-forming layer, and can be easily removed during the on-press development processing step after the exposure. With respect to the protective layer having such properties, there are described, for example, in U.S. Pat. No. 3,458,311 and JP-B-55-49729.

As a material for use in the protective layer, any water-soluble polymer and water-insoluble polymer can be appropriately selected to use. Specifically, a water-soluble polymer, for example, polyvinyl alcohol, a modified polyvinyl alcohol, polyvinyl pyrrolidone, polyvinyl imidazole, polyacrylic acid, polyacrylamide, a partially saponified product of polyvinyl acetate, an ethylene-vinyl alcohol copolymer, a water-soluble cellulose derivative, gelatin, a starch derivative or gum arabic, and a polymer, for example, polyvinylidene chloride, poly(meth)acrylonitrile, polysulfone, polyvinyl chloride, polyethylene, polycarbonate, polystyrene, polyamide or cellophane are exemplified.

The polymers may be used in combination of two or more thereof, if desired.

As a relatively useful material for use in the protective layer, a water-soluble polymer compound excellent in crystallinity is exemplified. Specifically, polyvinyl alcohol, polyvinyl pyrrolidone, polyvinyl imidazole, a water-soluble acrylic resin, for example, polyacrylic acid, gelatin or gum arabic is preferably used. Above all, polyvinyl alcohol, polyvinyl pyrrolidone and polyvinyl imidazole are more preferably used from the standpoint of capability of coating with water as a solvent and easiness of removal with dampening water at the printing. Among them, polyvinyl alcohol (PVA) provides most preferable results on the fundamental properties, for example, oxygen blocking property or removability with development.

The polyvinyl alcohol for use in the protective layer may be partially substituted with ester, ether or acetal as long as it contains a substantial amount of unsubstituted vinyl alcohol units necessary for maintaining water solubility. Also, the polyvinyl alcohol may partially contain other copolymerization components. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer chain a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are also preferably used.

Preferable examples of the polyvinyl alcohol include those having a hydrolysis degree of 71 to 100% by mole and a polymerization degree of 300 to 2,400. Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, produced by Kuraray Co., Ltd.

Specific examples of the modified polyvinyl alcohol include that having an anion-modified cite, for example, KL-318, KL-118, KM-618, KM-118 or SK-5102, that having a cation-modified cite, for example, C-318, C-118 or CM-318, that having a terminal thiol-modified cite, for example, M-205 or M-115, that having a terminal sulfide-modified cite, for example, MP-103, MP-203, MP-102 or MP-202, that having an ester-modified cite with a higher fatty acid at the terminal, for example, HL-12E or HL-1203 and that having a reactive silane-modified cite, for example, R-1130, R-2105 or R-2130, all produced by Kuraray Co., Ltd.

It is also preferable that the protective layer contains an inorganic stratiform compound, that is, an inorganic compound having a stratiform structure and a tabular shape. By using the inorganic stratiform compound together, the oxygen blocking property is more increased, and the printing durability is surprisingly improved. And the film strength of the protective layer is more increased to improve the scratch resistance, a matting property is imparted to the protective layer.

The stratiform compound includes, for instance, mica, for example, natural mica represented by the following formula: $A(B,C)_{2-5}D_4O_{10}(OH,F,O)_2$, (wherein A represents any one of Li, K, Na, Ca, Mg and an organic cation, B and C each represents any one of Fe (II), Fe(III), Mn, Al, Mg and V, and D represents Si or Al) or synthetic mica, talc represented by the following formula: $3MgO.4SiO.H_2O$, teniolite, montmorillonite, saponite, hectolite and zirconium phosphate.

Of the mica compounds, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}L_{1/8}(Si_4O_{10})F_2$. Synthetic smectite is also useful.

Of the mica compounds, fluorine-based swellable mica, which is a synthetic stratiform compound, is particularly useful. Specifically, the mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Li^+$, $Na^+$, $Ca^{2+}$, $Mg^{2+}$ or an organic cation, e.g., an amine salt, a quaternary ammonium salt, a phosphonium salt or a sulfonium salt is adsorbed between the lattice layers. The stratiform compound swells upon contact with water. When share is applied under such condition, the stratiform crystal lattices are easily cleaved to form a stable sol in water. Since the bentnite and swellable synthetic mica have strongly such tendency, they are useful for the invention and particularly, the swellable synthetic mica is preferably used in the invention from the standpoint of ready availability and uniformity of the quality.

The shape of the stratiform compound is tabular and from the standpoint of control of diffusion, the thinner the thickness or the larger the plain size as long as smoothness of coated surface and transmission of actinic radiation are not damaged, the better. Therefore, an aspect ratio of the stratiform compound is ordinarily 20 or more, preferably 100 or more, particularly preferably 200 or more. The aspect ratio is a ratio of major axis to thickness of particle and can be determined, for example, from a projection drawing of particle by a microphotography. The larger the aspect ratio, the greater the effect obtained.

As for the particle diameter of the stratiform compound, an average diameter is ordinarily from 0.3 to 20 μm, preferably from 0.5 to 10 μm, particularly preferably from 1 to 5 μm. When the particle diameter is less than 0.3 μm, the inhibition of permeation of oxygen or moisture is insufficient and the effect of the stratiform compound can not be satisfactorily achieved. On the other hand, when it is larger than 20 μm, the dispersion stability of the particle in the coating solution is insufficient to cause a problem in that stable coating can not be performed. An average thickness of the particle is ordinarily 0.1 μm or less, preferably 0.05 μm or less, particularly preferably 0.01 μm or less. For example, with respect to the swellable synthetic mica that is the representative compound of the inorganic stratiform compounds, the thickness is approximately from 1 to 50 nm and the plain size is approximately from 1 to 20 μm.

When such an inorganic stratiform compound particle having a large aspect ratio is incorporated into the protective layer, strength of the coated layer increases and penetration of oxygen or moisture can be effectively inhibited and thus, the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

An example of common dispersing method for using the stratiform compound in the protective layer is described below.

Specifically, from 5 to 10 parts by weight of a swellable stratiform compound which is exemplified as a preferable stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having Polman whistle. A dispersion containing from 5 to 10% by weight of the inorganic stratiform compound thus prepared is highly viscous or gelled and exhibits extremely good preservation stability.

In the formation of a coating solution for protective layer using the dispersion, it is preferred that the dispersion is diluted with water, sufficiently stirred and then mixed with a binder solution.

The content of the inorganic stratiform compound in the protective layer is ordinarily from 5/1 to 1/100 in terms of a weight ratio of the inorganic stratiform compound to the amount of a binder used in the protective layer. When a plural kind of the inorganic stratiform compounds is used together, it is preferred that the total amount of the inorganic stratiform compounds is in the range of weight ratio described above.

As other additive for the protective layer, glycerin, dipropylene glycol, propionamide, cyclohexane diol, sorbitol or the like can be added in an amount corresponding to several % by weight of the water-soluble or water-insoluble polymer to impart flexibility. Also, a known additive, for example, a water-soluble (meth)acrylic polymer or a water-soluble plasticizer can be added in order to improve the physical property of the protective layer.

Further, the protective layer according to the invention is formed using a coating solution for protective layer as described below and to the coating solution for protective layer may be added known additives for increasing an adhesion property to the image-forming layer or for improving time-lapse stability of the coating solution.

Specifically, an anionic surfactant, a nonionic surfactant, a cationic surfactant or a fluorine-based surfactant can be added to the coating solution of protective layer in order to improve the coating property. More specifically, an anionic surfactant, for example, sodium alkyl sulfate or sodium alkyl sulfonate; an amphoteric surfactant, for example, alkylamino carboxylic acid salt or alkylamino dicarboxylic acid salt; or a nonionic surfactant, for example, polyoxyethylene alkyl phenyl ether can be added. The amount of the surfactant added is from 0.1 to 100% by weight of the water-soluble or water-insoluble polymer.

Further, for the purpose of improving the adhesion property to the image-forming layer, for example, it is described in JP-A-49-70702 and BP-A-1,303,578 that the sufficient adhesion property can be obtained by mixing from 20 to 60% by weight of an acrylic emulsion, a water-insoluble vinyl pyrrolidone-vinyl acetate copolymer or the like in a hydrophilic polymer mainly comprising polyvinyl alcohol and coating the mixture on the image-forming layer. In the invention, any of such known techniques can be used.

Moreover, the oil-sensitizing agent, for example, the nitrogen-containing low molecular weight compound, ammonium group-containing polymer as described above may be added to the protective layer. By the addition of such a compound, the effect of increasing the ink-receptive property is further achieved. In the case of adding the oil-sensitizing agent in the protective layer, the amount thereof added is preferably in a range of 0.5 to 30% by weight.

Furthermore, other functions can also be provided to the protective layer. For instance, by adding a coloring agent (for example, a water-soluble dye), which is excellent in permeability for infrared ray used for the exposure and capable of efficiently absorbing light at other wavelengths, a safe light adaptability can be improved without causing decrease in the sensitivity. Further, for the purpose of controlling a slipping property of the surface of the lithographic printing plate precursor, a spherical fine inorganic particle as described above with respect to the image-forming layer may be incorporated into the protective layer. The fine inorganic particle preferably includes, for example, silica, alumina, magnesium oxide, titanium oxide, magnesium carbonate, calcium alginate and a mixture thereof. The fine inorganic particle preferably has an average particle size from 5 nm to 10 μm, more preferably from 50 nm to 3 μm. The fine inorganic particle described above is easily available as a commercial product, for example, colloidal silica dispersion.

The content of the fine inorganic particle is preferably 40% by weight or less, more preferably 20% by weight or less, based on the total solid content of the protective layer.

The formation of protective layer is performed by coating a coating solution for protective layer prepared by dispersing or dissolving the components of protective layer in a solvent on the image-forming layer, followed by drying.

The coating solvent may be appropriately selected in view of the binder, and when a water-soluble polymer is used, distilled water or purified water is preferably used as the solvent.

A coating method of the protective layer is not particularly limited, and known methods, for example, methods described in U.S. Pat. No. 3,458,311 and JP-B-55-49729 can be utilized.

Specifically, in the formation of protective layer, for example, a blade coating method, an air knife coating method, a gravure coating method, a roll coating method, a spray coating method, a dip coating method or a bar coating method is used.

The coating amount of the protective layer is preferably in a range from 0.01 to 10 $g/m^2$, more preferably in a range from 0.02 to 3 $g/m^2$, most preferably in a range from 0.02 to 1 $g/m^2$, in terms of the coating amount after drying.

(Undercoat Layer)

In the lithographic printing plate precursor, an undercoat layer (also referred to as an intermediate layer) is provided between the support and the image-forming layer, if desired. The undercoat layer strengthens adhesion between the support and the image-forming layer in the exposed area and makes removal of the image-forming layer from the support in the unexposed area easy, thereby contributing improvement in the developing property without accompanying degradation of the printing durability. Further, it is advantageous that in the case of infrared laser exposure, since the undercoat layer acts as a heat insulating layer, heat generated upon the exposure does not diffuse into the support and is efficiently utilized and as a result, the increase in sensitivity can be achieved. The components used in the undercoat layer according to the invention are described below.

As a compound for undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are preferably exemplified.

As the most preferable compound for undercoat layer, a polymer resin having an adsorbing group, a hydrophilic group and a crosslinkable group is exemplified. The polymer resin is preferably obtained by copolymerization of a monomer having an adsorbing group, a monomer having a hydrophilic group and a monomer having a crosslinkable group.

The polymer resin for undercoat layer preferably has an adsorbing group to the hydrophilic surface of support. Whether adsorptivity to the hydrophilic surface of support is present or not can be judged, for example, by the following method.

A test compound is dissolved in an easily soluble solvent to prepare a coating solution, and the coating solution is coated and dried on a support so as to have the coating amount after drying of 30 $mg/m^2$. After thoroughly washing the support coated with the test compound using the easily soluble solvent, the residual amount of the test compound that has not been removed by the washing is measured to calculate the adsorption amount of the test compound to the support. For measuring the residual amount, the residual amount of the test compound may be directly determined, or may be calculated by determining the amount of the test compound dissolved in the washing solution. The determination for the test compound can be performed, for example, by X-ray fluorescence spectrometry measurement, reflection absorption spectrometry measurement or liquid chromatography measurement. The compound having the adsorptivity to support is a compound that remains by 1 $mg/m^2$ or more even after conducting the washing treatment described above.

The adsorbing group to the hydrophilic surface of support is a functional group capable of forming a chemical bond (for example, an ionic bond, a hydrogen bond, a coordinate bond or a bond with intermolecular force) with a substance (for example, metal or metal oxide) or a functional group (for example, a hydroxy group) present on the hydrophilic surface of support. The adsorbing group is preferably an acid group or a cationic group.

The acid group preferably has an acid dissociation constant (pKa) of 7 or less. Examples of the acid group include a phenolic hydroxy group, a carboxyl group, $-SO_3H$, $-OSO_3H$, $-PO_3H_2$, $-OPO_3H_2$, $-CONHSO_2-$, $-SO_2NHSO_2-$ and $-COCH_2COCH_3$. Among them, $-OPO_3H_2$ and $-PO_3H_2$ are particularly preferred. The acid group may be the form of a metal salt.

The cationic group is preferably an onium group. Examples of the onium group include an ammonium group, a phosphonium group, an arsonium group, a stibonium group, an oxonium group, a sulfonium group, a selenonium group, a stannonium group and iodonium group. Among them, the ammonium group, phosphonium group and sulfonium group are preferred, the ammonium group and phosphonium group are more preferred, and the ammonium group is most preferred.

Particularly preferable examples of the monomer having the adsorbing group which can be used in synthesis of the polymer resin suitable for the compound for undercoat layer include a compound represented by the following formula (U1) or (U2):

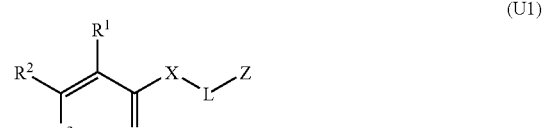

(U1)

(U2)

In formulae (U1) and (U2), $R^1$, $R^2$ and $R^3$ each independently represents a hydrogen atom, halogen atom or an alkyl group having from 1 to 6 carbon atoms.

$R^1$, $R^2$ and $R^3$ each independently represents preferably a hydrogen atom or an alkyl group having from 1 to 6 carbon atoms, more preferably a hydrogen atom or an alkyl group having from 1 to 3 carbon atoms, most preferably a hydrogen atom or a methyl group. It is particularly preferred that $R^2$ and $R^3$ each represents a hydrogen atom.

Z represents a functional group adsorbing to the hydrophilic surface of support. With respect to the adsorbing functional group, the above description on the adsorbing group can be referred to.

In formulae (U1) and (U2), L represents a single bond or a divalent connecting group. It is preferred that L represents a divalent aliphatic group (for example, an alkylene group, a substituted alkylene group, an alkenylene group, a substituted alkenylene group, an alkinylene group or a substituted alkinylene group), a divalent aromatic group (for example, an arylene group or a substituted arylene group), a divalent heterocyclic group or a combination of each of these groups with an oxygen atom (—O—), a sulfur atom (—S—), an imino group (—NH—), a substituted imino group (—NR—, where R represents an aliphatic group, an aromatic group or a heterocyclic group) or a carbonyl group (—CO—).

The divalent aliphatic group may have a cyclic structure or a branched structure. The number of carbon atoms of the divalent aliphatic group is preferably from 1 to 20, more preferably from 1 to 15, most preferably from 1 to 10. It is preferred that the divalent aliphatic group is a saturated aliphatic group rather than an unsaturated aliphatic group. The divalent aliphatic group may have a substituent. Examples of the substituent include a halogen atom, a hydroxy group, an aromatic group and a heterocyclic group.

The number of carbon atoms of the divalent aromatic group is preferably from 6 to 20, more preferably from 6 to 15, most preferably from 6 to 10. The divalent aromatic group may have a substituent. Examples of the substituent include a halogen atom, a hydroxy group, an aliphatic group, an aromatic group and a heterocyclic group.

It is preferred that the divalent heterocyclic group has a 5-membered or 6-membered ring as the hetero ring. Other heterocyclic ring, an aliphatic ring or an aromatic ring may be condensed to the heterocyclic ring. The divalent heterocyclic group may have a substituent. Examples of the substituent include a halogen atom, a hydroxy group, an oxo group (=O), a thioxo group (=S), an imino group (=NH), a substituted imino group (=N—R, where R represents an aliphatic group, an aromatic group or a heterocyclic group), an aliphatic group, an aromatic group and a heterocyclic group.

It is preferred that L represents a divalent connecting group containing a plurality of polyoxyalkylene structures in the invention. It is more preferred that the polyoxyalkylene structure is a polyoxyethylene structure. Specifically, it is preferred that L contains —(OCH$_2$CH$_2$)$_n$— (n is an integer of 2 or more).

In formula (U1), X represents an oxygen atom (—O—) or imino group (—NH—). Preferably, X represents an oxygen atom.

In formula (U2), Y represents a carbon atom or a nitrogen atom. In the case where Y is a nitrogen atom and L is connected to Y to form a quaternary pyridinium group, Z is not mandatory and may represents a hydrogen atom because the quaternary pyridinium group itself exhibits the adsorptivity.

Representative examples of the compound represented by formula (U1) or (U2) are set forth below.

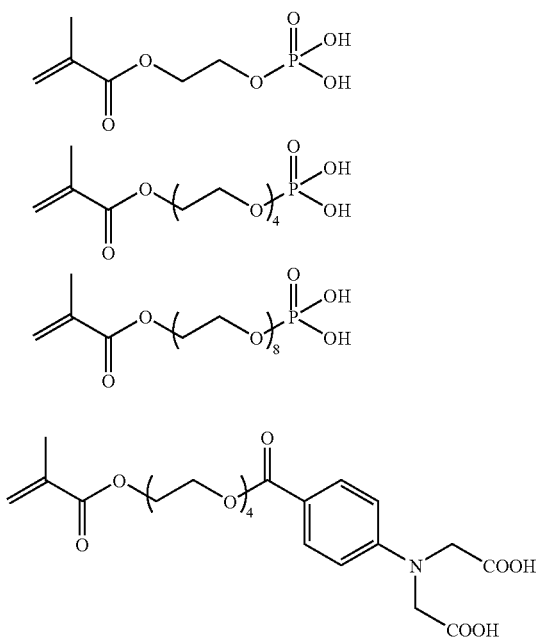

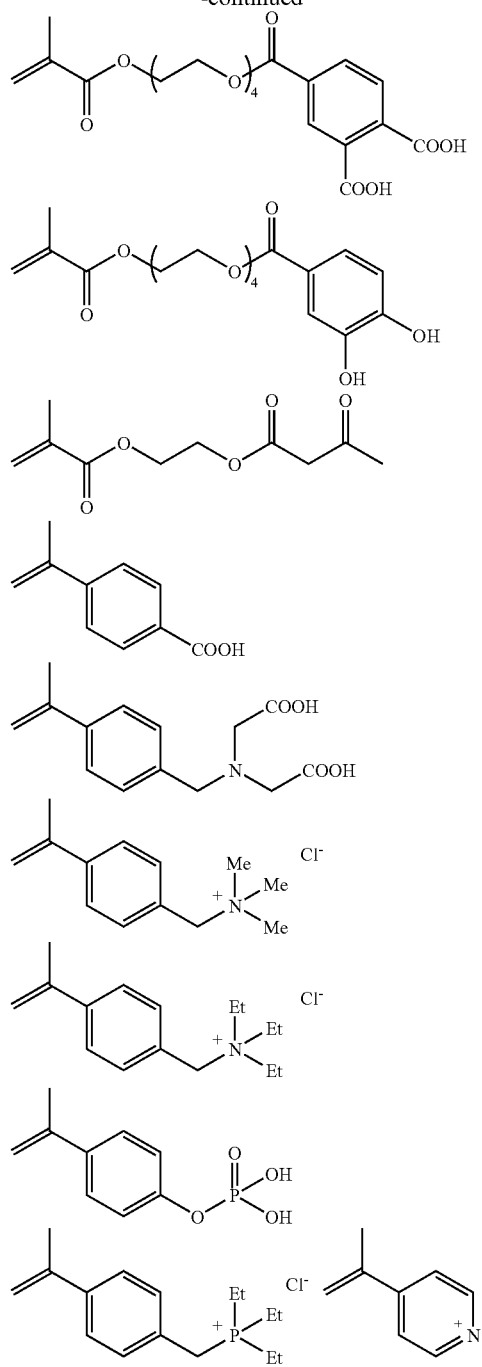

The polymer resin suitable for the compound for undercoat layer preferably has a hydrophilic group. The hydrophilic group preferably includes, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfo group and a phosphoric acid group. Among them, a sulfo group exhibiting a highly hydrophilic property is preferable.

Specific examples of the monomer having a sulfo group include a sodium salt or amine salt of methallyloxybenzenesulfonic acid, allyloxybenzenesulfonic acid, allylsulfonic acid, vinylsulfonic acid, p-styrenesulfonic acid, methallylsulfonic acid, acrylamido-tert-butylsulfonic acid, 2-acrylamido-2-methylpropanesulfonic acid or (3-acryloyloxypropyl)buthylsulfonic acid. Among them, from the standpoint of the hydrophilic property and handling property in the synthesis thereof, sodium salt of 2-acrylamido-2-methylpropanesulfonic acid is preferable.

Such a monomer is preferably used in the synthesis of the polymer resin suitable for the compound for undercoat layer.

The polymer resin for undercoat layer according to the invention preferably has a crosslinkable group. The crosslinkable group acts to improve the adhesion property to the image area. In order to impart the crosslinking property to the polymer resin for undercoat layer, introduction of a crosslinkable functional group, for example, an ethylenically unsaturated bond into the side chain of the polymer or introduction by formation of a salt structure between a polar substituent of the polymer resin and a compound containing a substituent having a counter charge to the polar substituent of the polymer resin and an ethylenically unsaturated bond is used.

Examples of the polymer having the ethylenically unsaturated bond in the side chain thereof include a polymer of an ester or amide of acrylic acid or methacrylic acid, wherein the ester or amide residue (R in —COOR or —CONHR) has the ethylenically unsaturated bond.

Examples of the residue (R described above) having an ethylenically unsaturated bond include —$(CH_2)_n CR^1$=$CR^2R^3$, —$(CH_2O)_n CH_2 CR^1$=$CR^2R^3$, —$(CH_2CH_2O)_n CH_2 CR^1$=$CR^2R^3$, —$(CH_2)_n$NH—CO—O—$CH_2 CR^1$=$CR^2R^3$, —$(CH_2)_n$—O—CO—$CR^1$=$CR^2R^3$ and —$(CH_2CH_2O)_2$—X (wherein $R^1$ to $R^3$ each represents a hydrogen atom, a halogen atom or an alkyl group having from 1 to 20 carbon atoms, an aryl group, alkoxy group or aryloxy group, or $R^1$ and $R^2$ or $R^1$ and $R^3$ may be combined with each other to form a ring. n represents an integer of 1 to 10. X represents a dicyclopentadienyl residue).

Specific examples of the ester residue include —$CH_2CH$=$CH_2$ (described in JP-B-7-21633) —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2NHCOO$—$CH_2CH$=$CH_2$ and —$CH_2CH_2O$—X (wherein X represents a dicyclopentadienyl residue).

Specific examples of the amide residue include —$CH_2CH$=$CH_2$, —$CH_2CH_2O$—Y (wherein Y represents a cyclohexene residue) and —$CH_2CH_2OCO$—$CH$=$CH_2$.

As a monomer having a crosslinkable group for the polymer resin for undercoat layer, an ester or amide of acrylic acid or methacrylic acid having the crosslinkable group described above is preferably used.

The content of the crosslinkable group (content of the radical polymerizable unsaturated double bond determined by iodine titration) in the polymer resin for undercoat layer is preferably from 0.1 to 10.0 mmol, more preferably from 1.0 to 7.0 mmol, most preferably from 2.0 to 5.5 mmol, based on 1 g of the polymer resin. In the range described above, preferable compatibility between the sensitivity and stain resistance and good preservation stability can be achieved.

The weight average molecular weight of the polymer resin for undercoat layer is preferably 5,000 or more, more preferably from 10,000 to 300,000. The number average molecular weight of the polymer resin is preferably 1,000 or more, more preferably from 2,000 to 250,000. The polydispersity (weight average molecular weight/number average molecular weight) thereof is preferably from 1.1 to 10.

The polymer resin for undercoat layer may be any of a random polymer, a block polymer, a graft polymer and the like, and is preferably a random polymer.

The polymer resins for undercoat layer may be used individually or in a mixture of two or more thereof.

The undercoat layer according to the invention may include a secondary or a tertiary amine or a polymerization inhibitor in order to prevent the occurrence of stain due to preservation of unexposed lithographic printing plate precursor. Examples of the secondary or tertiary amine include imidazole, 4-dimethylaminopyridine, 4-dimethylaminobenzaldehyde, tris(2-hydroxy-1-methyl)amine, 1,4-diazobicyclo[2,2,2]octane (DABCO), 1,5,7-trizabicyclo[4,4,0]deca-5-ene, 1,8-diazobicyclo[5,4,0]undeca-7-ene, 1,10-phenanthroline, 1,8-bis(dimethylamino)naphthalene, 4,4'-bis(dimethylamino)biphenyl, diphenylamine, 1,3-diphenylguanidine, 4-phenylpyridine and N,N'-ethylenebis(2,2,5,5-tetramethylpyrrolidine).

The polymerization inhibitor includes known thermal polymerization inhibitors. Preferable examples of the polymerization inhibitor include compounds selected from the group consisting of a phenolic hydroxy group-containing compound, a quinone compound, an N-oxide compound, a pyridine-1-oxyl free radical compound, a pyrrolidine-1-oxyl free radical compound, an N-nitrosophenylhydroxylamine compound, a diazonium compound, a cationic dye, a sulfido group-containing compound, a nitro group-containing compound and a transition metal compound, for example, $FeCl_3$ or $CuCl_2$. Of the compounds, the quinone compound is particularly preferable. Specific examples of the quinone compound include 1,4-benzoquinine, 2,3,5,6-tetrahydroxy-1,4-benzoquinine, 2,5-dihydroxy-1,4-benzoquinine, chloranil, 2,3-dichloro-5,6-dicyano-1,4-benzoquinine, naphthoquinone, 2-fluoro-1,4-naphthoquinone, 2-hydroxyethyl-1,4-naphthoquinone, anthraquinone, 1,2,4-trihydroxyanthraquinone and 2,6-dihydroxyanthraquinone.

The amount of such a compound added to the undercoat layer is preferably from 10 to 90% by weight, more preferably from 20 to 80% by weight, most preferably from 30 to 70% by weight, to the constituting component of the undercoat layer.

As a compound effective for preventing the occurrence of stain at the time of preservation of unexposed lithographic printing plate precursor, a compound having an amino group or a functional group having a polymerization inhibiting function and a group capable of interacting with the surface of aluminum support can also be used. Examples of the group capable of interacting with the surface of aluminum support include a trialkoxysilyl group, an onium group and an acid group selected from a phenolic hydroxy group, a carboxyl group, —$SO_3H$, —$OSO_3H$, —$PO_3H_2$, —$OPO_3H_2$, —$CONHSO_2$—, —$SO_2NHSO_2$— and —$COCH_2CO$— and a metal salt thereof.

Examples of the compound having an amino group and a group capable of interacting with the surface of aluminum support include a salt of 1,4-diazobicyclo[2,2,2]octane and an acid, a compound containing at least one 4-aza-1-azoniabicyclo[2,2,2]octane structure (for example, 1-methyl-4-aza-1-azoniabicyclo[2,2,2]octane p-toluenesulfonate), ethylenediaminetetraacetic acid, hydroxyenediaminetriacetic acid, dihydroxyenediaminediacetic acid, 1,3-propanediaminetetraacetic acid, diethylenetriaminepentaacetic acid, triethylenetetraminehexaacetic acid and hydroxyethyliminodiacetic acid. Examples of the compound having a functional group having a polymerization inhibiting function and a group capable of interacting with the surface of aluminum support include 2-trimethoxysilylpropylthio-1,4-benzoquinone, 2,5-bis(trimethoxysilylpropylthio)-1,4-benzoquinone, 2-carboxyanthraquinone and 2-trimethylammonioanthraquinone chloride.

A coating solution for undercoat layer is obtained by dissolving the polymer resin for undercoat layer and necessary additives in an organic solvent (for example, methanol, ethanol, acetone or methyl ethyl ketone) and/or water. The coating solution for undercoat layer may contain an infrared absorbing agent.

In order to coat the coating solution for undercoat layer on the support, various known methods can be used. Examples of the method include bar coater coating, spin coating, spray coating, curtain coating, dip coating, air knife coating, blade coating and roll coating.

The coating amount (solid content) of the undercoat layer is preferably from 0.1 to 100 mg/m$^2$, more preferably from 1 to 30 mg/m$^2$.

(Support)

The support for use in the lithographic printing plate precursor according to the invention is not particularly restricted as long as it is a dimensionally stable plate-like material. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials conventionally known and used can be appropriately utilized.

The thickness of the support is preferably from 0.1 to 0.6 mm, more preferably from 0.15 to 0.4 mm.

In advance of the use of aluminum plate, a surface treatment, for example, roughening treatment or anodizing treatment is preferably performed. The surface treatment facilitates improvement in the hydrophilic property and ensure for adhesion property between the image-forming layer and the support. Prior to the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, ball graining, brush graining, blast graining or buff graining can be used. Also, a transfer method can be employed wherein using a roll having concavo-convex shape the concavo-convex shape is transferred to the surface of aluminum plate during a rolling step of the aluminum plate.

The electrochemical roughening treatment method includes, for example, a method of conducting by passing alternating current or direct current in an electrolytic solution containing an acid, for example, hydrochloric acid or nitric acid. Also, a method of using a mixed acid described in JP-A-54-63902 can be exemplified.

The aluminum plate subjected to the roughening treatment is subjected, if desired, to an alkali etching treatment using an aqueous solution, for example, of potassium hydroxide or sodium hydroxide and further subjected to a neutralizing treatment, and then subjected to an anodizing treatment for improving the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte used.

Since the conditions for the anodizing treatment are varied depending on the electrolyte used, they cannot be defined commonly. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$, more preferably from 1.5 to 4.0 g/m$^2$. In the range described above, good printing durability and good scratch resistance in the non-image area of lithographic printing plate can be achieved.

The aluminum plate subjected to the surface treatment and having the anodized film as described above is used as it is as the support in the invention. However, in order to more improve the adhesion property to a layer provided thereon, hydrophilicity, stain resistance, heat insulating property or the like, other treatment, for example, an enlarging treatment of micropores or a sealing treatment of micropores of the anodized film described in JP-A-2001-253181 and JP-A-2001-322365, or a surface hydrophilizing treatment by immersing in an aqueous solution containing a hydrophilic compound may be appropriately conducted. Needless to say, the enlarging treatment and sealing treatment are not limited to those described in the above-described patents and any conventionally known method may be employed. For instance, as the sealing treatment, as well as a sealing treatment with steam, a sealing treatment with fluorozirconic acid alone, a sealing treatment with sodium fluoride or a sealing treatment with steam having added thereto lithium chloride may be employed.

The sealing treatment for use in the invention is not particularly limited and conventionally known methods can be employed. Among them, a sealing treatment with an aqueous solution containing an inorganic fluorine compound, a sealing treatment with water vapor and a sealing treatment with hot water are preferred. The sealing treatments will be described in more detail below, respectively.

<1> Sealing Treatment with Aqueous Solution Containing Inorganic Fluorine Compound As the inorganic fluorine compound used in the sealing treatment with an aqueous solution containing an inorganic fluorine compound, a metal fluoride is preferably exemplified.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid and ammonium fluorophosphate. Among them, sodium fluorozirconate, sodium fluorotitanate, fluorozirconic acid and fluorotitanic acid are preferred.

The concentration of the inorganic fluorine compound in the aqueous solution is preferably 0.01% by weight or more, more preferably 0.05% by weight or more, in view of performing satisfactory sealing of micropores of the anodized film, and it is. preferably 1% by weight or less, more preferably 0.5% by weight or less, in view of the stain resistance.

The aqueous solution containing an inorganic fluorine compound preferably further contains a phosphate compound. When the phosphate compound is contained, the hydrophilicity on the anodized film surface is increased and thus, the on-press development property and stain resistance can be improved.

Preferable examples of the phosphate compound include phosphates of metal, for example, an alkali metal or an alkaline earth metal.

Specific examples of the phosphate compound include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, sodium ammonium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Among them, sodium dihydrogen phosphate, disodium hydrogen phosphate, potassium dihydrogen phosphate and dipotassium hydrogen phosphate are preferred.

The combination of inorganic fluorine compound and phosphate compound is not particularly limited, but it is preferred that the aqueous solution contains at least sodium fluorozirconate as the inorganic fluorine compound and at least sodium dihydrogen phosphate as the phosphate compound.

The concentration of the phosphate compound in the aqueous solution is preferably 0.01% by weight or more, more preferably 0.1% by weight or more, in view of improvement in the on-press development property and stain resistance, and it is preferably 20% by weight or less, more preferably 5% by weight or less, in view of solubility.

The ratio of respective compounds in the aqueous solution is not particularly limited, and the weight ratio between the inorganic fluorine compound and the phosphate compound is preferably from 1/200 to 10/1, more preferably from 1/30 to 2/1.

The temperature of the aqueous solution is preferably 20° C. or more, more preferably 40° C. or more, and it is preferably 100° C. or less, more preferably 80° C. or less.

The pH of the aqueous solution is preferably 1 or more, more preferably 2 or more, and it is preferably 11 or less, more preferably 5 or less.

A method of the sealing treatment with the aqueous solution containing an inorganic fluorine compound is not particularly limited and examples thereof include a dipping method and a spray method. One of the treatments may be used alone once or multiple times, or two or more thereof may be used in combination.

In particular, the dipping method is preferred. In the case of performing the treatment using the dipping method, the treating time is preferably one second or more, more preferably 3 seconds or more, and it is preferably 100 seconds or less, more preferably 20 seconds or less.

<2> Sealing Treatment with Water Vapor

Examples of the sealing treatment with water vapor include a method of continuously or discontinuously bringing water vapor under applied pressure or normal pressure into contact with the anodized film.

The temperature of the water vapor is preferably 80° C. or more, more preferably 95° C. or more, and it is preferably 105° C. or less.

The pressure of the water vapor is preferably in a range from (atmospheric pressure −50 mmAg) to (atmospheric pressure +300 mmAg) (from $1.008 \times 10^5$ to $1.043 \times 10^5$ Pa).

The time period for which water vapor is contacted is preferably one second or more, more preferably 3 seconds or more, and it is preferably 100 seconds or less, more preferably 20 seconds or less.

<3> Sealing Treatment with Hot Water

Examples of the sealing treatment with hot water include a method of dipping the aluminum plate having formed thereon the anodized film in hot water.

The hot water may contain an inorganic salt (for example, a phosphate) or an organic salt.

The temperature of the hot water is preferably 80° C. or more, more preferably 95° C. or more, and it is preferably 100° C. or less.

The time period for which the aluminum plate is dipped in the hot water is preferably one second or more, more preferably 3 seconds or more, and it is preferably 100 seconds or less, more preferably 20 seconds or less.

The hydrophilizing treatment includes an alkali metal silicate method described in U.S. Pat. Nos. 2,714,066, 3,181,461, 3,280,734 and 3,902,734. In the method, the support is subjected to immersion treatment or electrolytic treatment in an aqueous solution containing, for example, sodium silicate. In addition, the hydrophilizing treatment includes, for example, a method of treating with potassium fluorozirconate described in JP-B-36-22063 and a method of treating with polyvinyl phosphonic acid described in U.S. Pat. Nos. 3,276,868, 4,153,461 and 4,689,272.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide.

Among them, the hydrophilic layer formed by coating a coating solution containing a colloid of oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion property of the hydrophilic layer to the support. As the antistatic layer, a polymer layer having fine particles of metal oxide or a matting agent dispersed therein described in JP-A-2002-79772 can be used.

The support preferably has a center line average roughness of 0.10 to 1.2 μm. In the range described above, good adhesion property to the image-forming layer, good printing durability and good stain resistance can be achieved.

(Backcoat Layer)

After applying the surface treatment to the support or forming the undercoat layer on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-34174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting materials are inexpensive and easily available.

[Plate Making Method]

The plate making method according to the invention comprises a step of exposing imagewise the lithographic printing plate precursor described above and an on-press development step of removing the unexposed area of the image-forming layer of the lithographic printing plate precursor by supplying at least one of dampening water and ink on a cylinder of a printing machine.

The plate making method is described in more detail below.

<Step of Exposing Imagewise>

For the imagewise exposure in the plate making method according to the invention, known methods can be used without any limitation. Specifically, the lithographic printing plate precursor according to the invention is exposed through a transparent original having a line image, a halftone dot image or the like or exposed imagewise by laser beam scanning based on digital data. Digital modulated ultraviolet ray exposure using a digital mirror device is also used.

In particular, the imagewise exposure by laser beam scanning based on digital data is preferable.

As the exposure light source, those known can be used without any limitation. The wavelength of light source is preferably from 250 to 1,200 nm.

Specific examples of the exposure light source include a carbon arc lamp, a mercury lamp, a xenon lamp, a metal halide lamp, a strobo, an ultraviolet ray, an infrared ray and a laser beam. The laser beam is particularly preferable and includes, for example, a solid laser or a semiconductor laser emitting an infrared ray of 760 to 1,200 nm (for example, a laser diode emitting light of about 830 nm or a NdYAG laser emitting light of about 1,060 nm), an ultraviolet semiconductor laser emitting light of 250 to 420 nm (for example, a InGaN semiconductor laser emitting light of about 405 nm), an argon ion laser (488 nm) or an FD-YAG laser (532 nm) emitting visible light. Among them, the infrared laser or ultraviolet laser is preferable because the operation can be performed under a white lamp or a yellow lamp in view of simplification of the plate making.

With respect to the infrared laser, the output is preferably 100 mW or more, the exposure time per pixel is preferably within 20 microseconds, and the irradiation energy amount is preferably from 10 to 300 mJ/cm². In order to shorten the exposure time, it is preferred to use a multibeam laser device.

The exposure mechanism may be any of an internal drum system, an external drum system and a flat bed system.

The exposed lithographic printing plate precursor is mounted on a plate cylinder of a printing machine. In case of using a printing machine equipped with a laser exposure apparatus, the imagewise exposure is performed after the lithographic printing plate precursor is mounted on a plate cylinder of the printing machine.

<On-Press Development Step>

After the imagewise exposure of the lithographic printing plate precursor by laser, when dampening water and printing ink are supplied to perform printing without undergoing a development processing step, for example, a wet development processing step, in the exposed area of the image-forming layer, the image-forming layer cured by the exposure forms the printing ink receptive area having the oleophilic surface. On the other hand, in the unexposed area, the uncured image-forming layer is removed by dissolution or dispersion with the dampening water and/or printing ink supplied to reveal the hydrophilic surface in the area. As a result, the dampening water adheres on the revealed hydrophilic surface and the printing ink adheres to the exposed area of the image-forming layer, whereby printing is initiated.

While either the dampening water or printing ink may be supplied at first on the surface of lithographic printing plate precursor, it is preferred to supply the printing ink at first in view of preventing the dampening water from contamination with the component of the image-forming layer removed. Dampening water and printing ink for conventional lithographic printing are used as the dampening water and printing ink respectively.

Thus, the lithographic printing plate precursor is subjected to the on-press development on an offset printing machine and used as it is for printing a large number of sheets.

EXAMPLES

The present invention will be described in more detail with reference to the following examples, but the invention should not be construed as being limited thereto.

Examples 1 to 18 and Comparative Examples 1 to 2

1. Preparation of Lithographic Printing Plate Precursors (1) to (5)

(1) Preparation of Support

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm³) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/m².

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried.

Thereafter, in order to ensure the hydrophilicity of the non-image area, the plate was subjected to silicate treatment using a 2.5% by weight aqueous sodium silicate No. 3 solution at 70° C. for 12 seconds. The adhesion amount of Si was 10 mg/m$^2$. Subsequently, the plate was washed with water to obtain Support (1). The center line average roughness (Ra) of the support was measured using a stylus having a diameter of 2 μm and found to be 0.51 μm.

(2) Formation of Undercoat Layer (1)

Coating solution (1) for undercoat layer shown below was coated on Support (1) so as to have a dry coating amount of 28 mg/m$^2$ to form Undercoat layer (1).

| <Coating solution (1) for undercoat layer> | |
|---|---|
| Compound (1) for undercoat layer having structure shown below | 0.18 g |
| Hydroxyethyliminodiacetic acid | 0.10 g |
| Methanol | 55.24 g |
| Water | 6.15 g |

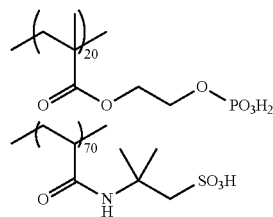

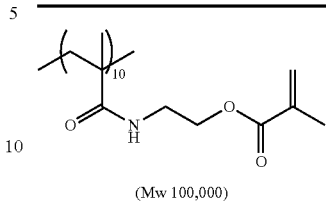

(Mw 100,000)

Compound (1) for undercoat layer (3) Formation of Image-Forming Layers (1) to (5)

Coating solutions (1) to (5) for image-forming layer having the composition shown below were coated on Undercoat layer (1) formed as described above by a bar and dried in an oven at 100° C. for 60 seconds to form Image-forming layers (1) to (5) having a dry coating amount of 1.0 g/m$^2$, respectively.

Coating solutions (1) to (5) for image-forming layer were prepared by mixing Photosensitive solutions (1) to (5) shown below with Microgel solution (1) shown below just before the coating, followed by stirring, respectively.

| <Photosensitive solutions (1) to (5)> | |
|---|---|
| Binder polymer (1) having structure shown below | 0.240 g |
| Infrared absorbing agent (1) having structure shown below | 0.030 g |
| Acid generator (Compound shown in Table 1, which also functions as radical polymerization initiator) | 0.162 g |
| Polymerizable monomer (Tris(acryloyloxyethyl) isocyanurate (NK Ester A-9300, produced by Shin-Nakamura Chemical Co., Ltd.)) | 0.192 g |
| Hydrophilic low molecular weight compound (Tris(2-hydroxyethyl) isocyanurate) | 0.062 g |
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium PF$_6$ salt) | 0.018 g |
| (C) Component shown in Table 1 | 0.200 g |
| (B) Component shown in Table 1 | 0.100 g |
| Fluorine-based surfactant (1) having structure shown below | 0.008 g |
| Methyl ethyl ketone | 1.091 g |
| 1-Methoxy-2-propanol | 8.609 g |

| <Microgel solution (1)> | |
|---|---|
| Microgel (1) shown below | 2.640 g |
| Distilled water | 2.425 g |

The structures of Binder polymer (1), Infrared absorbing agent (1), Phosphonium compound (1), Hydrophilic low molecular weight compound (1) and Fluorine-based surfactant (1) are shown below.

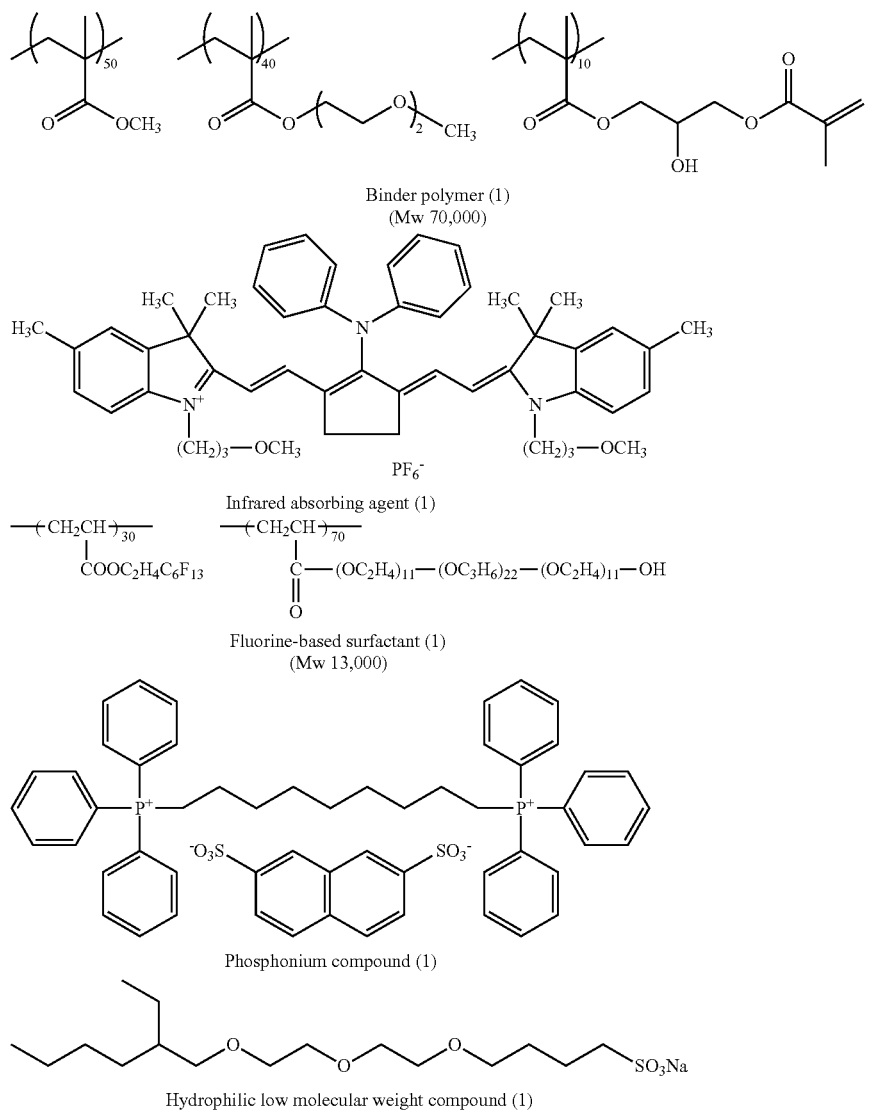

Binder polymer (1) (Mw 70,000)

Infrared absorbing agent (1)

Fluorine-based surfactant (1) (Mw 13,000)

Phosphonium compound (1)

Hydrophilic low molecular weight compound (1)

Microgel (1) described above was prepared in the following manner.

<Preparation of Microgel (1)>

An oil phase component was prepared by dissolving 10 g of adduct of trimethylol propane and xylene diisocyanate (Takenate D-110N, produced by Mitsui Takeda Chemical Co., Ltd.), 3.15 g of pentaerythritol triacrylate (SR444, produced by Nippon Kayaku Co., Ltd.) and 0.1 g of Pionine A-41C (produced by Takemoto Oil and Fat Co., Ltd.) in 17 g of ethyl acetate. As an aqueous phase component, 40 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid concentration of 15% by weight to prepare Microgel (1). The average particle size of the microgel was measured by a light scattering method and found to be 0.2 μm.

(4) Formation of Protective Layer (1)

Coating solution (1) for protective layer having the composition shown below was coated on Image-forming layers (1) to (5) formed as described above by a bar and dried in an oven at 120° C. for 60 seconds to form Protective layer (1) having a dry coating amount of 0.15 g/m², thereby preparing Lithographic printing plate precursors (1) to (5), respectively.

| <Coating solution (1) for protective layer> | |
|---|---|
| Dispersion of inorganic stratiform compound (1) shown below | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |
| Aqueous 1% by weight solution of surfactant (Emalex 710, produced by Ninon Emulsion Co., Ltd. | 8.60 g |
| Ion-exchanged water | 6.0 g |

<Preparation of Dispersion of Inorganic Stratiform Compound (1)>

To 193.6 g of ion-exchanged water was added 6.4 g of synthetic mica (Somasif ME-100, produced by CO-OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

2. Preparation of Lithographic Printing Plate Precursors (6) to (13)

Lithographic printing plate precursors (6) to (13) were prepared in the same manner as in the preparation of Lithographic printing plate precursor (1) except for changing Coating solution (1) for image-forming layer to Coating solutions (6) to (13) for image-forming layer shown below, respectively.

| <Coating solutions (6) to (13) for image-forming layer> | |
|---|---|
| Binder polymer (1) having structure shown above | 0.50 g |
| Infrared absorbing agent (2) having structure shown below | 0.05 g |
| Acid generator (Compound shown in Table 1, which also functions as radical polymerization initiator) | 0.20 g |
| Polymerizable monomer (Tris(acryloyloxyethyl) isocyanurate (NK Ester A-9300, produced by Shin-Nakamura Chemical Co., Ltd.)) | 0.60 g |
| Hydrophilic low molecular weight compound (Sodium n-heptylsulfonate) | 0.05 g |
| (C) Component shown in Table 1 | 0.20 g |
| (B) Component shown in Table 1 | 0.10 g |
| Oil-sensitizing agent (Benzyl dimethyl octyl ammonium $PF_6$ salt) | 0.018 g |
| Oil sensitizing agent (Ammonium group-containing polymer: Compound (23) described hereinbefore (reduced specific viscosity: 44 cSt/g/ml) | 0.035 g |
| Fluorine-based surfactant (1) having structure shown above | 0.10 g |
| Methyl ethyl ketone | 18.0 g |

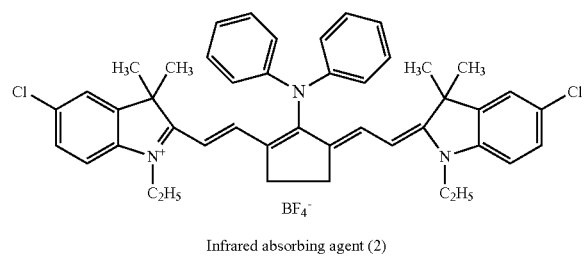

Infrared absorbing agent (2)

3. Preparation of Lithographic Printing Plate Precursors (14) to (18)

Coating solutions (14) to (18) for image-forming layer having the composition shown below were coated on Undercoat layer (1) formed as described above by a bar and dried in an oven at 70° C. for 60 seconds to form Image-forming layers (14) to (18) having a dry coating amount of 0.6 g/m², respectively.

| <Coating solutions (14) to (18) for image-forming layer> | |
|---|---|
| Aqueous dispersion of polymer fine particle (hydrophobilizing precursor) shown below | 33.0 g |
| Infrared absorbing agent (3) having structure shown below | 1.0 g |
| Acid generator: Compound shown in Table 1 | 1.5 g |

| <Coating solutions (14) to (18) for image-forming layer> | |
|---|---|
| Hydrophilic low molecular weight compound (Disodium 1,5-naphthalenedisulfonate) | 0.1 g |
| (C) Component shown in Table 1 | 0.2 g |
| (B) Component shown in Table 1 | 0.1 g |
| Methanol | 16.0 g |

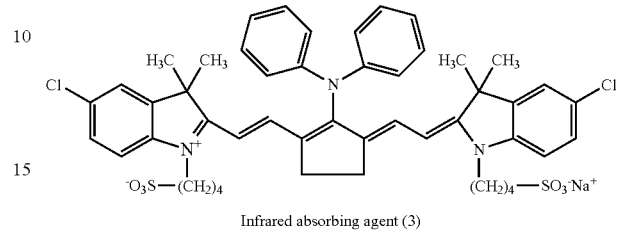

Infrared absorbing agent (3)

(Preparation of Aqueous Dispersion of Polymer Fine Particle (Hydrophobilizing Precursor))

A stirrer, a thermometer, a dropping funnel, a nitrogen inlet tube and a reflux condenser were attached to a 1,000 ml four-neck flask and while carrying out deoxygenation by introduction of nitrogen gas, 350 ml of distilled water was charged therein and heated until the internal temperature reached 80° C. To the flask was added 1.5 g of sodium dodecylsufate as a dispersing agent, then was added 0.45 g of ammonium persulfate as an initiator, and thereafter was dropwise added a mixture of 45.0 g of methyl methacrylate and 45.0 g of styrene through the dropping funnel over a period of about one hour. After the completion of the dropwise addition, the mixture was continued to react as it was for 5 hours, followed by removing the unreacted monomers by steam distillation. The mixture was cooled, adjusted the pH to 6 with aqueous ammonia and finally added pure water thereto so as to have the nonvolatile content of 15% by weight to obtain an aqueous dispersion of polymer fine particle (hydrophobilizing precursor). The particle size distribution of the polymer fine particle had the maximum value at the particle size of 60 nm.

The particle size distribution was determined by taking an electron microphotograph of the polymer fine particle, measuring particle sizes of 5,000 fine particles in total on the photograph, and dividing a range from the largest value of the particle size measured to 0 on a logarithmic scale into 50 parts to obtain occurrence frequency of each particle size by plotting. With respect to the aspherical particle, a particle size of a spherical particle having a particle area equivalent to the particle area of the aspherical particle on the photograph was defined as the particle size.

Coating solution (2) for protective layer having the composition shown below was coated on the image-forming layers (14) to (18) formed as described above by a bar and dried in an oven at 60° C. for 120 seconds to form a protective layer having a dry coating amount of 0.3 g/m², thereby preparing Lithographic printing plate precursors (14) to (18), respectively.

| <Coating solution (2) for protective layer> | |
|---|---|
| Carboxymethyl cellulose (Mw: 20,000) | 5.0 g |
| Water | 50.0 g |

4. Preparation of Lithographic Printing Plate Precursor (C-1) for Comparative Example 1

Lithographic printing plate precursor (C-1) for Comparative Example 1 was prepared in the same manner as in the preparation of Lithographic printing plate precursor (1) except for using Photosensitive solution (C-1) containing 0.200 g of Comparative Compound (C-1) in place of Photosensitive solution (1) containing 0.200 g of (C) Component and 0.100 g of (B) Component.

5. Preparation of Lithographic Printing Plate Precursor (C-2) for Comparative Example 2

Lithographic printing plate precursor (C-2) for Comparative Example 2 was prepared in the same manner as in the preparation of Lithographic printing plate precursor (14) except for using Coating solution (C-2) for image-forming layer containing 0.200 g of Comparative Compound (C-1) in place of Coating solution (14) for image-forming layer containing 0.200 g of (C) Component and 0.100 g of (B) Component.

6. Plate Making and Evaluation of Lithographic Printing Plate Precursor (Exposure)
Each of the lithographic printing plate precursors thus-obtained was exposed by Luxel Platesetter T-6000III equipped with an infrared semiconductor laser, produced by Fuji Film Co., Ltd. under the conditions of a rotational number of external drum of 1,000 rpm, a laser output of 70% and a resolution of 2,400 dpi. The exposed image contained a solid image and a 50% halftone dot chart of a 20 μm-dot FM screen.

(Evaluation of Plate Inspection Property)
The unexposed area and exposed area (solid image) were subjected to color measurement using a colorimeter (Chroma Meter CR-221, produced by Minolta Camera Co., Ltd.) and color density difference (relative value) between the unexposed area and exposed area was obtained according the formula shown below. The larger the value, the better the plate inspection property. The results obtained are shown in Table 1.

Color density difference (relative value) between
unexposed area and exposed area=(Color density
difference of Example)/(Color density difference
of Comparative Example 1 or 2)

(Evaluation of Time-Lapse Stability of Plate Inspection Property)
Each of Lithographic printing plate precursors (1) to (18) and Lithographic printing plate precursor (C-1) for Comparative Example 1 were preserved in a constant temperature reservoir of 60° C. for 3 days, then subjected to the exposure and color measurement using the colorimeter as described above and the time-lapse stability of plate inspection property was obtained according the formula (wherein a symbol ∥ represents an absolute value) shown below. The smaller the value, the better the time-lapse stability of plate inspection property. The results obtained are shown in Table 1.

Time-lapse stability of plate inspection property=|
(Color density with preservation at 60° C. for 3
days)–(Color density without preservation)|/
(Color density without preservation)

(Evaluation of On-Press Development Property)
The exposed lithographic printing plate precursor was mounted without conducting development processing on a plate cylinder of a printing machine (Lithrone 26, produced by Komori Corp.). Using dampening water (Ecolity-2 (produced by Fuji Film Co., Ltd.)/tap water=2/98 (volume ratio)) and Values-G (N) Black Ink (produced by Dainippon Ink & Chemicals, Inc.), the dampening water and ink were supplied according to the standard automatic printing start method of Lithrone 26 to conduct printing on 100 sheets of Tokubishi art paper (76.5 kg) at a printing speed of 10,000 sheets per hour.

A number of the printing papers required until the on-press development of the unexposed area of the image-forming layer on the printing machine was completed to reach a state where the ink was not transferred to the printing paper in the non-image area was measured to evaluate the on-press development property. The smaller the number of the printing papers, the better the on-press development property. The results obtained are shown in Table 1.

(Evaluation of Ink-Receptive Property)
As the increase in a number of printing papers, ink-receptive property of the image-forming layer was gradually lowered to cause decrease in the ink density on the printing paper. Using the $100^{th}$ paper and $3,000^{th}$ paper of the printing, a halftone dot density of a 50% halftone dot of FM screen was measured using a Gretag densitometer and the ink-receptive property was determined according to the formula shown below. The lager the value, the better the ink-receptive property. The results obtained are shown in Table 1.

Ink-receptive property=(Halftone dot density of
$3,000^{th}$ paper)/(Halftone dot density of $100^{th}$
paper)

(Evaluation of Printing Durability)
After performing the evaluation for the on-press development property described above, the printing was continued. As the increase in a number of printing papers, the image-forming layer was gradually abraded to cause decrease in the ink density on the printing paper. A number of printing papers wherein a value obtained by measuring a halftone dot area rate of the 50% halftone dot of FM screen on the printing paper using a Gretag densitometer decreased by 5% from the value measured on the $100^{th}$ paper of the printing was determined to evaluate the printing durability. The lager the value, the better the printing durability. The results obtained are shown in Table 1.

TABLE 1

| | | | | | Time-lapse Stability of | On-press | | |
| | | | | Plate | Plate | Development | | Printing |
| | (C) | (B) | Acid | Inspection | Inspection | Property | Ink-receptive | Durability |
| | Component | Component | Generator | Property | Property | (sheets) | Property | (sheets) |
|---|---|---|---|---|---|---|---|---|
| Example 1 | (I-1) | (II-1) | (1) | 2.5 | 0.03 | 10 | 0.94 | 5.0 |
| Example 2 | (I-2) | (II-2) | (1) | 2.0 | 0.04 | 20 | 0.91 | 4.5 |

TABLE 1-continued

Examples 1 to 18 and Comparative Examples 1 to 2

| | (C) Component | (B) Component | Acid Generator | Plate Inspection Property | Time-lapse Stability of Plate Inspection Property | On-press Development Property (sheets) | Ink-receptive Property | Printing Durability (sheets) |
|---|---|---|---|---|---|---|---|---|
| Example 3 | (I-3) | (II-3) | (3) | 2.3 | 0.06 | 15 | 0.85 | 5.0 |
| Example 4 | (I-4) | (II-4) | (2) | 2.2 | 0.05 | 25 | 0.81 | 4.0 |
| Example 5 | (I-5) | (II-5) | (4) | 2.4 | 0.06 | 15 | 0.78 | 4.5 |
| Comparative Example 1 | Comparative Compound (C-1) | | (1) | 1 | 0.77 | 40 | 0.38 | 1.5 |
| Example 6 | (I-1) | (II-1) | (1) | 2.4 | 0.04 | 20 | 0.90 | 5.0 |
| Example 7 | (I-2) | (II-2) | (2) | 2.2 | 0.06 | 25 | 0.88 | 5.0 |
| Example 8 | (I-3) | (II-3) | (4) | 2.3 | 0.05 | 18 | 0.81 | 4.5 |
| Example 9 | (I-4) | (II-4) | (3) | 2.3 | 0.06 | 19 | 0.85 | 5.0 |
| Example 10 | (I-5) | (II-5) | (1) | 2.5 | 0.05 | 25 | 0.77 | 5.0 |
| Example 11 | (I-1) | (B-1) | (2) | 1.8 | 0.06 | 30 | 0.72 | 3.5 |
| Example 12 | (I-2) | (B-2) | (3) | 2.0 | 0.07 | 30 | 0.71 | 4.0 |
| Example 13 | (I-3) | (B-3) | (1) | 2.1 | 0.07 | 25 | 0.70 | 4.0 |
| Example 14 | (I-1) | (II-1) | (1) | 2.3 | 0.06 | 10 | 0.85 | 2.0 |
| Example 15 | (I-2) | (II-2) | (4) | 2.2 | 0.06 | 26 | 0.93 | 1.5 |
| Example 16 | (I-3) | (II-3) | (3) | 2.4 | 0.05 | 15 | 0.83 | 2.0 |
| Example 17 | (I-4) | (II-4) | (2) | 2.2 | 0.06 | 20 | 0.89 | 2.0 |
| Example 18 | (I-5) | (II-5) | (3) | 2.3 | 0.06 | 20 | 0.93 | 1.5 |
| Comparative Example 2 | Comparative Compound (C-1) | | (1) | 1 | 0.78 | 40 | 0.42 | 0.5 |

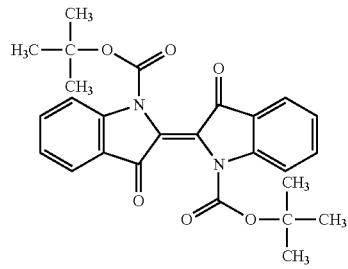

Comparative Compound (C-1)

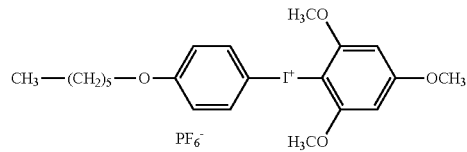

Acid Generator (1)

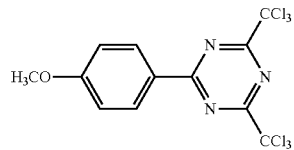

Acid Generator (2)

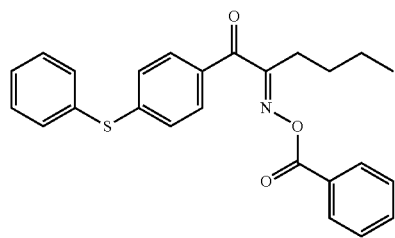

Acid Generator (3)

TABLE 1-continued

Examples 1 to 18 and Comparative Examples 1 to 2

| (C) Component | (B) Component | Acid Generator | Plate Inspection Property | Time-lapse Stability of Plate Inspection Property | On-press Development Property (sheets) | Ink-receptive Property | Printing Durability (sheets) |
|---|---|---|---|---|---|---|---|

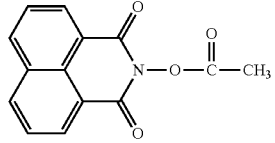

Acid Generator (4)

Examples 19 to 21

1. Preparation of Lithographic Printing Plate Precursor (19)

Lithographic printing plate precursor (19) was prepared in the same manner as in the preparation of Lithographic printing plate precursor (6) except for changing Photosensitive solution (6) and Microgel solution (1) to Photosensitive solution (19) shown below and Microgel solution (2) shown below, respectively.

| <Photosensitive solution (19)> | |
|---|---|
| Binder polymer (1) having structure shown above | 0.50 g |
| Infrared absorbing agent (2) having structure shown below | 0.05 g |
| Acid Generator (1) having structure shown above (which also functions as radical polymerization initiator) | 0.20 g |
| Polymerizable monomer (Tris(acryloyloxyethyl) isocyanurate (NK Ester A-9300, produced by Shin-Nakamura Chemical Co., Ltd.)) | 0.60 g |
| Hydrophilic low molecular weight compound (Sodium n-heptylsulfonate) | 0.05 g |
| (B) Component shown in Table 2 | 0.10 g |
| Oil-sensitizing agent (Benzyl dimethyl octyl ammonium $PF_6$ salt) | 0.018 g |
| Oil-sensitizing agent (Ammonium group-containing polymer: Compound (23) described hereinbefore (reduced specific viscosity: 44 cSt/g/ml) | 0.035 g |
| Fluorine-based surfactant (1) having structure shown above | 0.10 g |
| Methyl ethyl ketone | 18.0 g |

| <Microgel solution (2)> | |
|---|---|
| Microgel (2) shown below | 2.640 g |
| Distilled water | 2.425 g |

Microgel (2) described above was prepared in the following manner.
<Preparation of Microgel (2)>
An oil phase component was prepared by dissolving 10 g of adduct of trimethylol propane and xylene diisocyanate (Takenate D-110N, produced by Mitsui Takeda Chemical Co., Ltd.), 3.15 g of pentaerythritol triacrylate (SR444, produced by Nippon Kayaku Co., Ltd.), 4.95 g of (C) Component shown in Table 2 and 0.1 g of Pionine A-41C (produced by Takemoto Oil and Fat Co., Ltd.) in 17 g of ethyl acetate. As an aqueous phase component, 40 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid concentration of 15% by weight to prepare Microgel (2). The average particle size of the microgel was measured by a light scattering method and found to be 0.2 μm.

2. Preparation of Lithographic Printing Plate Precursor (20)

Lithographic printing plate precursor (20) was prepared in the same manner as in the preparation of Lithographic printing plate precursor (6) except for changing Photosensitive solution (6) and Microgel solution (1) to Photosensitive solution (20) shown below and Microgel solution (3) shown below, respectively.

| <Photosensitive solution (20)> | |
|---|---|
| Binder polymer (1) having structure shown above | 0.50 g |
| Infrared absorbing agent (2) having structure shown below | 0.05 g |
| Acid Generator (1) having structure shown above (which also functions as radical polymerization initiator) | 0.20 g |
| Polymerizable monomer (Tris(acryloyloxyethyl) isocyanurate (NK Ester A-9300, produced by Shin-Nakamura Chemical Co., Ltd.)) | 0.60 g |
| Hydrophilic low molecular weight compound (Sodium n-heptylsulfonate) | 0.05 g |
| (C) Component shown in Table 2 | 0.2 g |
| Oil-sensitizing agent (Benzyl dimethyl octyl ammonium $PF_6$ salt) | 0.018 g |
| Oil-sensitizing agent (Ammonium group-containing polymer: Compound (23) described hereinbefore (reduced specific viscosity: 44 cSt/g/ml) | 0.035 g |
| Fluorine-based surfactant (1) having structure shown above | 0.10 g |
| Methyl ethyl ketone | 18.0 g |

| <Microgel solution (3)> | |
|---|---|
| Microgel (3) shown below | 2.640 g |
| Distilled water | 2.425 g |

Microgel (3) described above was prepared in the following manner.

<Preparation of Microgel (3)>

An oil phase component was prepared by dissolving 10 g of adduct of trimethylol propane and xylene diisocyanate (Takenate D-110N, produced by Mitsui Takeda Chemical Co., Ltd.), 3.15 g of pentaerythritol triacrylate (SR444, produced by Nippon Kayaku Co., Ltd.), 2.48 g of (B) Component shown in Table 2 and 0.1 g of Pionine A-41C (produced by Takemoto Oil and Fat Co., Ltd.) in 17 g of ethyl acetate. As an aqueous phase component, 40 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid concentration of 15% by weight to prepare Microgel (3). The average particle size of the microgel was measured by a light scattering method and found to be 0.2 μm.

3. Preparation of Lithographic Printing Plate Precursor (21)

Lithographic printing plate precursor (21) was prepared in the same manner as in the preparation of Lithographic printing plate precursor (6) except for changing Photosensitive solution (6) to Photosensitive solution (21) shown below.

| <Photosensitive solution (21)> | |
|---|---|
| Binder polymer (1) having structure shown above | 0.50 g |
| Infrared absorbing agent (2) having structure shown below | 0.05 g |
| Acid Generator (1) having structure shown above (which also functions as radical polymerization initiator) | 0.20 g |
| Polymerizable monomer (Tris(acryloyloxyethyl) isocyanurate (NK Ester A-9300, produced by Shin-Nakamura Chemical Co., Ltd.)) | 0.60 g |
| Hydrophilic low molecular weight compound (Sodium n-heptylsulfonate) | 0.05 g |
| (C) Component shown in Table 2 | 0.20 g |
| (B) Component shown in Table 2 | 0.10 g |
| Base component (Tri-n-decylamine) | 0.007 g |
| Oil-sensitizing agent (Benzyl dimethyl octyl ammonium $PF_6$ salt) | 0.018 g |
| Oil-sensitizing agent (Ammonium group-containing polymer: Compound (23) described hereinbefore (reduced specific viscosity: 44 cSt/g/ml) | 0.035 g |
| Fluorine-based surfactant (1) having structure shown above | 0.10 g |
| Methyl ethyl ketone | 18.0 g |

4. Plate Making and Evaluation of Lithographic Printing Plate Precursor

Each of the lithographic printing plate precursors thus-obtained was subjected to the plate making and evaluation of plate inspection property, time-lapse stability of plate inspection property, on-press development property, ink-receptive property and printing durability in the same manner as in Example 1. The results obtained are shown in Table 2.

TABLE 2

| | | | | Examples 19 to 21 | | | |
|---|---|---|---|---|---|---|---|
| | (C) Component | (B) Component | Plate Inspection Property | Time-lapse Stability of Plate Inspection Property | On-press Development Property (sheets) | Ink-receptive Property | Printing Durability (sheets) |
| Example 19 | (I-1)*1 | (II-1) | 2.6 | 0.02 | 17 | 0.92 | 5.5 |
| Example 20 | (I-1) | (II-1)*2 | 2.6 | 0.02 | 15 | 0.94 | 5.5 |
| Example 21 | (I-1) | (II-1) | 2.4 | 0.02 | 20 | 0.91 | 5.0 |
| Example 6 for reference | (I-1) | (II-1) | 2.4 | 0.04 | 20 | 0.90 | 5.0 |

*1incorporated into the microgel
*2incorporated into the microgel

From the comparison of the results of Examples 18 to 20 with those of Example 6, it can be seen that the incorporation of (B) Component or (C) Component into the microgel or the addition of base component to the image-forming layer more improves the plate inspection property and time-lapse stability of plate inspection property.

Examples 22 to 26 and Comparative Example 3

1. Preparation of Lithographic Printing Plate Precursors (22) to (26)

Lithographic printing plate precursors (22) to (26) were prepared in the same manner as in the preparation of Lithographic printing plate precursor (1) except for changing Photosensitive solution (1) to Photosensitive solutions (22) to (26) shown below, respectively.

| <Photosensitive solutions (22) to (26)> | |
|---|---|
| Binder polymer (1) having structure shown above | 0.24 g |
| Acid Generator (2) having structure shown above (also functions as radical polymerization initiator) | 0.162 g |
| Sensitizing Dye (1) having absorption peak in wavelength of 300 to 850 nm and structure shown below | 0.162 g |
| Polymerization monomer (Tris(acryloyloxyethyl) isocyanurate (NK Ester A-9300, produced by Shin Nakamura Chemical Co., Ltd.)) | 0.192 g |
| Hydrophilic low molecular weight compound (Tris(2-hydroxyethyl) isocyanurate) | 0.062 g |
| Hydrophilic low molecular weight compound (1) having structure shown above | 0.050 g |
| Oil-sensitizing agent (Phosphonium compound (1) having structure shown above) | 0.055 g |
| Oil-sensitizing agent (Benzyl dimethyl octyl ammonium $PF_6$ salt) | 0.018 g |
| (C) Component shown in Table 3 | 0.200 g |
| (B) Component shown in Table 3 | 0.100 g |
| Methyl ethyl ketone | 1.091 g |

-continued

<Photosensitive solutions (22) to (26)>

| | |
|---|---|
| 1-Methoxy-2-propanol | 8.609 g |
| Thermal polymerization inhibitor (N-Nitrosophenylhydroxylamine aluminum salt) | 0.070 g |

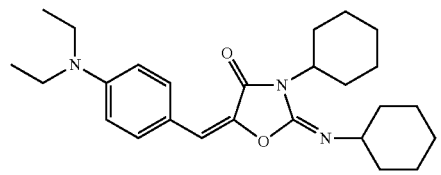

Sensitizing Dye (1)

2. Preparation of Lithographic Printing Plate Precursor (C-3) for Comparative Example 3

Lithographic printing plate precursor (C-3) for Comparative Example 3 was prepared in the same manner as in the preparation of Lithographic printing plate precursor (22) except for using Photosensitive solution (C-3) containing 0.200 g of Comparative Compound (C-1) in place of Photosensitive solution (22) containing 0.200 g of (C) Component and 0.100 g of (B) Component.

3. Plate Making and Evaluation of Lithographic Printing Plate Precursor (Exposure)

Each of Lithographic printing plate precursors (22) to (26) and Lithographic printing plate precursor (C-3) for Comparative Example 3 was subjected to image exposure by Violet semiconductor laser plate setter Vx9600 (equipped with InGaN semiconductor laser; emission: 405 nm±10 nm/output: 30 mW) produced by FUJIFILM Electronic Imaging, Ltd. As for the image, halftone dots of 50% were drawn using an FM screen (TAFFETA 20, produced by Fuji Film Co., Ltd.) in a plate surface exposure amount of 0.05 mJ/cm² and at resolution of 2,438 dpi as well as a solid image. Within 30 seconds after the imagewise exposure, the exposed lithographic printing plate precursor was put in an oven, heated the entire surface of the lithographic printing plate precursor by blowing hot air to maintain at 110° C. for 15 seconds.

(Evaluation of Plate Inspection Property)

The unexposed area and exposed area (solid image) were subjected to color measurement using a colorimeter (Chroma Meter CR-221, produced by Minolta Camera Co., Ltd.) and color density difference (relative value) between the unexposed area and exposed area was obtained according the formula shown below. The larger the value, the better the plate inspection property. The results obtained are shown in Table 3.

Color density difference (relative value) between unexposed area and exposed area=(Color density difference of Example)/(Color density difference of Comparative Example 3)

(Evaluation of Time-Lapse Stability of Plate Inspection Property, On-Press Development Property, Ink-Receptive Property and Printing Durability)

Each of Lithographic printing plate precursors (22) to (26) and Lithographic printing plate precursor (C-3) for Comparative Example 3 thus-exposed was subjected to the evaluation of time-lapse stability of plate inspection property, on-press development property, ink-receptive property and printing durability in the same manner as in Example 1. The results obtained are shown in Table 3.

TABLE 3

Examples 22 to 26 and Comparative Example 3

| | (C) Component | (B) Component | Plate Inspection Property | Time-lapse Stability of Plate Inspection Property | On-press Development Property (sheets) | Ink-receptive Property | Printing Durability (sheets) |
|---|---|---|---|---|---|---|---|
| Example 22 | (I-1) | (II-1) | 2.3 | 0.04 | 15 | 0.92 | 6.0 |
| Example 23 | (I-2) | (II-2) | 2.0 | 0.05 | 25 | 0.88 | 5.5 |
| Example 24 | (I-3) | (II-3) | 2.1 | 0.06 | 25 | 0.83 | 5.5 |
| Example 25 | (I-4) | (II-4) | 2.2 | 0.06 | 25 | 0.80 | 5.5 |
| Example 26 | (I-5) | (II-5) | 2.2 | 0.06 | 15 | 0.75 | 5.5 |
| Comparative Example 3 | Comparative Compound (C-1) | | 1 | 0.80 | 45 | 0.42 | 2.0 |

As is apparent from the results shown in Table 3, according to the invention any of the plate inspection property, time-lapse stability of plate inspection property, on-press development property, ink-receptive property and printing durability are also excellent in the UV exposure system.

What is claimed is:

1. A plate making method of a lithographic printing plate precursor comprising:
exposing imagewise a lithographic printing plate precursor comprising a support and an image-forming layer and containing (A) a compound generating an acid with light or heat, (B) an aromatic hydrocarbon compound or heterocyclic compound substituted with a functional group containing a nitrogen atom and (C) a compound represented by the following formula (I):

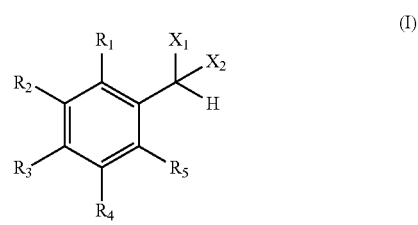

(I)

wherein $R_1$ to $R_5$ each independently represents a hydrogen atom, a halogen atom, an alkyl group, an alkenyl group, an aryl group, a heteroaryl group, a hydroxy group, an alkoxy group, an aryloxy group, —OCORa, —OCONRaRb, —NRaRb, —N(Ra)CORb, —N(Ra)COORb, —COORa, —CONRaRb, —SRa or a cyano group, each of these groups may contain an atom or atomic group selected from O, S, N(Ra), CO and combinations thereof between an appropriate carbon chain thereof, or at least two of $R_1$ to $R_5$ may be combined with each other to form a condensed ring, $X_1$ and $X_2$ each independently represents —ORx, —NRxRy or —SRx, plural Rx and Ry may be combined with each other to form a cyclic structure, Ra and Rb each independently represents a hydrogen atom, an alkyl group, an aryl group or a heteroaryl group, and Rx and Ry each independently represents an alkyl group, an aryl group or a heteroaryl group, and removing an unexposed area of the image-forming layer of the lithographic printing plate precursor by supplying at least one of dampening water and ink on a cylinder of a printing machine.

2. The plate making method of a lithographic printing plate precursor as claimed in claim 1, wherein the aromatic hydrocarbon compound or heterocyclic compound substituted with a functional group containing a nitrogen atom in its molecule is a compound represented by the following formula (II):

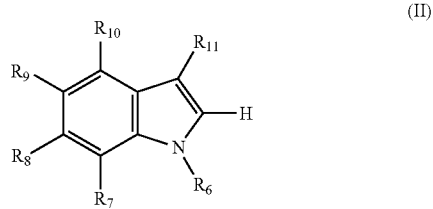

(II)

wherein $R_6$ to $R_{11}$ each independently represents a hydrogen atom, a halogen atom, an alkyl group, an alkenyl group, an aryl group, a heteroaryl group, a hydroxy group, an alkoxy group, an aryloxy group, —OCORa, —OCONRaRb, —NRaRb, —N(Ra)CORb, —N(Ra)COORb, —COORa, —CONRaRb, —SRa or a cyano group, each of these groups may contain an atom or atomic group selected from O, S, N(Ra), CO and combinations thereof between an appropriate carbon chain thereof, at least two of $R_6$ to $R_{11}$ may be combined with each other to form a condensed ring, plural Rx and Ry may be combined with each other to form a cyclic structure, Ra and Rb each independently represents a hydrogen atom, an alkyl group, an aryl group or a heteroaryl group, and Rx and Ry each independently represents an alkyl group, an aryl group or a heteroaryl group.

3. The plate making method of a lithographic printing plate precursor as claimed in claim 1, wherein the compound generating an acid with light or heat is an onium compound, an oxime ester compound, a triazine compound or an imido ester compound.

4. The plate making method of a lithographic printing plate precursor as claimed in claim 1, wherein the image-forming layer comprises an infrared absorbing agent.

5. The plate making method of a lithographic printing plate precursor as claimed in claim 1, wherein the image-forming layer comprises a polymerizable monomer and a binder polymer.

6. The plate making method of a lithographic printing plate precursor as claimed in claim 1, wherein the image-forming layer comprises a microgel containing one of the aromatic hydrocarbon compound or heterocyclic compound substituted with a functional group containing a nitrogen atom and the compound represented by formula (I).

7. The plate making method of a lithographic printing plate precursor as claimed in claim 1, wherein the image-forming layer comprises a base component.

\* \* \* \* \*